(12) United States Patent
Lee et al.

(10) Patent No.: US 12,144,252 B2
(45) Date of Patent: Nov. 12, 2024

(54) ORGANIC ELECTROLUMINESCENCE DEVICE

(71) Applicant: Samsung Display Co., Ltd., Yongin-si (KR)

(72) Inventors: Jiyoung Lee, Hwaseong-si (KR); Hyosup Shin, Hwaseong-si (KR); Minje Kim, Suwon-si (KR); Hyojeong Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 680 days.

(21) Appl. No.: 17/365,763

(22) Filed: Jul. 1, 2021

(65) Prior Publication Data

US 2022/0131086 A1 Apr. 28, 2022

(30) Foreign Application Priority Data

Oct. 23, 2020 (KR) .................. 10-2020-0138274

(51) Int. Cl.
*H01L 51/50* (2006.01)
*C09K 11/06* (2006.01)
(Continued)

(52) U.S. Cl.
CPC .......... *H10K 85/6572* (2023.02); *C09K 11/06* (2013.01); *H10K 85/40* (2023.02);
(Continued)

(58) Field of Classification Search
None
See application file for complete search history.

(56) References Cited

U.S. PATENT DOCUMENTS 8,981,355 B2 3/2015 Seo
8,993,129 B2 3/2015 Endo et al.
(Continued)

FOREIGN PATENT DOCUMENTS

KR 10-2016-0064961 A 6/2016
KR 10-2016-0101519 A 8/2016
(Continued)

OTHER PUBLICATIONS

Hiroki Uoyama, et al., "Highly efficient organic light-emitting diodes from delayed fluorescence", Letter Research, Nature, Dec. 13, 2012, 7 pages, vol. 492, Macmillan Publishers Limited.

*Primary Examiner* — Gregory D Clark
(74) *Attorney, Agent, or Firm* — Lewis Roca Rothgerber Christie LLP

(57) ABSTRACT

An organic electroluminescence device includes a first electrode, a second electrode facing the first electrode, and an emission layer between the first electrode and the second electrode, wherein the emission layer includes a first host, a first dopant, and a second dopant different from the first dopant, the first dopant and the second dopant are compounds each independently exhibiting thermally activated delayed fluorescence, the first dopant has a delayed fluorescence lifetime ($\tau$) value of about 2.6 μs to about 5.0 μs, and the first host, the first dopant, and the second dopant satisfy Equation 1 defined in the detailed description, thereby exhibiting increased efficiency and lifetime characteristics.

20 Claims, 7 Drawing Sheets

(51) Int. Cl.
*H10K 85/40* (2023.01)
*H10K 85/60* (2023.01)
*H10K 50/11* (2023.01)
*H10K 50/12* (2023.01)
*H10K 101/00* (2023.01)
*H10K 101/10* (2023.01)

(52) U.S. Cl.
CPC ....... *H10K 85/631* (2023.02); *H10K 85/6574* (2023.02); *C09K 2211/1007* (2013.01); *C09K 2211/1018* (2013.01); *H10K 50/11* (2023.02); *H10K 50/121* (2023.02); *H10K 2101/10* (2023.02); *H10K 2101/90* (2023.02)

(56) References Cited

U.S. PATENT DOCUMENTS

| | | |
|---|---|---|
| 9,954,186 B2 | 4/2018 | Yang et al. |
| 10,418,573 B2 | 9/2019 | Kim et al. |
| 10,840,470 B2 | 11/2020 | Takahashi et al. |
| 2015/0349286 A1* | 12/2015 | Forrest ............... H10K 50/11 252/301.16 |
| 2017/0250363 A1 | 8/2017 | Baumann et al. |
| 2018/0123049 A1 | 5/2018 | Lee et al. |
| 2018/0170914 A1 | 6/2018 | Miyata et al. |
| 2018/0323394 A1 | 11/2018 | Haldi et al. |
| 2019/0058124 A1 | 2/2019 | Hatakeyama et al. |
| 2019/0296254 A1 | 9/2019 | Ko et al. |
| 2020/0048199 A1 | 2/2020 | Baek et al. |
| 2020/0185616 A1 | 6/2020 | Baek et al. |
| 2020/0266374 A1 | 8/2020 | Ko |

FOREIGN PATENT DOCUMENTS

| | | |
|---|---|---|
| KR | 10-1803537 B1 | 11/2017 |
| KR | 10-2018-0108604 A | 10/2018 |
| KR | 10-1956425 B1 | 3/2019 |
| KR | 10-2019-0112232 A | 10/2019 |
| KR | 10-2019-0114795 A | 10/2019 |
| KR | 10-2027025 B1 | 10/2019 |
| KR | 10-2020-0068503 A | 6/2020 |
| KR | 10-2020-0100879 A | 8/2020 |
| KR | 10-2146446 B1 | 8/2020 |

* cited by examiner

ORGANIC ELECTROLUMINESCENCE DEVICE

CROSS-REFERENCE TO RELATED APPLICATION

This application claims priority to and the benefit of Korean Patent Application No. 10-2020-0138274, filed on Oct. 23, 2020, in the Korean Intellectual Property Office, the entire content of which is hereby incorporated by reference.

BACKGROUND

1. Field

The present disclosure herein relates to an organic electroluminescence device, and more particularly, to an organic electroluminescence device including a light emitting material in an emission layer.

2. Description of Related Art

Recently, the development of organic electroluminescence displays as an image display apparatus is being actively conducted. Different from liquid crystal displays and/or the like, organic electroluminescence displays are so-called self-luminescent display apparatuses in which holes and electrons injected from a first electrode and a second electrode recombine in an emission layer, and thus, a luminescent material (including an organic compound) in the emission layer emits light to implement display (e.g., to display an image).

In the application of an organic electroluminescence device to a display apparatus, there is a demand for an organic electroluminescence device having a low driving voltage, a high luminous efficiency, and/or a long life (e.g., long lifespan), and the development of materials for an organic electroluminescence device capable of stably attaining such characteristics is being continuously pursued.

In recent years, particularly in order to implement a highly efficient organic electroluminescence device, technologies pertaining to phosphorescence emission utilizing triplet state energy or delayed fluorescence utilizing triplet-triplet annihilation (TTA), in which singlet excitons are generated by collision of triplet excitons, are being developed, and thermally activated delayed fluorescence (TADF) materials utilizing a delayed fluorescence phenomenon are being developed.

SUMMARY

An aspect according to embodiments of the present disclosure is directed toward an organic electroluminescence device exhibiting desired (e.g., excellent) luminous efficiency and lifespan characteristics.

According to an embodiment of the present disclosure, an organic electroluminescence device includes a first electrode, a second electrode facing the first electrode, and an emission layer between the first electrode and the second electrode, wherein the emission layer includes a first host, a first dopant, and a second dopant different from the first dopant, the first dopant and the second dopant are compounds each independently exhibiting thermally activated delayed fluorescence, the first dopant has a delayed fluorescence lifetime ($\tau$) value of about 2.6 μs to about 5.0 μs, and the first host, the first dopant, and the second dopant satisfy Equation 1 below.

$$T_1^{H1} > T_1^{D1} > T_1^{D2} \quad \text{Equation 1}$$

In Equation 1, $T_1^{H1}$ is a lowest triplet excitation energy level of the first host, $T_1^{D1}$ is a lowest triplet excitation energy level of the first dopant, and $T_1^{D2}$ is a lowest triplet excitation energy level of the second dopant.

A difference between a lowest singlet excitation energy level and the lowest triplet excitation energy level in each of the first dopant and the second dopant may be about 0.2 eV or less.

The second dopant may satisfy Equation 2 below.

$$k_{PF}^{D2} > k_{ISC}^{D2} \quad \text{Equation 2}$$

In Equation 2, $k_{PF}^{D2}$ is a prompt fluorescence rate constant of the second dopant, and $k_{ISC}^{D2}$ is an intersystem crossing rate constant of the second dopant.

The first dopant may be represented by Formula 1.

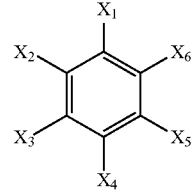

Formula 1

In Formula 1, $X_1$ to $X_6$ may be each independently a hydrogen atom, a deuterium atom, an electron withdrawing group, or an electron donating group, where at least one of $X_1$ to $X_6$ may be an electron withdrawing group and at least one of remaining $X_1$ to $X_6$ may be an electron donating group; the electron withdrawing group may be a substituted or unsubstituted fluoro group, a fluoro-substituted alkyl group having 1 to 20 carbon atoms, a fluoro-substituted aryl group having 6 to 30 ring-forming carbon atoms, a cyano group, a cyano-substituted aryl group having 6 to 30 ring-forming carbon atoms, a substituted or unsubstituted carbonyl group, or a substituted or unsubstituted triazine group; and the electron donating group may be a substituted or unsubstituted amine group, a substituted or unsubstituted nitrogen atom-containing heteroaryl group having 2 to 30 ring-forming carbon atoms, or a substituted or unsubstituted carbazole group.

At least one of $X_1$ to $X_6$ in Formula 1 may be represented by Formula 2 below.

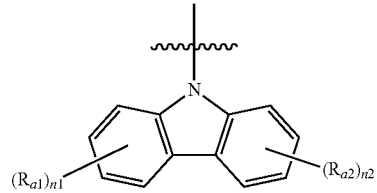

Formula 2

In Formula 2, $R_{a1}$ and $R_{a2}$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, and n1 and n2 may be each independently an integer of 0 to 4.

The second dopant may be represented by Formula 3 below.

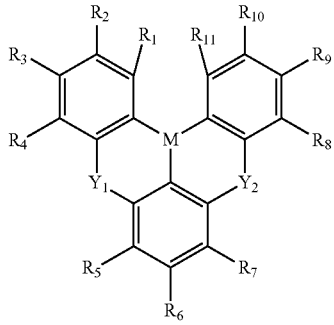

Formula 3

In Formula 3, M may be B or N; $Y_1$ and $Y_2$ may be each independently O, S, $NR_{12}$, $CR_{13}R_{14}$, $BR_{15}$, or $SiR_{16}R_{17}$; $R_1$ to $R_{11}$ may be each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring; and $R_{12}$ to $R_{17}$ may be each independently a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

The second dopant represented by Formula 3 may be represented by any one of Formulas 4-1 to 4-3 below.

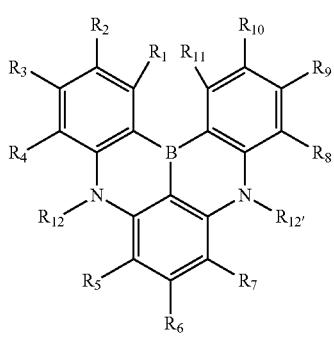

Formula 4-1

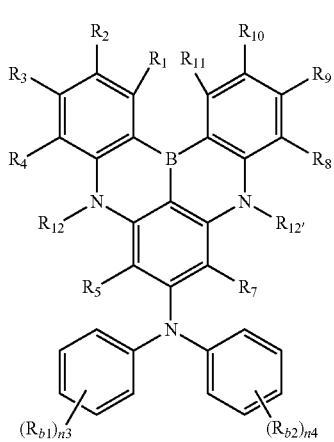

Formula 4-2

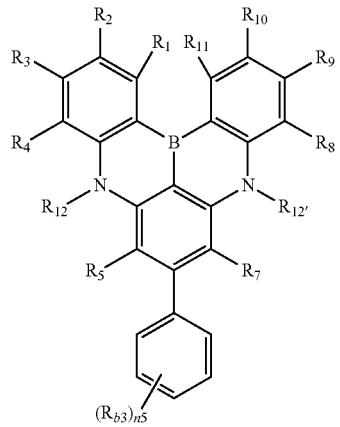

Formula 4-3

In Formulas 4-1 to 4-3, $R_{12'}$ may be a substituted or unsubstituted aryl group having 6 to 30 ring-forming carbon atoms, a substituted or unsubstituted heteroaryl group having 2 to 30 ring-forming carbon atoms, or bonded to an adjacent group to form a ring; $R_{b1}$ to $R_{b3}$ may be each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms; n3 and n5 may be each independently an integer of 0 to 5; and $R_1$ to $R_{12}$ may each independently be the same as defined in connection with Formula 3.

The first host may be represented by Formula 5 below.

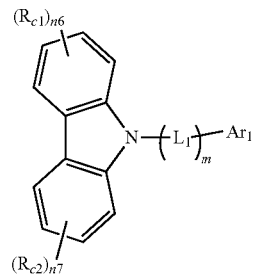

Formula 5

In Formula 5 above, X may be N or $CR_{18}$; $R_{c1}$, $R_{c2}$, and $R_{18}$ may be each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms; $L_1$ may be a substituted or unsubstituted arylene group having 6 to 30 ring-forming carbon atoms, or a substituted or unsubstituted heteroarylene group having 2 to 30 ring-forming carbon atoms; $Ar_1$ may be a substituted or unsubstituted aryl group having 6 to 30 ring-forming carbon atoms, or a substituted or unsubstituted heteroaryl group having 2 to 30 ring-forming carbon atoms; m may be 1 or 2, and n6 and n7 may be each independently an integer of 0 to 4.-

The first host represented by Formula 5 may be represented by Formula 6 below.

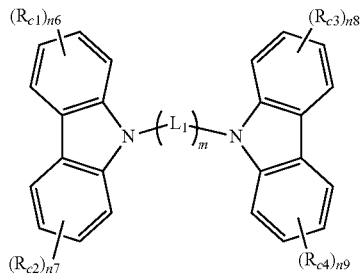

Formula 6

In Formula 6, $R_{c3}$ and $R_{c4}$ may be each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms; n8 and n9 may be each independently an integer of 0 to 4; and $R_{c1}$, $R_{c2}$, $L_1$, m, n6, and n7 may each independently be the same as respectively defined in connection with Formula 5.

The emission layer may further include a second host different from the first host, and the second host may be represented by Formula 7 below.

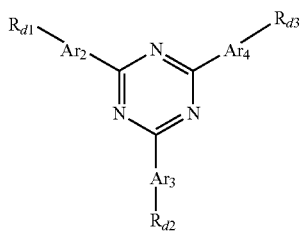

Formula 7

In Formula 7, $Ar_2$ to $Ar_4$ may be each independently a direct linkage, a substituted or unsubstituted arylene group having 6 to 30 ring-forming carbon atoms, or a substituted or unsubstituted heteroarylene group having 2 to 30 ring-forming carbon atoms; and $R_{d1}$ to $R_{d3}$ may be each independently a hydrogen atom, a deuterium atom, a halogen atom, a substituted or unsubstituted silyl group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The second host represented by Formula 7 may be represented by any one of Formulas 8-1 to 8-3 below.

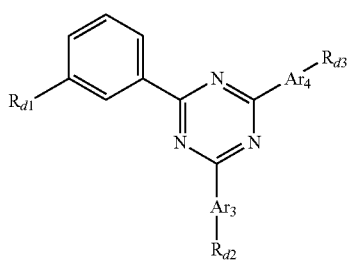

Formula 8-1

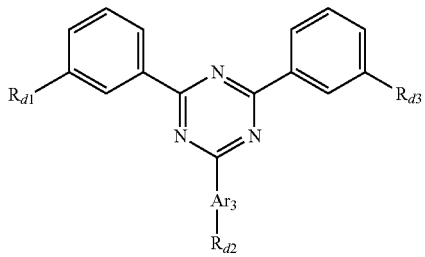

Formula 8-2

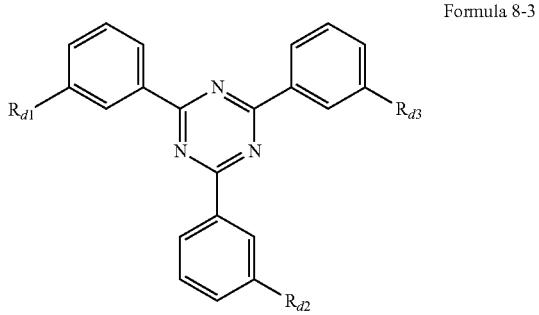

Formula 8-3

In Formulas 8-1 to 8-3, $R_{d1}$ to $R_{d3}$, $Ar_3$, and $Ar_4$ may each independently be the same as respectively defined in connection with Formula 7.

In an embodiment of the present disclosure, an organic electroluminescence device includes a first electrode, a second electrode facing the first electrode, and an emission layer between the first electrode and the second electrode, wherein the emission layer includes a first host, a first dopant represented by Formula 1 below, and a second dopant represented by Formula 3 below, the first dopant has a delayed fluorescence lifetime (τ) value of about 2.6 µs to about 5.0 µs, and a difference between a lowest singlet excitation energy level and a lowest triplet excitation energy level in each of the first dopant and the second dopant is about 0.2 eV or less.

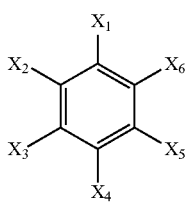

Formula 1

In Formula 1, $X_1$ to $X_6$ may be each independently a hydrogen atom, a deuterium atom, an electron withdrawing group, or an electron donating group, where at least one of $X_1$ to $X_6$ may be an electron withdrawing group and at least one of remaining $X_1$ to $X_6$ may be an electron donating group; the electron withdrawing group may be a substituted or unsubstituted fluoro group, a fluoro-substituted alkyl group having 1 to 20 carbon atoms, a fluoro-substituted aryl group having 6 to 30 ring-forming carbon atoms, a cyano group, a cyano-substituted aryl group having 6 to 30 ring-forming carbon atoms, a substituted or unsubstituted carbonyl group, or a substituted or unsubstituted triazine group; and the electron donating group may be a substituted or unsubstituted amine group, a substituted or unsubstituted nitrogen atom-containing heteroaryl group having 2 to 30 ring-forming carbon atoms, or a substituted or unsubstituted carbazole group.

Formula 3

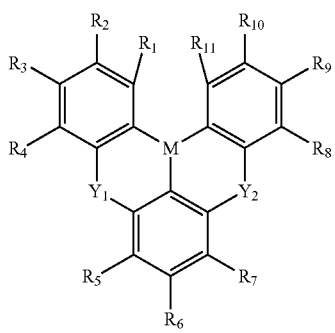

In Formula 3, M may be B or N; $Y_1$ and $Y_2$ may be each independently O, S, $NR_{12}$, $CR_{13}R_{14}$, $BR_{15}$, or $SiR_{16}R_{17}$; $R_1$ to $R_{11}$ may be each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring; and $R_{12}$ to $R_{17}$ may be each independently a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

The first host, the first dopant, and the second dopant may satisfy Equation below.

$$T_1^{H1} > T_1^{D1} > T_1^{D2} \qquad \text{Equation 1}$$

In Equation 1 above, $T_1^{H1}$ is a lowest triplet excitation energy level of the first host, $T_1^{D1}$ is a lowest triplet excitation energy level of the first dopant, and $T_1^{D2}$ is a lowest triplet excitation energy level of the second dopant.

The second dopant may satisfy Equation 2 below.

$$k_{PF}^{D2} > k_{ISC}^{D2} \qquad \text{Equation 2}$$

In Equation 2 above, $k_{PF}^{D2}$ is a prompt fluorescence rate constant of the second dopant, and $k_{ISC}^{D2}$ is an intersystem crossing rate constant of the second dopant.

The first host may be represented by Formula 5 below.

Formula 5

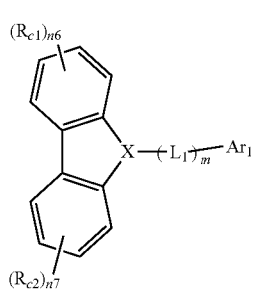

In Formula 5, X may be N or $CR_{18}$; $R_{c1}$, $R_{c2}$, and $R_{18}$ may be each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms; $L_1$ may be a substituted or unsubstituted arylene group having 6 to 30 ring-forming carbon atoms, or a substituted or unsubstituted heteroarylene group having 2 to 30 ring-forming carbon atoms; $Ar_1$ may be a substituted or unsubstituted aryl group having 6 to 30 ring-forming carbon atoms, or a substituted or unsubstituted heteroaryl group having 2 to 30 ring-forming carbon atoms; m may be 1 or 2, and n6 and n7 may be each independently an integer of 0 to 4.

The emission layer may further include a second host different from the first host, and the second host may be represented by Formula 7 below.

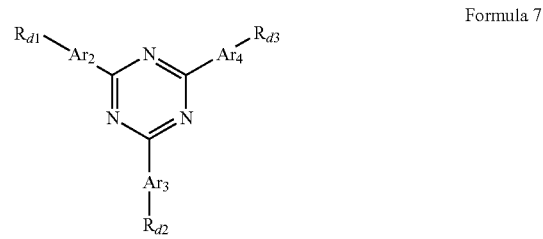

Formula 7

In Formula 7, $Ar_2$ to $Ar_4$ may be each independently a direct linkage, a substituted or unsubstituted arylene group having 6 to 30 ring-forming carbon atoms, or a substituted or unsubstituted heteroarylene group having 2 to 30 ring-forming carbon atoms; and $R_{d1}$ to $R_{d3}$ may be each independently a hydrogen atom, a deuterium atom, a halogen atom, a substituted or unsubstituted silyl group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The first host may be any one of compounds represented by Compound Group 1.

The first dopant may be any one of compounds represented by Compound Group 2.

The second dopant may be any one of compounds represented by Compound Group 3.

The second host may be any one of compounds represented by Compound Group 4. Compound Groups 1-4 are shown in the Detailed Description section below.

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain principles of the present disclosure.

In the drawings.

DETAILED DESCRIPTION

Figure 1:
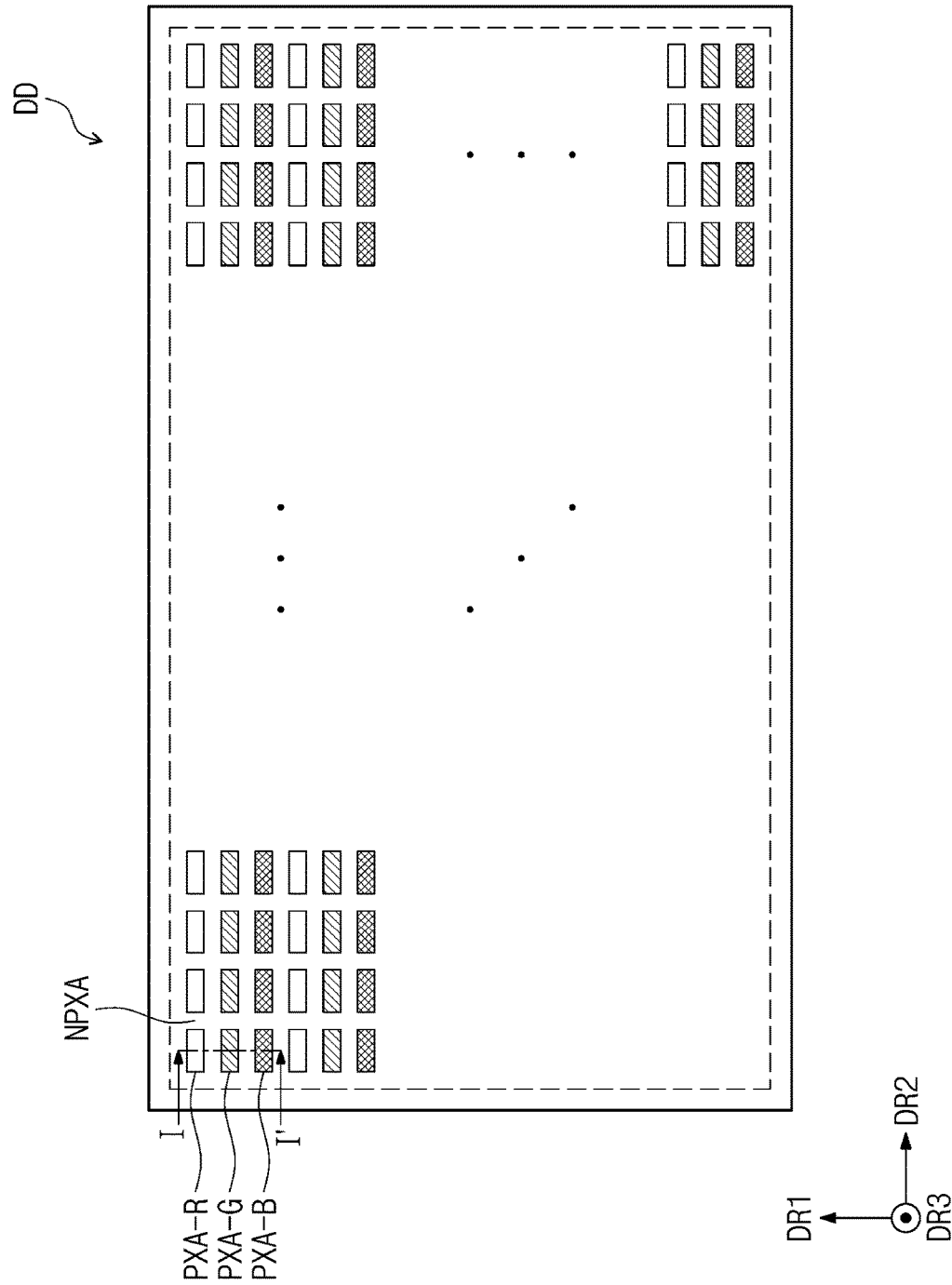
FIG. 1 is a plan view of a display device according to an embodiment of the present disclosure.

The subject matter of the present disclosure may be modified in many alternate forms, and thus example embodiments will be shown in the drawings and described in more detail. It should be understood, however, that it is not intended to limit the subject matter of the present disclosure to the particular forms disclosed, but rather, is intended to cover all modifications, equivalents, and alternatives falling within the spirit and scope of the invention, and equivalents thereof.

In describing the drawings, like reference numerals are used for referring to like elements. In the drawings, the sizes of elements may be exaggerated for clarity. It will be understood that, although the terms "first", "second", etc., may be used herein to describe various elements, these elements should not be limited by these terms. These terms are only used to distinguish one element from another. For example, a first element may be referred to as a second element, and, similarly, a second element may be referred to as a first element, without departing from the scope of example embodiments of the present disclosure. The terms of a singular form may include plural forms unless the context clearly indicates otherwise.

In the present description, it should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

In the present description, it should be understood that when an element such as a layer, a film, a region, or a substrate is referred to as being "on" or "above" another element, it may be "directly on" the other element or intervening elements may also be present. In contrast, it should be understood that when an element such as a layer, a film, a region, or a substrate is referred to as being "beneath" or "under" another element, it may be "directly under" the other element or intervening elements may also be present. In addition, in the present description, it should be understood that when an element is referred to as being "on", it may be as being either above or under the other element.

Hereinafter, embodiments of the present disclosure will be described with reference to the accompanying drawings.

Figure 2:
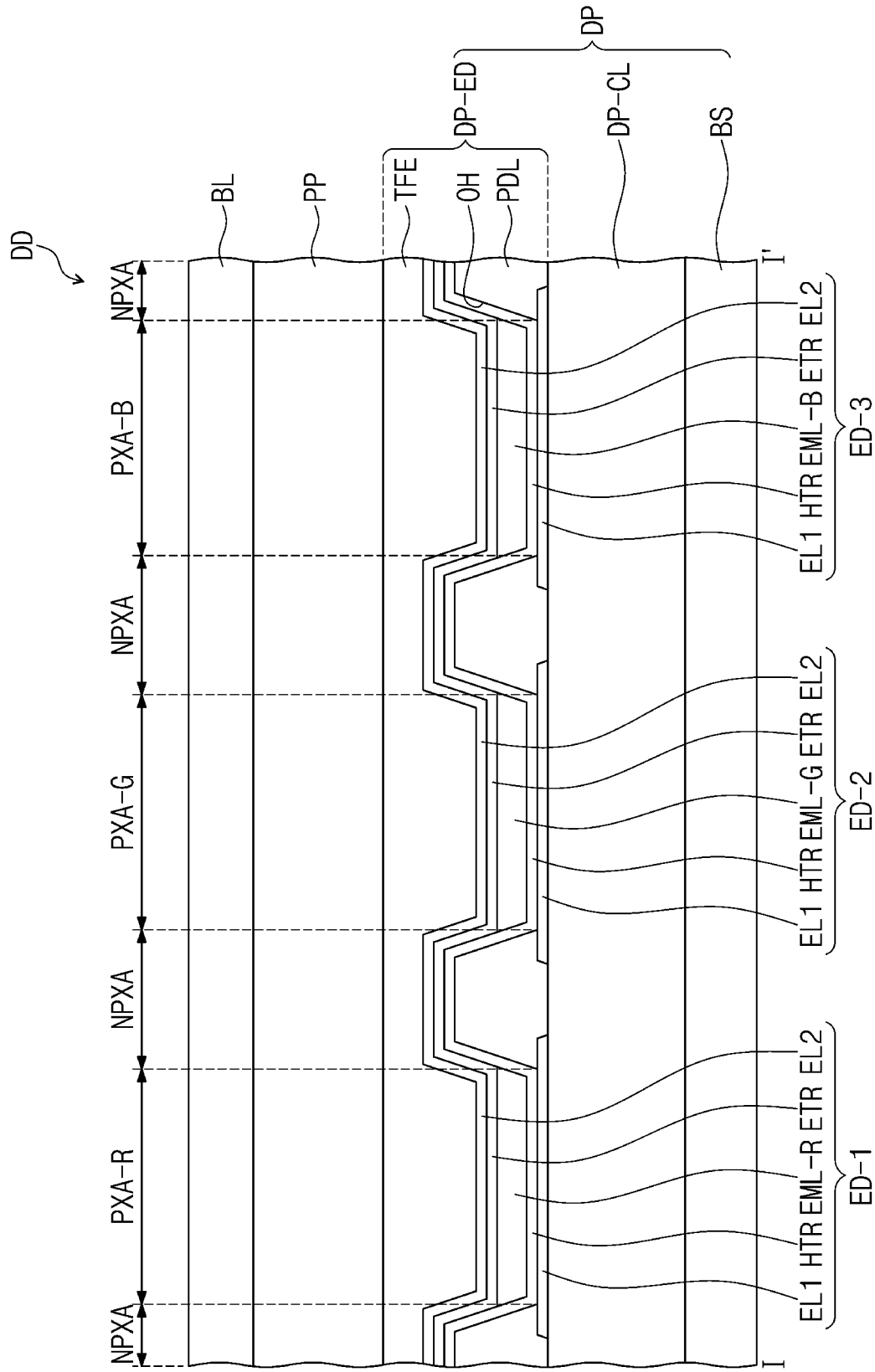
FIG. 2 is a cross-sectional view of a display device according to an embodiment of the present disclosure.

FIG. 1 is a plan view of a display device DD according to an embodiment. FIG. 2 is a cross-sectional view of a display device DD according to an embodiment. FIG. 2 is a cross-sectional view showing a portion corresponding to the line I-I' of FIG. 1.

The display device DD may include a display panel DP and an optical layer PP disposed on the display panel DP. The display panel DP may include organic electroluminescence devices ED-1, ED-2, and ED-3. The display device DD may include a plurality of organic electroluminescence devices ED-1, ED-2, and ED-3. The optical layer PP may be disposed on the display panel DP to control reflected light in the display panel DP due to external light. The optical layer PP may include, for example, a polarizing layer and/or a color filter layer. In one or more embodiments, different from the one shown in the drawings, the optical layer PP may be omitted (e.g., not included) in the display device DD.

A base substrate BL may be disposed on the optical layer PP. The base substrate BL may be a member providing a base surface on which the optical layer PP is disposed. The base substrate BL may be a glass substrate, a metal substrate, a plastic substrate, etc. However, embodiments of the present disclosure are not limited thereto, and the base substrate BL may be an inorganic layer, an organic layer, or a composite material layer. In an embodiment, different from the one shown, the base substrate BL may be omitted (e.g., not included).

The display device DD according to an embodiment may further include a filling layer. The filling layer may be disposed between a display element layer DP-ED and the base substrate BL. The filling layer may be an organic material layer. The filling layer may include at least one selected from an acrylic-based resin, a silicone-based resin, and an epoxy-based resin.

The display panel DP may include a base layer BS, a circuit layer DP-CL provided on the base layer BS, and a display element layer DP-ED. The display element layer DP-ED may include a pixel defining film PDL, a plurality of organic electroluminescence devices ED-1, ED-2, and ED-3 disposed between the pixel defining film PDL, and an encapsulation layer TFE disposed on the plurality of organic electroluminescence devices ED-1, ED-2, and ED-3.

The base layer BS may be a member providing a base surface on which the display element layer DP-ED is disposed. The base layer BS may be a glass substrate, a metal substrate, a plastic substrate, etc. However, embodiments of the present disclosure are not limited thereto, and the base layer BS may be an inorganic layer, an organic layer, or a composite material layer.

In an embodiment, the circuit layer DP-CL may be disposed on the base layer BS, and the circuit layer DP-CL may include a plurality of transistors. The transistors may each include a control electrode, an input electrode, and an output electrode. For example, the circuit layer DP-CL may include a switching transistor and a driving transistor for driving the plurality of organic electroluminescence devices ED-1, ED-2 and ED-3 of the display element layer DP-ED.

The organic electroluminescence devices ED-1, ED-2, and ED-3 may each have a structure of an organic electroluminescence device ED according to an embodiment of FIGS. 3 to 6, which will be described in more detail later. The organic electroluminescence devices ED-1, ED-2, and ED-3 may each include a first electrode EL1, a hole transport region HTR, corresponding emission layer(s) EML-R, EML-G, and/or EML-B (e.g., a corresponding one of the emission layer) EML-R, EML-G, or EML-B), an electron transport region ETR, and a second electrode EL2.

FIG. 2 illustrates an embodiment in which the emission layers EML-R, EML-G, and EML-B of the organic electroluminescence devices ED-1, ED-2, and ED-3 are disposed in an opening OH defined in the pixel defining film PDL, and the hole transport region HTR, the electron transport region ETR, and the second electrode EL2 are provided as a common layer throughout the organic electroluminescence devices ED-1, ED-2, and ED-3. However, embodiments of the present disclosure are not limited thereto, and different from the one shown in FIG. 2, in an embodiment, the hole transport region HTR and the electron transport region ETR may be provided by being patterned inside the opening OH defined in the pixel defining film PDL. For example, in an embodiment, the hole transport region HTR, the emission layers EML-R, EML-G, and EML-B, and the electron transport region ETR, etc., of the organic electroluminescence devices ED-1, ED-2, and ED-3 may be patterned through an inkjet printing method to be provided inside the opening OH.

The encapsulation layer TFE may cover the organic electroluminescence devices ED-1, ED-2, and ED-3. The encapsulation layer TFE may seal the display element layer DP-ED. The encapsulation layer TFE may be a thin film encapsulation layer. The encapsulation layer TFE may be a single layer or a laminated layer of a plurality of layers. The encapsulation layer TFE includes at least one insulating layer. The encapsulation layer TFE according to an embodiment may include at least one inorganic film (hereinafter, an encapsulation inorganic film). In addition, the encapsulation layer TFE according to an embodiment may include at least one organic film (hereinafter, an encapsulation organic film) and at least one encapsulation inorganic film.

The encapsulation inorganic film protects the display element layer DP-ED from moisture/oxygen, and the encapsulation organic film protects the display element layer DP-ED from foreign substances such as dust particles. The encapsulation inorganic film may include silicon nitride, silicon oxy nitride, silicon oxide, titanium oxide, aluminum oxide, etc., but the encapsulation inorganic film is not particularly limited thereto. The encapsulation organic film may include an acrylic-based compound, an epoxy-based compound, etc. The encapsulation organic film may include a photopolymerizable compound, and the encapsulation organic film is not particularly limited.

The encapsulation layer TFE may be disposed on the second electrode EL2 and disposed to fill the opening OH.

Referring to FIGS. 1 and 2, the display device DD may include a non-light emitting area NPXA and a plurality of light emitting areas PXA-R, PXA-G, and PXA-B.

The light emitting areas PXA-R, PXA-G, and PXA-B may each be an area emitting light generated from each of the organic electroluminescence devices ED-1, ED-2, and ED-3. The light emitting areas PXA-R, PXA-G, and PXA-B may be spaced apart from each other on a plane.

The light emitting areas PXA-R, PXA-G, and PXA-B may each be an area separated by the pixel defining film PDL. The non-light emitting areas NPXA may be areas between the neighboring light emitting areas PXA-R, PXA-G, and PXA-B, and may correspond to the pixel defining film PDL. In one or more embodiments, each of the light emitting areas PXA-R, PXA-G, and PXA-B may correspond to a pixel. The pixel defining film PDL may separate the organic electroluminescence devices ED-1, ED-2 and ED-3. The emission layers EML-R, EML-G, and EML-B of the organic electroluminescence devices ED-1, ED-2 and ED-3 may be separated by being disposed in the opening OH defined in the pixel defining film PDL.

The light emitting areas PXA-R, PXA-G, and PXA-B may be separated into a plurality of groups according to colors of light generated from the organic electroluminescence devices ED-1, ED-2, and ED-3. In the display device DD of an embodiment shown in FIGS. 1 and 2, three light emitting areas PXA-R, PXA-G, and PXA-B, which emit red light, green light, and blue light, respectively, are illustrated as an example. For example, the display device DD of an embodiment may include a red light emitting area PXA-R, a green light emitting area PXA-G, and a blue light emitting area PXA-B, which are distinct (e.g., separated) from one another.

In the display device DD according to an embodiment, the organic electroluminescence devices ED-1, ED-2, and ED-3 may emit light of different wavelength ranges. For example, in an embodiment, the display device DD may include a first organic electroluminescence device ED-1 emitting red light, a second organic electroluminescence device ED-2 emitting green light, and a third organic electroluminescence device ED-3 emitting blue light. That is, the red light emitting area PXA-R, the green light emitting area PXA-G, and the blue light emitting area PXA-B of the display device DD may correspond to the first organic electroluminescence device ED-1, the second organic electroluminescence device ED-2, and the third organic electroluminescence device ED-3, respectively.

However, embodiments of the present disclosure are not limited thereto, and the first to third organic electroluminescence devices ED-1, ED-2 and ED-3 may emit light in the same wavelength range or emit light in at least one different wavelength range. For example, the first to third organic electroluminescence devices ED-1, ED-2, and ED-3 may all emit blue light.

The light emitting areas PXA-R, PXA-G, and PXA-B in the display device DD according to an embodiment may be arranged in the form of a stripe. Referring to FIG. 1, a plurality of red light emitting areas PXA-R may be arranged with each other along a second directional axis DR2, a plurality of green light emitting areas PXA-G may be arranged with each other along the second directional axis DR2, and a plurality of blue light emitting areas PXA-B may each be arranged with each other along the second directional axis DR2. In addition, a red light emitting area PXA-R, a green light emitting area PXA-G, and a blue light emitting area PXA-B may be alternately arranged in order along a first directional axis DR1.

FIGS. 1 and 2 illustrate that the light emitting areas PXA-R, PXA-G, and PXA-B are all similar in size, but embodiments of the present disclosure are not limited thereto, and the light emitting areas PXA-R, PXA-G and PXA-B may be different in size from one another according to wavelength ranges of emitted light. In one or more embodiments, the areas of the light emitting areas PXA-R, PXA-G, and PXA-B may refer to areas when viewed on a plane defined by the first directional axis DR1 and the second directional axis DR2 (e.g., in a plan view).

In one or more embodiments, the arrangement of the light emitting areas PXA-R, PXA-G, and PXA-B is not limited to the one shown in FIG. 1, and the order that the red light emitting area PXA-R, the green light emitting area PXA-G, and the blue light emitting area PXA-B are arranged may utilize various suitable combination according to display quality characteristics required for the display device DD. For example, the light emitting areas PXA-R, PXA-G, and PXA-B may be arranged in the form of a PenTile®/PENTILE® arrangement form (PENTILE® is a registered trademark owned by Samsung Display Co., Ltd.) or a diamond.

In addition, an area of each of the light emitting areas PXA-R, PXA-G, and PXA-B may be different in size from one another. For example, in an embodiment, the green light emitting area PXA-G may be smaller than the blue light emitting area PXA-B in size, but embodiments of the present disclosure are not limited thereto.

Hereinafter, FIGS. 3 to 6 are cross-sectional views schematically illustrating an organic electroluminescence device according to an embodiment of the present disclosure. The organic electroluminescence devices ED according to an embodiment may include a first electrode EL1, a hole transport region HTR, an emission layer EML, an electron transport region ETR, and a second electrode EL2, which are sequentially stacked.

Figure 3:
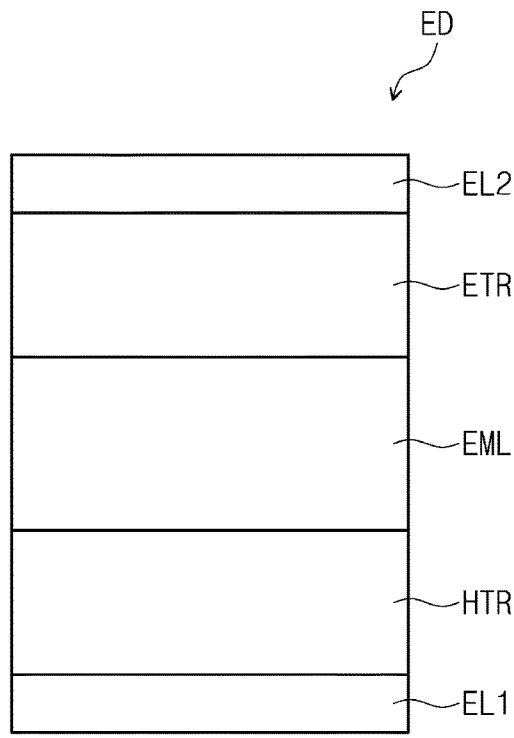
FIG. 3 is a cross-sectional view schematically illustrating an organic electroluminescence device according to an embodiment of the present disclosure.
Figure 4:
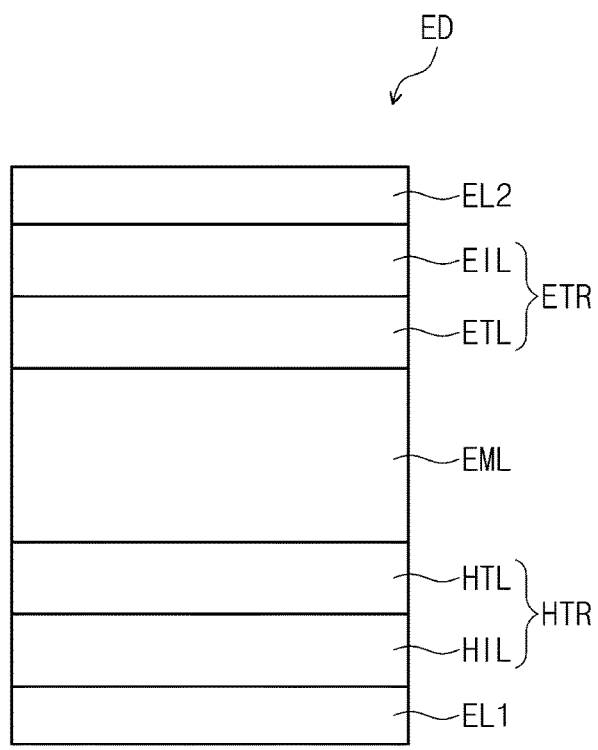
FIG. 4 is a cross-sectional view schematically illustrating an organic electroluminescence device according to an embodiment of the present disclosure.
Figure 5:
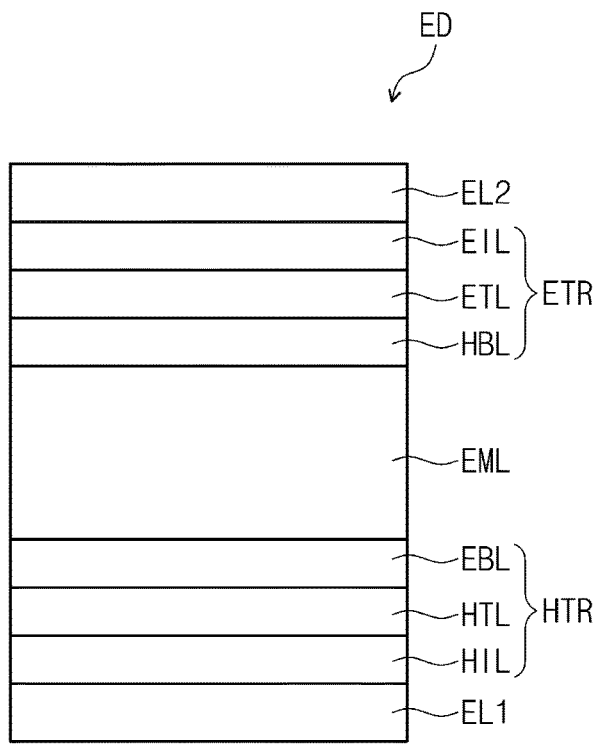
FIG. 5 is a cross-sectional view schematically illustrating an organic electroluminescence device according to an embodiment of the present disclosure.
Figure 6:
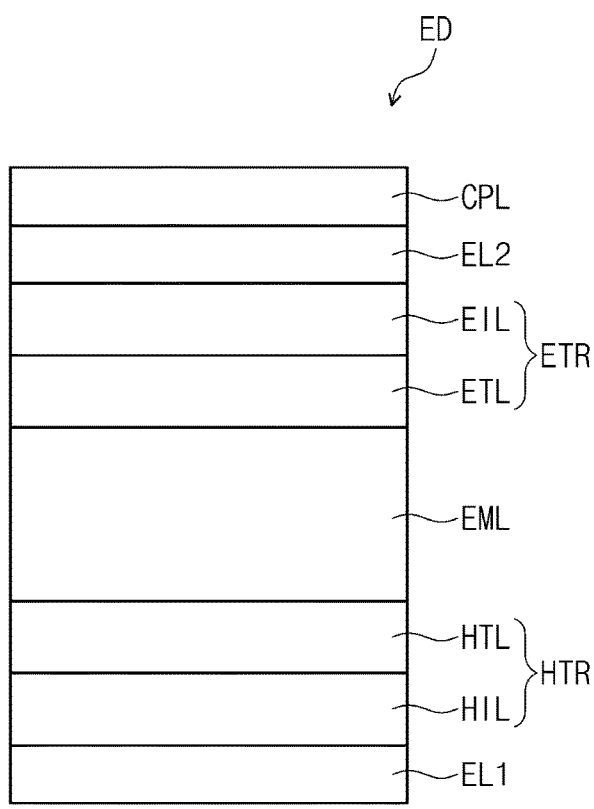
FIG. 6 is a cross-sectional view schematically illustrating an organic electroluminescence device according to an embodiment of the present disclosure.

FIG. 4 illustrates, compared with FIG. 3, a cross-sectional view of an organic electroluminescence device ED of an embodiment in which the hole transport region HTR includes a hole injection layer HIL and a hole transport layer HTL, and the electron transport region ETR includes an electron injection layer EIL and an electron transport layer ETL. In addition, FIG. 5 illustrates, compared with FIG. 3, a cross-sectional view of an organic electroluminescence device ED of an embodiment in which the hole transport region HTR includes a hole injection layer HIL, a hole transport layer HTL, and an electron blocking layer EBL, and the electron transport region ETR includes an electron injection layer EIL, an electron transport layer ETL, and a hole blocking layer HBL. FIG. 6 illustrates, compared with FIG. 4, a cross-sectional view of an organic electroluminescence device ED of an embodiment including a capping layer CPL disposed on the second electrode EL2.

The first electrode EL1 has conductivity. The first electrode EL1 may be formed of a metal material, a metal alloy or a conductive compound. The first electrode EL1 may be an anode or a cathode. However, embodiments of the present disclosure are not limited thereto. In addition, the first electrode EL1 may be a pixel electrode. The first electrode EL1 may be a transmissive electrode, a transflective electrode, or a reflective electrode. When the first electrode EL1 is a transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). In some embodiments, the first electrode EL1 may have a multi-layered structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a three-layered structure of ITO/Ag/ITO, but the first electrode EL1 is not limited thereto. In addition, embodiments of the present disclosure are not limited thereto, and the first electrode EL1 may include one or more of the above-described metal materials, a combination of two or more metal materials selected from the above-described metal materials, or one or more oxides of the above-described metal materials. The first electrode EL1 may have a thickness of about 700 Å to about 10,000 Å. for example, the first electrode EL1 may have a thickness of about 1,000 Å to about 3,000 Å.

The hole transport region HTR is provided on the first electrode EL1. The hole transport region HTR may include at least one selected from among a hole injection layer HIL, a hole transport layer HTL, a buffer layer, a light emitting auxiliary layer, and an electron blocking layer EBL. The hole transport region HTR may have a thickness of about 50 Å to about 15,000 Å.

The hole transport region HTR may have a single layer formed of a single material, a single layer formed of a plurality of different materials, or a multilayer structure having a plurality of layers formed of a plurality of different materials.

For example, the hole transport region HTR may have a single-layer structure formed of the hole injection layer HIL or the hole transport layer HTL, or a single-layer structure formed of a hole injection material or a hole transport material. In addition, the hole transport region HTR may have a single-layer structure formed of a plurality of different materials, or a structure in which a hole injection layer HIL/hole transport layer HTL, a hole injection layer HIL/hole transport layer HTL/buffer layer, a hole injection layer HIL/buffer layer, a hole transport layer HTL/buffer layer, or a hole injection layer HIL/hole transport layer HTL/electron blocking layer EBL are stacked in the respectively stated order from the first electrode EL1, but embodiments of the present disclosure are not limited thereto.

The hole transport region HTR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-1 below.

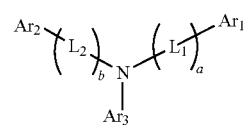

Formula H-1

In Formula H-1 above, $L_1$ and $L_2$ may be each independently a direct linkage, a substituted or unsubstituted arylene group having 6 to 30 ring-forming carbon atoms, or a substituted or unsubstituted heteroarylene group having 2 to 30 ring-forming carbon atoms. a and b may each independently be an integer of 0 to 10. In one or more embodiments, when a or b is an integer of 2 or greater, a plurality of $L_1$ and $L_2$ may be each independently a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. In addition, in Formula H-1, $Ar_3$ may be a substituted or unsubstituted aryl group having 6 to 30 ring-forming carbon atoms.

The compound represented by Formula H-1 above may be a monoamine compound (e.g., a compound including a single amine group). In some embodiments, the compound represented by Formula H-1 may be a diamine compound in which at least one of $Ar_1$ to $Ar_3$ includes an amine group as a substituent. In addition, the compound represented by Formula H-1 may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

The compound represented by Formula H-1 may be represented by any one of the compounds of Compound Group H below. However, the compounds listed in Compound Group H below are presented as examples, and the compound represented by Formula H-1 is not limited to the ones listed in Compound Group H below.

Compound Group H
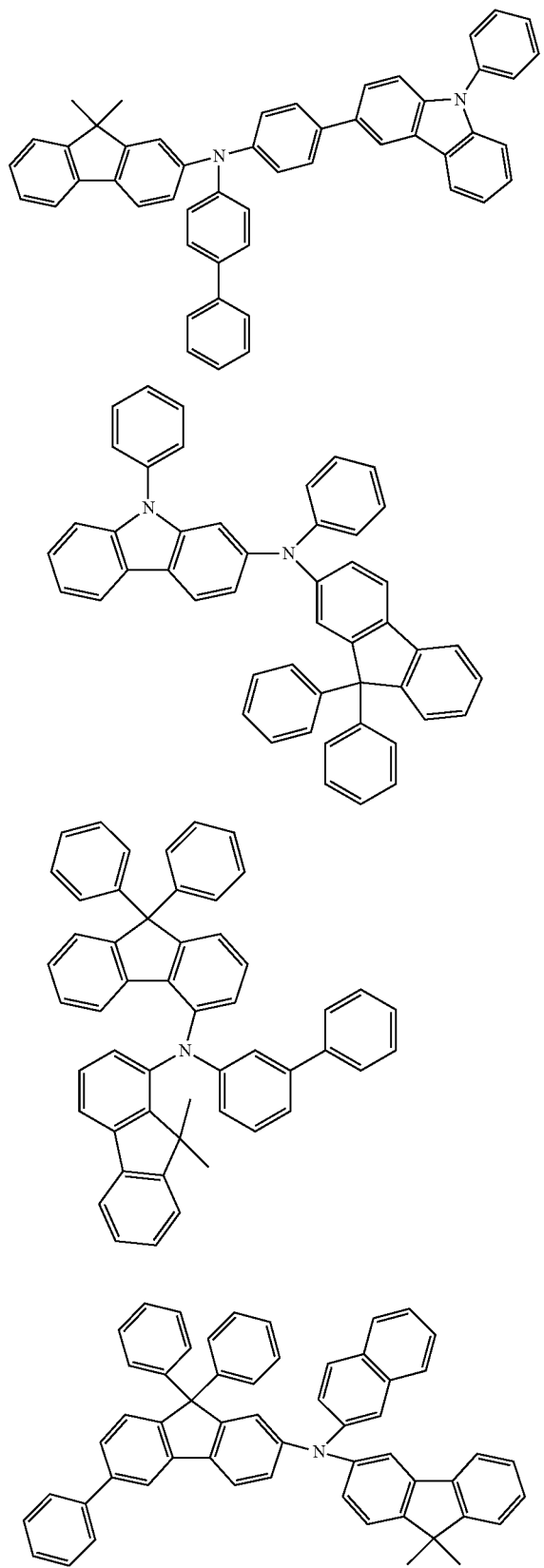
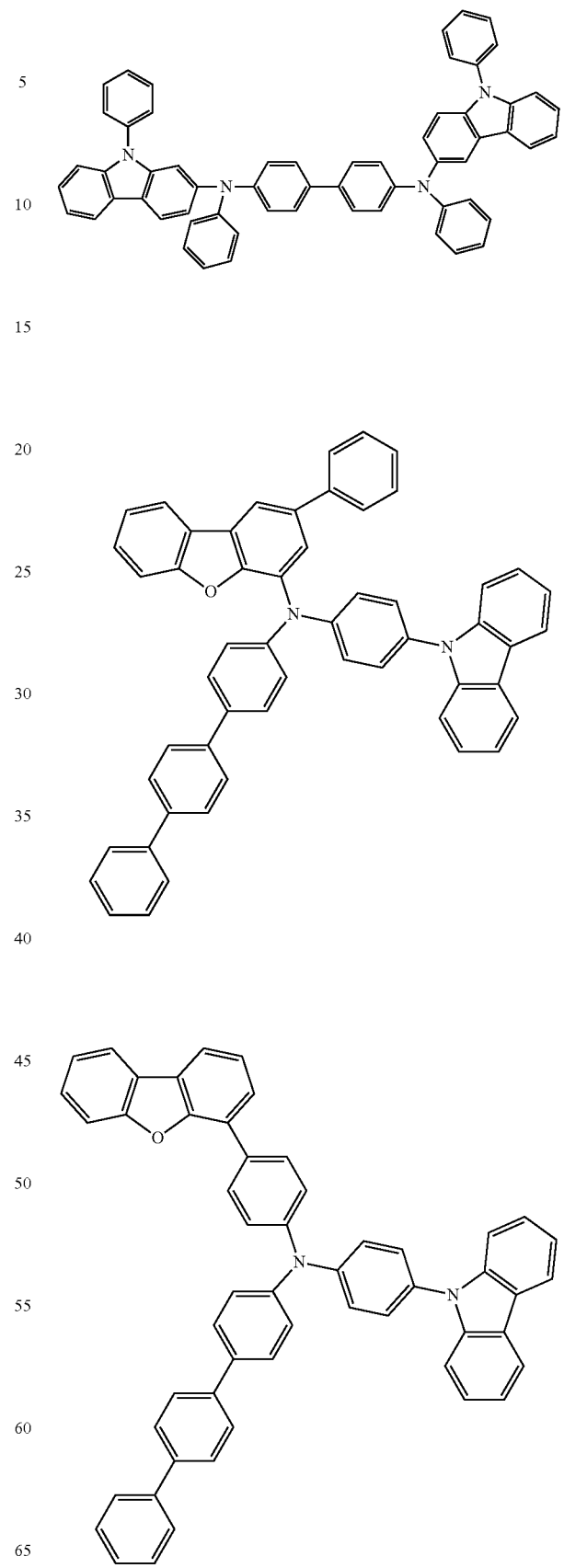

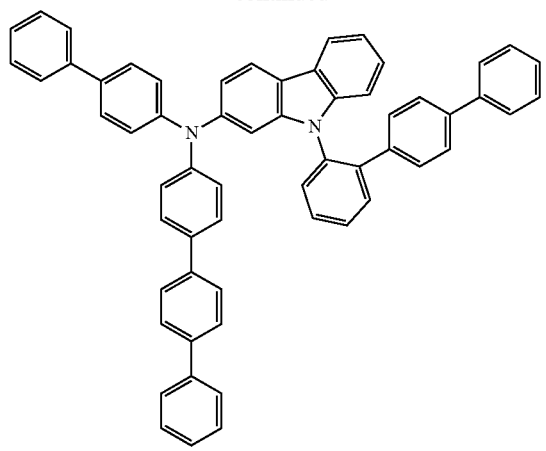
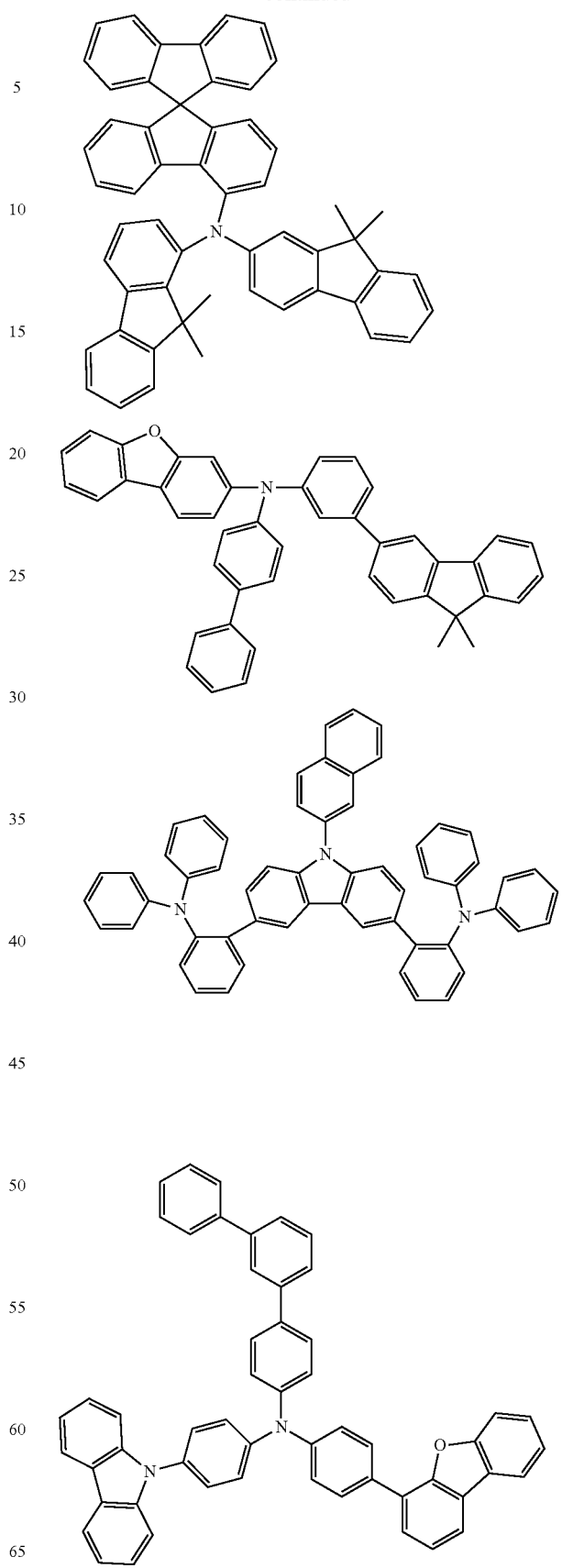

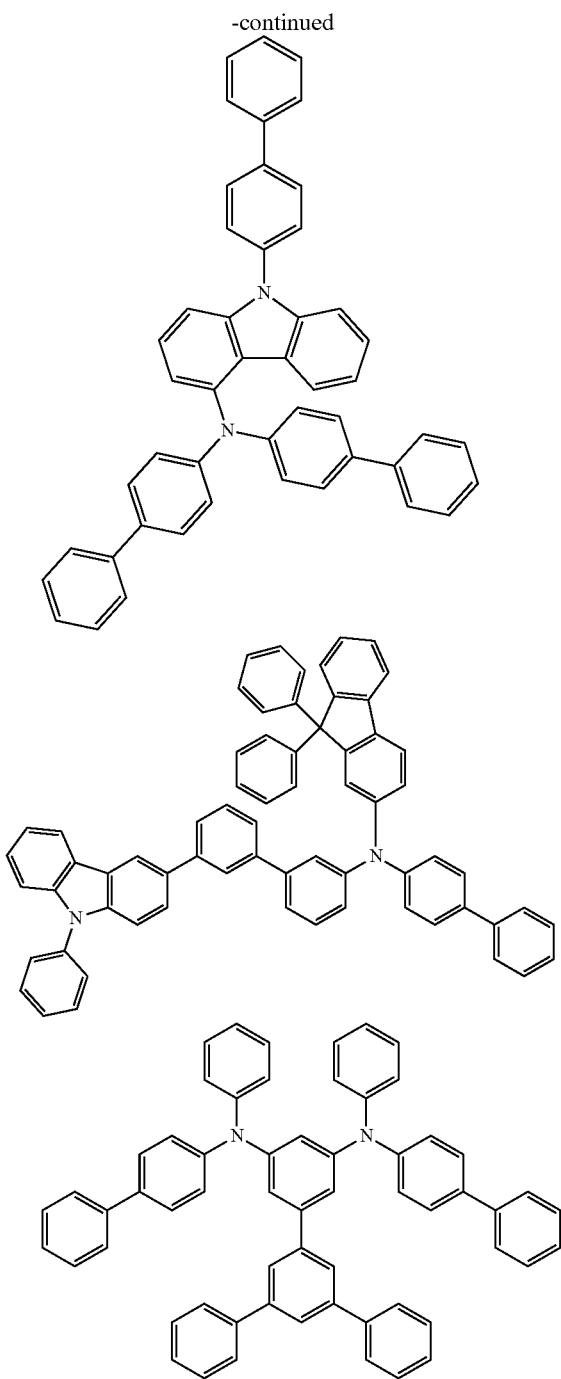

The hole transport region HTR may further include a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4''-[tris(3-methylphenyl)phenylamino]triphenylamine] (m-MTDATA), 4,4',4''-tris(N,N-diphenylamino)triphenylamine (TDATA), 4,4',4''-tris[N,-(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HATCN), etc.

The hole transport region HTR may further include carbazole-based derivatives such as N-phenyl carbazole and/or polyvinyl carbazole, fluorene-based derivatives, N,N'-bis(3-methylphenyl)-N,N'-diphenyl-[1,1-biphenyl]-4,4'-diamine (TPD), triphenylamine-based derivatives such as 4,4',4''-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

In addition, the hole transport region HTR may further include carbazole-based derivatives such as N-phenyl carbazole and/or polyvinyl carbazole, fluorene-based derivatives, N,N'-bis(3-methylphenyl)-N,N'-diphenyl-[1,1-biphenyl]-4,4'-diamine (TPD), triphenylamine-based derivatives such as 4,4',4''-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 9-(4-tert-Butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), 1,3-bis(1,8-dimethyl-9H-carbazol-9-yl)benzene (mDCP), etc.

The hole transport region HTR may include the compounds of the hole transport region described above in at least one selected from among the hole injection layer HIL, the hole transport layer HTL, and the electron blocking layer EBL.

The hole transport region HTR may have a thickness of about 100 Å to about 10,000 Å, for example, about 100 Å to about 5,000 Å. When the hole transport region HTR includes the hole injection layer HIL, the hole injection layer HIL may have a thickness of, for example, about 30 Å to about 1,000 Å. When the hole transport region HTR includes the hole transport layer HTL, the hole transport layer HTL may have a thickness of about 30 Å to about 1,000 Å. For example, when the hole transport region HTR includes the electron blocking layer EBL, the electron blocking layer EBL may have a thickness of about 10 Å to about 1,000 Å. When the thicknesses of the hole transport region HTR, the hole injection layer HIL, the hole transport layer HTL, and the electron blocking layer EBL satisfy the above-described ranges, satisfactory hole transport properties may be obtained without a substantial increase in driving voltage.

The hole transport region HTR may further include, in addition to the above-described materials, a charge generation material to increase conductivity. The charge generation material may be uniformly or non-uniformly dispersed in the hole transport region HTR. The charge generation material may be, for example, a p-dopant. The p-dopant may include at least one selected from among halogenated metal compounds, quinone derivatives, metal oxides, and cyano-containing compounds, but the present disclosure is not limited thereto. For example, the p-dopant may include halogenated metal compounds such as CuI and/or RbI, quinone derivatives such as tetracyanoquinodimethane (TCNQ) and/or 2,3,5,6-tetrafluoro-7,7,8,8-tetracyanoquinodimethane (F4-TCNQ), metal oxides such as tungsten oxides and/or molybdenum oxides, etc., but the p-dopant is not limited thereto.

As described above, the hole transport region HTR may further include at least one of a buffer layer or an electron blocking layer EBL in addition to the hole injection layer HIL and the hole transport layer HTL. The buffer layer may compensate a resonance distance according to wavelengths of light emitted from an emission layer EML, and may thus increase luminous efficiency. Materials which may be included in the hole transport region HTR may be utilized as materials included in the buffer layer. The electron blocking layer EBL is a layer that serves to prevent or substantially prevent electrons from being injected from the electron transport region ETR to the hole transport region HTR.

The emission layer EML is provided on the hole transport region HTR. The emission layer EML may have, for example, a thickness of about 100 Å to about 1,000 Å or about 100 Å to about 300 Å. The emission layer EML may have a single layer formed of a single material, a single layer formed of a plurality of different materials, or a multilayer structure having a plurality of layers formed of a plurality of different materials.

In an embodiment, the emission layer EML of the organic electroluminescence device ED includes a plurality of light emitting materials of different kinds (e.g., types) according to an embodiment of the present disclosure. The organic electroluminescence device ED according to an embodiment includes a first host, a first dopant, and a second dopant different from the first dopant.

In the present description, the term "substituted or unsubstituted" may indicate that a group is substituted or unsubstituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents exemplified above may be substituted or unsubstituted. For example, a biphenyl group may be interpreted as an aryl group or as a phenyl group substituted with a phenyl group. In addition, the substituent may be bonded to an adjacent group to form a ring.

In the present description, the term "bonded to an adjacent group to form a ring" may indicate that a group is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. In addition, the rings formed by being bonded to an adjacent group may be connected to another ring to form a spiro structure.

In the present description, the term "an adjacent group" may indicate a substituent substituted for an atom which is directly connected to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as mutually "adjacent groups" and two ethyl groups in 1,1-diethylcyclopentane may be interpreted as mutually "adjacent groups". In addition, two methyl groups in 4,5-dimethylphenanthrene may be interpreted as mutually "adjacent groups".

In the present description, examples of a halogen atom may include a fluorine atom, a chlorine atom, a bromine atom, and/or an iodine atom.

In the present description, an alkyl group may be a linear, branched or cyclic alkyl group. The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-a dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but the alkyl groups are not limited thereto.

In the present description, an aryl group indicates any functional groups or substituents derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but the aryl groups are not limited thereto.

In the present description, a heteroaryl group may include at least one of B, O, N, P, Si, or S as a ring-forming hetero atom. When the heteroaryl group contains two or more hetero atoms, the two or more hetero atoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but the heteroaryl groups are not limited thereto.

In the present description, the above description on the aryl group may be applied to an arylene group, except that the arylene group is a divalent group. The above description on the heteroaryl group may be applied to a heteroarylene group, except that the heteroarylene group is a divalent group.

In the present description, a silyl group includes an alkyl silyl group and an aryl silyl group. Examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., but the silyl groups are not limited thereto.

In the present description, the number of carbon atoms in a carbonyl group is not particularly limited, but may be 1 to 40, 1 to 30, or 1 to 20. For example, the carbonyl group may have a structure below, but the carbonyl group is not limited thereto.

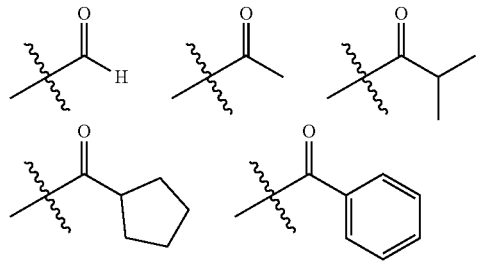

In the present description, the number of carbon atoms in an amine group is not particularly limited, but may be 1 to 30. The amine group may include an alkyl amine group and an aryl amine group. Examples of the amine group include a methylamine group, a dimethylamine group, a phenylamine group, a diphenylamine group, a naphthylamine group, a 9-methyl-anthracenylamine group, a triphenylamine group, etc., but the amine groups are not limited thereto.

In the present description, a direct linkage may refer to a single bond.

In the present description,

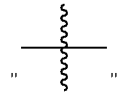

refers to a position to be connected.

Hereinafter, a light emitting mechanism in the emission layer EML according to an embodiment will be schematically described with reference to FIG. 7.

The emission layer EML of the organic electroluminescence device ED according to an embodiment of the present disclosure includes a first host, a first dopant which is a thermally activated delayed fluorescence material, and a second dopant which is a thermally activated delayed fluorescence material different from the first dopant. In the emission layer EML according to an embodiment, exciton energy generated in the first host passes through the first dopant to end up being transferred to the second dopant so as to emit fluorescence.

Figure 7:
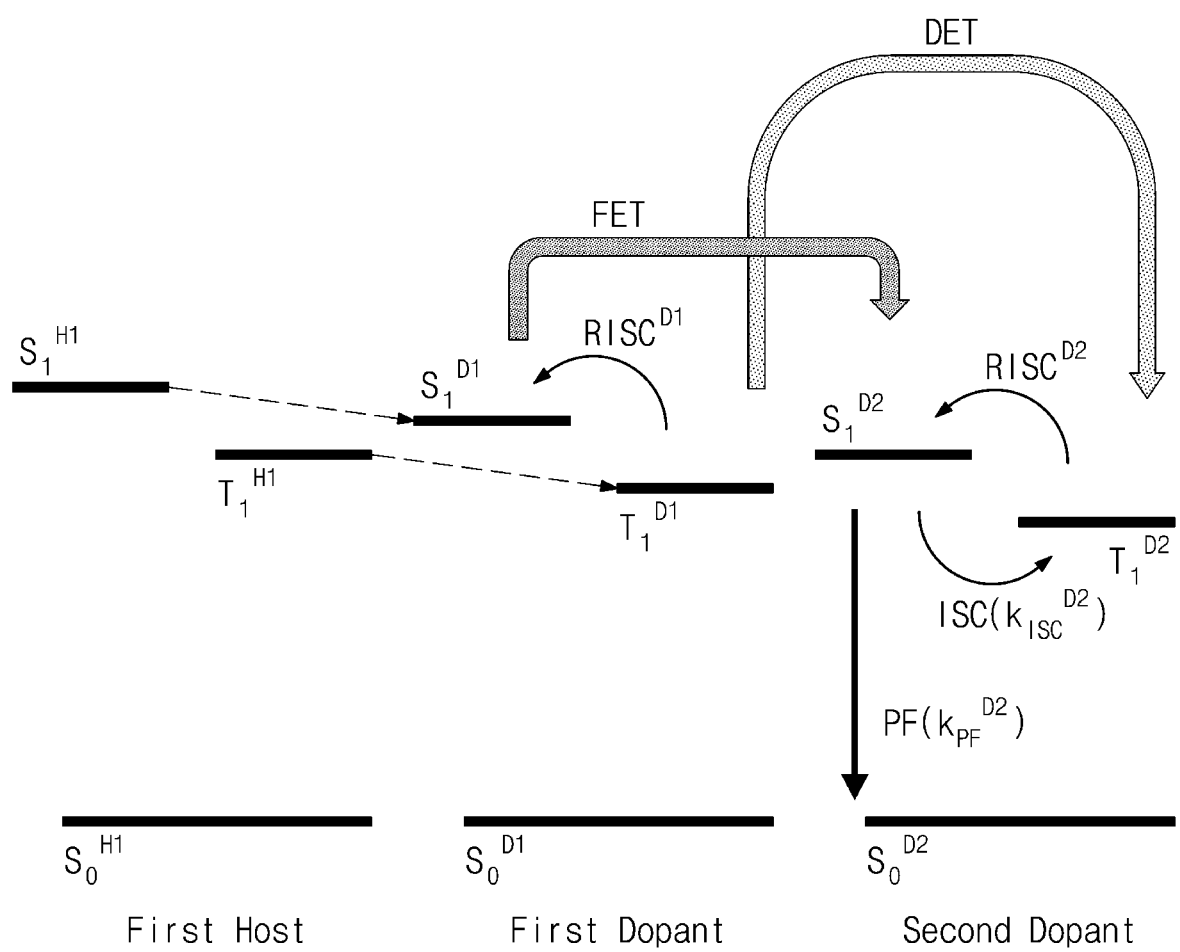
FIG. 7 is diagram schematically illustrating an energy level of materials included in an emission layer according to an embodiment of the present disclosure.

Referring to FIG. 7, in the emission layer according to an embodiment, a reverse intersystem crossing $RISC^{D1}$, which is the transition of excitons from a lowest triplet excitation energy level $T_1^{D1}$ of the first dopant to a lowest singlet excitation energy level $S_1^{D1}$ may be caused. Thereafter, a Förster energy transfer FET which transfers exciton energy resulted from the reverse intersystem crossing $RISC^{D1}$ to a lowest singlet excitation energy level $S_1^{D2}$ of the second dopant may be caused. In this case, the excitons excited to the lowest singlet excitation energy level $S_1^{D2}$ immediately fall to a ground state $S_0^{D2}$ to emit prompt fluorescence PF, or the excitons are transferred to the lowest triplet excitation energy level $T_1^{D2}$ via an intersystem crossing ISC and fall to the ground state $S_0^{D2}$ from the lowest singlet excitation energy level $S_1^{D2}$ via a reverse intersystem crossing $RISC^{D2}$ to emit delayed fluorescence.

In one or more embodiments, when the excitons stay longer at the lowest triplet excitation energy level $T_1^{D1}$ of the first dopant, the possibility for the Dexter energy transfer DET to happen, which is the transition of excitons from the lowest triplet excitation energy level $T_1^{D1}$ of the first dopant to the lowest triplet excitation energy level $T_1^{D2}$ of the second dopant, may increase, thereby causing a decrease in efficiency due to quenching.

The first dopant according to an embodiment of the present disclosure is a compound having a delayed fluorescence lifetime (τ) value of about 2.6 μs to about 5.0 μs. For example, the first dopant may have a delayed fluorescence lifetime (τ) value of about 2.6 μs to about 3.5 μs. When the delayed fluorescence lifetime (τ) of the first dopant satisfies the above ranges, the Förster energy transfer FET may be increased or maximized, and the Dexter energy transfer DET may be minimized or reduced, and the luminous efficiency may thus increase. The delayed fluorescence lifetime (τ) value is measured through a transient PL decay method utilizing a streak camera.

In an embodiment, the first host, the first dopant, and the second dopant satisfy Equation 1 below.

$$T_1^{H1} > T_1^{D1} > T_1^{D2} \qquad \text{Equation 1}$$

In Equation 1, $T_1^{H1}$ is a lowest triplet excitation energy level of the first host, $T_1^{D1}$ is a lowest triplet excitation energy level of the first dopant, and $T_1^{D2}$ is a lowest triplet excitation energy level of the second dopant. That is, the lowest triplet energy level may be set to be descending in the order from the first host, the first dopant, and the second dopant.

As described above, the exciton energy generated in the first host passes through the first dopant to end up being transferred to the second dopant for emission. When the first host, the first dopant, and the second dopant satisfy Equation 1 above, the reverse energy transfer in which the triplet exciton energy of the second dopant is transferred to the lowest triplet excitation energy level $T_1^{D1}$ of the first dopant, or the triplet exciton energy of the first dopant is transferred to the lowest triplet excitation energy level $T_1^{H1}$ of the first host may be prevented or substantially prevented.

In an embodiment, a difference between the lowest singlet excitation energy level $S_1^{D1}$ and the lowest triplet excitation energy level $T_1^{D1}$ in the first dopant may be about 0.2 eV or less. When the difference between the lowest singlet excitation energy level $S_1^{D1}$ and the lowest triplet excitation energy level $T_1^{D1}$ in the first dopant is about 0.2 eV or less, the reverse intersystem crossing $RISC^{D1}$, the transition of excitons from the lowest triplet excitation energy level $T_1^{D1}$ to the lowest singlet excitation energy level $S_1^{D1}$, is effectively performed, and the excitons fall to the ground state $S_0^{D1}$ from the lowest singlet excitation energy level $S_1^{D1}$ to emit delayed fluorescence.

In an embodiment, a difference between the lowest singlet excitation energy level $S_1^{D2}$ and the lowest triplet excitation energy level $T_1^{D2}$ in the second dopant may be about 0.2 eV or less. When the difference between the lowest singlet excitation energy level $S_1^{D2}$ and the lowest triplet excitation energy level $T_1^{D2}$ in the second dopant is about 0.2 eV or less, the reverse intersystem crossing $RISC^{D2}$, the transition of excitons from the lowest triplet excitation energy level $T_1^{D2}$ to the lowest singlet excitation energy level $S_1^{D2}$, is effectively performed, and the excitons fall to the ground state $S_0^{D2}$ from the lowest singlet excitation energy level $S_1^{D2}$ to emit delayed fluorescence.

In an embodiment, the second dopant may satisfy Equation 2 below.

$$k_{PF}^{D2} > k_{ISC}^{D2} \qquad \text{Formula 2}$$

In Equation 2, $k_{PF}^{D2}$ is a prompt fluorescence PF rate constant of the second dopant, and $k_{ISC}^{D2}$ is an intersystem crossing ISC rate constant of the second dopant. That is, the second dopant may be a compound having a rate at which the prompt fluorescence PF is emitted from the lowest singlet excitation energy level $S_1^{D2}$ to the ground state $S_0^{D2}$ greater than the intersystem crossing ISC rate of the transition from the singlet excitation energy level $S_1^{D2}$ to the lowest triplet excitation energy level $T_1^{D2}$.

Referring back to FIG. 7, in a case where excitons excited with the Förster energy transfer FET emit the prompt fluorescence PF when not being in the intersystem crossing ISC, the second dopant may increase luminous efficiency. The second dopant according to an embodiment has a prompt fluorescence rate constant $k_{PF}^{D2}$ greater than an intersystem crossing rate constant $k_{ISC}^{D2}$, thereby having a greater chance of emitting fluorescence and achieving high luminous efficiency.

The first dopant according to an embodiment of the present disclosure has a structure which is not particularly limited as long as a delayed fluorescence lifetime (τ) value is about 2.6 μs to about 5.0 μs. For example, the first dopant may be represented by Formula 1 below. However, the structure of the first dopant is not limited to Formula 1 below.

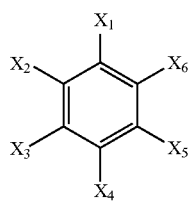

Formula 1

In Formula 1, $X_1$ to $X_6$ may be each independently a hydrogen atom, a deuterium atom, an electron withdrawing group, or an electron donating group. In this case, at least one of $X_1$ to $X_6$ may be an electron withdrawing group, and at least one of remaining $X_1$ to $X_6$ (e.g., the other) may be an electron donating group.

In Formula 1, the electron withdrawing group may be a substituted or unsubstituted fluoro group, a fluoro-substituted alkyl group having 1 to 20 carbon atoms, a fluoro-substituted aryl group having 6 to 30 ring-forming carbon atoms, a cyano group, a cyano-substituted aryl group having 6 to 30 ring-forming carbon atoms, a substituted or unsubstituted carbonyl group, or a substituted or unsubstituted triazine group.

In Formula 1, the electron donating group may be a substituted or unsubstituted amine group, a substituted or unsubstituted nitrogen atom-containing heteroaryl group having 2 to 30 ring-forming carbon atoms, or a substituted or unsubstituted carbazole group.

In an embodiment, at least one of $X_1$ to $X_6$ in Formula 1 may be represented by a cyano group. For example, the first dopant represented by Formula may include a cyanobenzene moiety.

In an embodiment, at least one of $X_1$ to $X_6$ in Formula 1 may be represented by Formula 2 below.

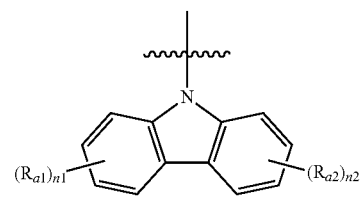

Formula 2

In Formula 2, $R_{a1}$ and $R_{a2}$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

In Formula 2, n1 may be an integer of 0 to 4, and when n1 is an integer of 2 or greater, a plurality of $R_{a1}$'s may be the same as or different from each other.

In Formula 2, n2 may be an integer of 0 to 4, and when n2 is an integer of 2 or greater, a plurality of $R_{a2}$'s may be the same as or different from each other.

In an embodiment, at least three of $X_1$ to $X_6$ in Formula 1 may be represented by Formula 2.

In an embodiment, at least four of $X_1$ to $X_6$ in Formula 1 may be represented by Formula 2.

In an embodiment, the second dopant may be represented by Formula 3 below.

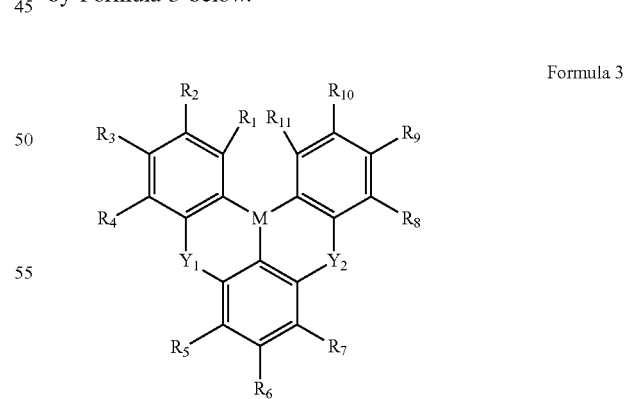

Formula 3

In Formula 3, M may be B or N, and $Y_1$ and $Y_2$ may be each independently O, S, $NR_{12}$, $CR_{13}R_{14}$, $BR_{15}$, or $SiR_{16}R_{17}$.

In Formula 3, $R_1$ to $R_{11}$ may be each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

In Formula 3, $R_{12}$ to $R_{17}$ may be each independently a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

In an embodiment, $Y_1$ and $Y_2$ in Formula 3 may be the same as each other. In an embodiment, $Y_1$ and $Y_2$ may be each independently $NR_{12}$ or $CR_{13}R_{14}$.

In an embodiment, Formula 3 may be represented by any one of Formulas 4-1 to 4-3 below.

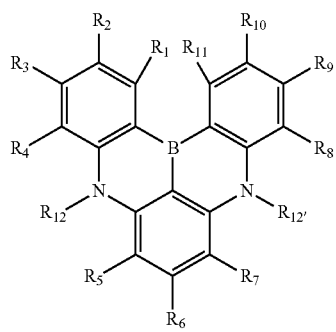

Formula 4-1

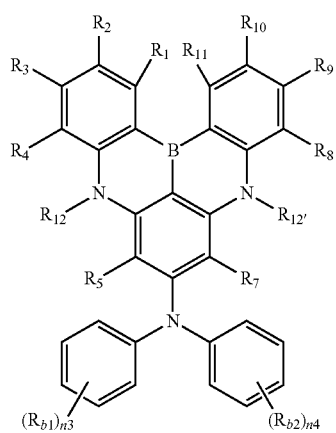

Formula 4-2

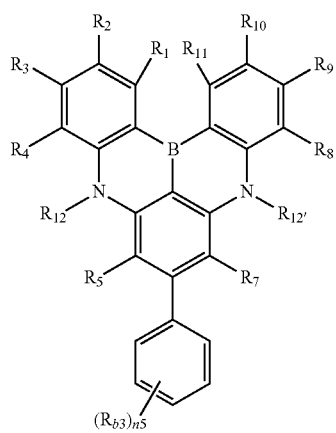

Formula 4-3

In Formulas 4-1 to 4-3, $R_{12'}$ may be a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

In Formulas 4-1 to 4-3, $R_{b1}$ to $R_{b3}$ may be each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 4-2, n3 may be an integer of 0 to 5, and when n3 is an integer of 2 or greater, a plurality of $R_{b1}$'s may be the same as or different from each other.

In Formula 4-2, n4 may be an integer of 0 to 5, and when n4 is an integer of 2 or greater, a plurality of $R_{b2}$'s may be the same as or different from each other.

In Formula 4-3, n5 may be an integer of 0 to 5, and when n5 is an integer of 2 or greater, a plurality of $R_{b3}$'s may be the same as or different from each other.

In Formulas 4-1 to 4-3, $R_1$ to $R_{12}$ are the same as defined in Formula 3 above.

In an embodiment, the first host may be represented by Formula 5 below.

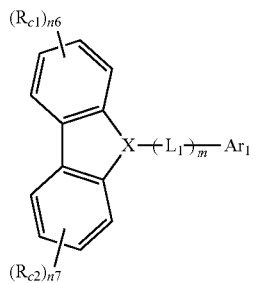

Formula 5

In Formula 5, X may be N or $CR_{18}$, and $R_{c1}$, $R_{c2}$, and $R_{18}$ may be each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 5, $L_1$ may be a substituted or unsubstituted arylene group having 6 to 30 ring-forming carbon atoms, or a substituted or unsubstituted heteroarylene group having 2 to 30 ring-forming carbon atoms.

In Formula 5, $Ar_1$ may be a substituted or unsubstituted aryl group having 6 to 30 ring-forming carbon atoms, or a substituted or unsubstituted heteroaryl group having 2 to 30 ring-forming carbon atoms.

In Formula 5, m may be 1 or 2. In one or more embodiments, when m is 2, a plurality of $L_1$'s may be the same as or different from each other.

In Formula 5, n6 may be an integer of 0 to 4. In one or more embodiments, when n6 is an integer of 2 or greater, a plurality of Rei's may be the same as or different from each other.

In Formula 5, n7 may be an integer of 0 to 4. In one or more embodiments, when n7 is an integer of 2 or greater, a plurality of $R_c2$'s may be the same as or different from each other.

In an embodiment, the first host represented by Formula 5 may be represented by Formula 6 below.

Formula 6

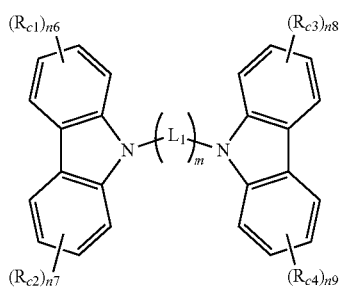

In Formula 6, $R_{c3}$ and $R_{c4}$ may be each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 6, n8 may be an integer of 0 to 4. In one or more embodiments, when n8 is an integer of 2 or greater, a plurality of $R_{c3}$'s may be the same as or different from each other.

In Formula 6, n9 may be an integer of 0 to 4. In one or more embodiments, when n9 is an integer of 2 or greater, a plurality of $R_{c4}$'s may be the same as or different from each other.

In Formula 6, $R_{c1}$, $R_{c2}$, $L_1$, m, n6, and n7 may each independently the same as respectively defined in connection with Formula 5 above.

In an embodiment, $L_1$ in Formula 6 may be a phenylene group or a biphenylene group.

In an embodiment, the emission layer EML may further include a second host different from the first host, and the second host may be represented by Formula 7 below.

Formula 7

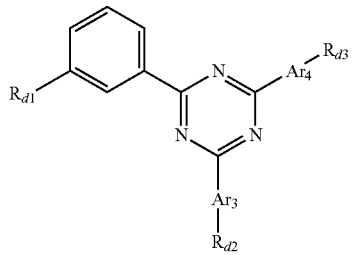

In Formula 7, $Ar_2$ to $Ar_4$ may be each independently a direct linkage, a substituted or unsubstituted arylene group having 6 to 30 ring-forming carbon atoms, or a substituted or unsubstituted heteroarylene group having 2 to 30 ring-forming carbon atoms.

In Formula 7, $R_{d1}$ to $R_{d3}$ may be each independently a hydrogen atom, a deuterium atom, a halogen atom, a substituted or unsubstituted silyl group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In an embodiment, the second host represented by Formula 7 may be represented by any one of Formulas 8-1 to 8-3 below.

Formula 8-1

Formula 8-2

Formula 8-3

In Formulas 8-1 to 8-3, $R_{d1}$ to $R_{d3}$, $Ar_3$, and $Ar_4$ are each independently the same as respectively defined in connection with Formula 7 above.

The first host represented by Formula 5 according to an embodiment may be any one selected from among compounds represented by Compound Group 1 below. However, embodiments of the present disclosure are not limited thereto.

Compound Group 1

HT-01

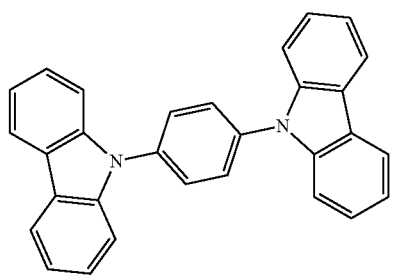

HT-02
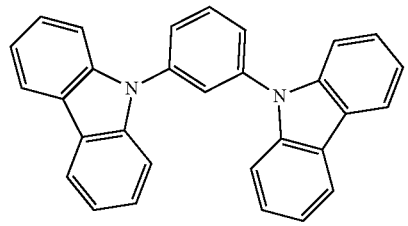
HT-03
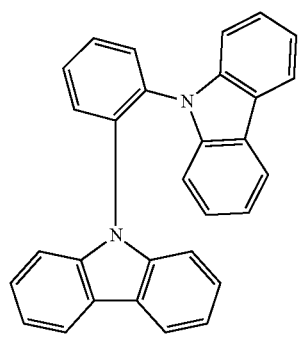
HT-04
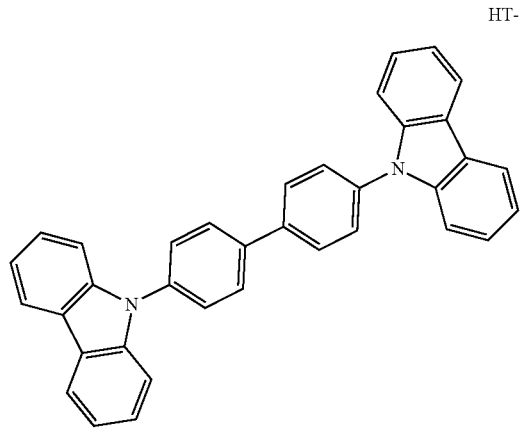
HT-05
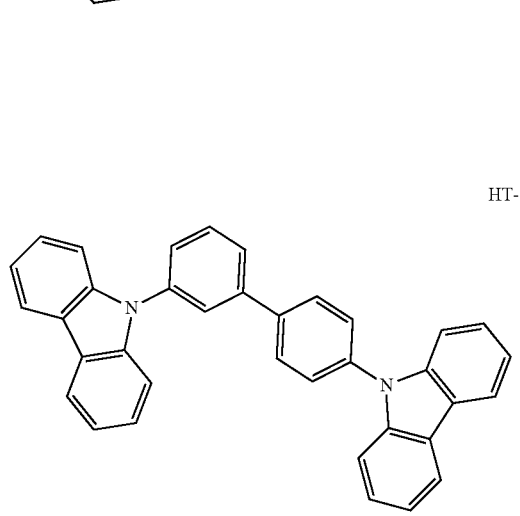
HT-06
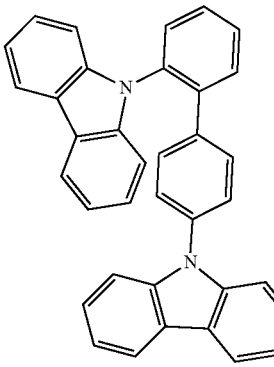
HT-07
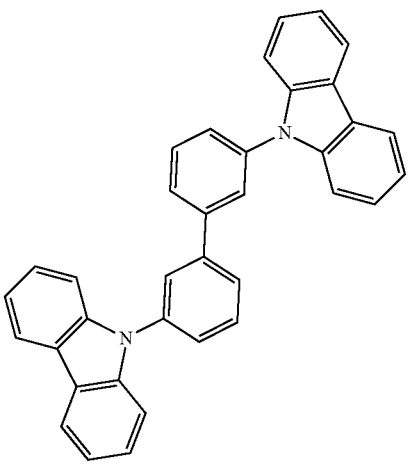
HT-08
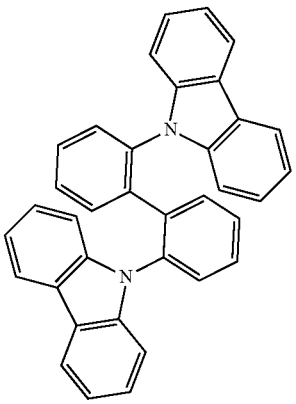
HT-09
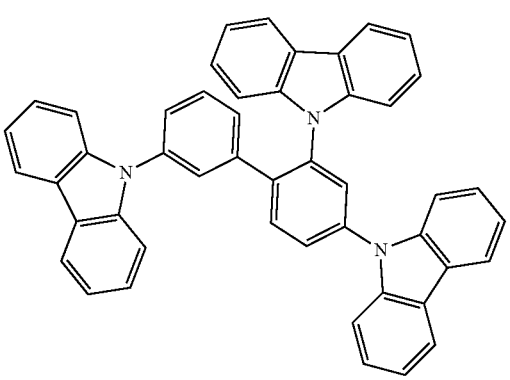

The first dopant represented by Formula 1 according to an embodiment may be any one selected from among compounds represented by Compound Group 2 below. However, embodiments of the present disclosure are not limited thereto.
Compound Group 2
DA-01
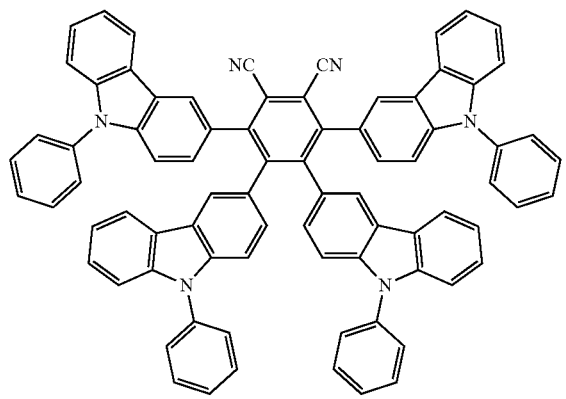
DA-02
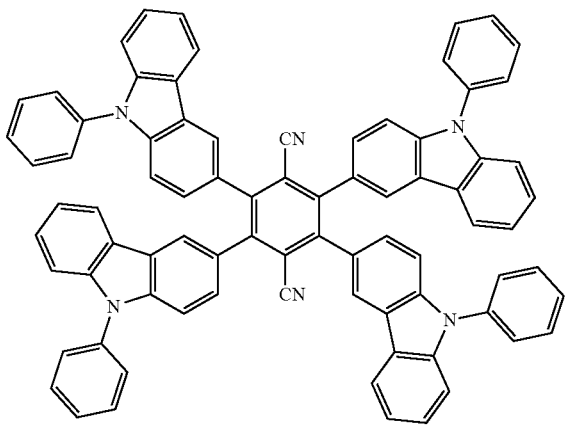
DA-03
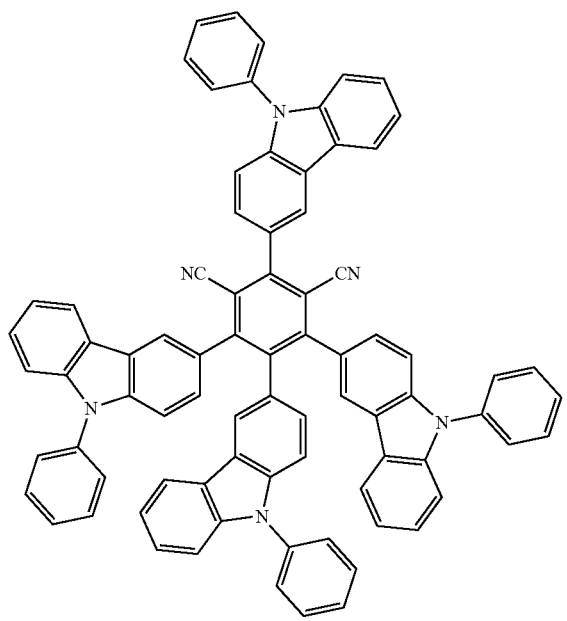
DA-04
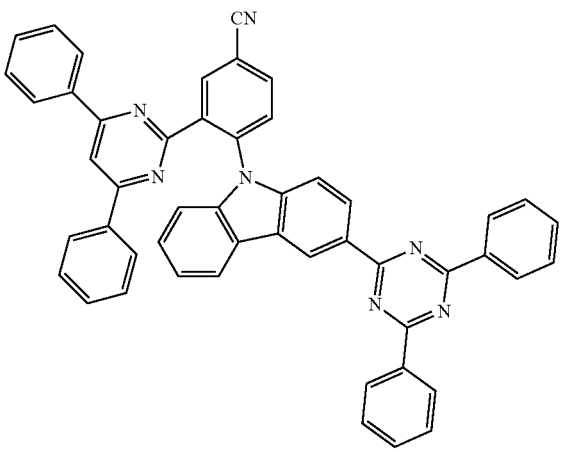
DA-05
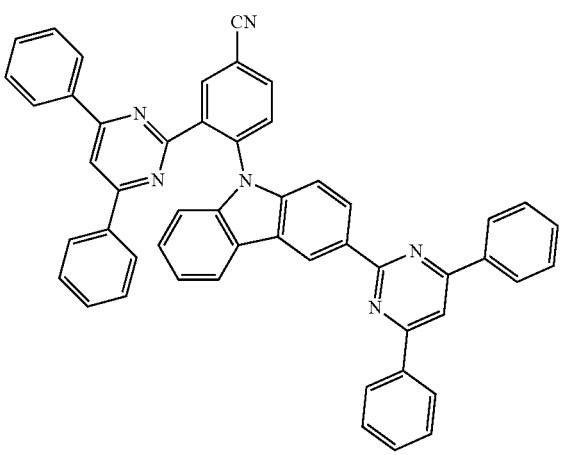
DA-06
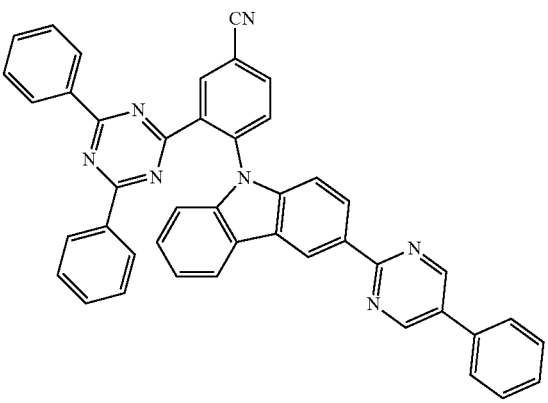

-continued
DA-07
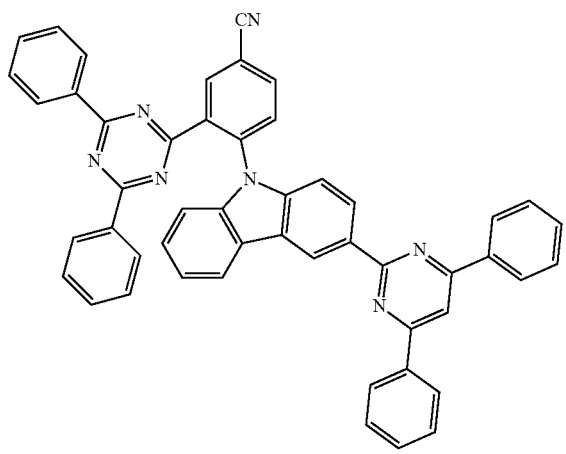
DA-08
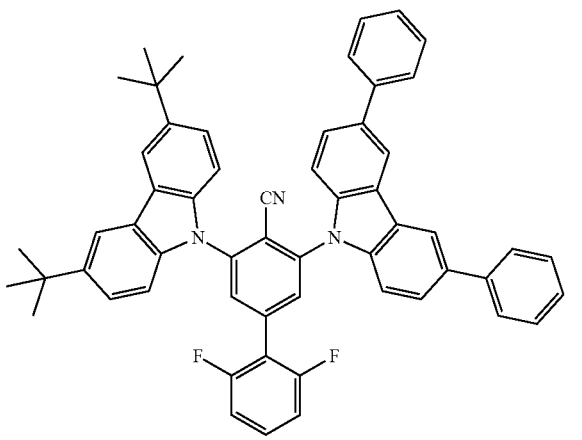
DA-09
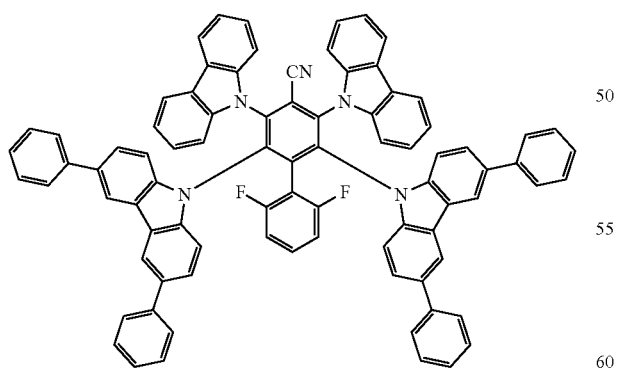
The second dopant represented by Formula 3 according to an embodiment may be any one selected from among compounds represented by Compound Group 3 below. However, embodiments of the present disclosure are not limited thereto.
Compound Group 3
D-01
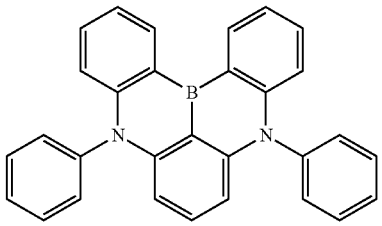
D-02
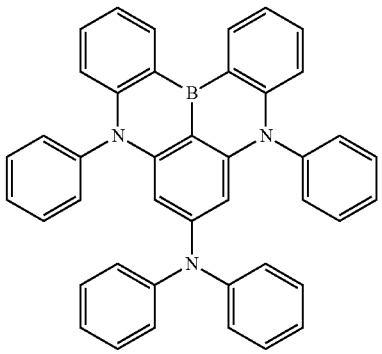
D-03
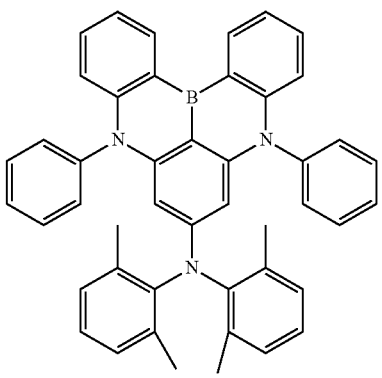
D-04
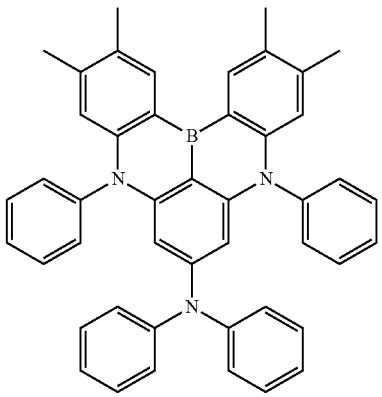

D-05
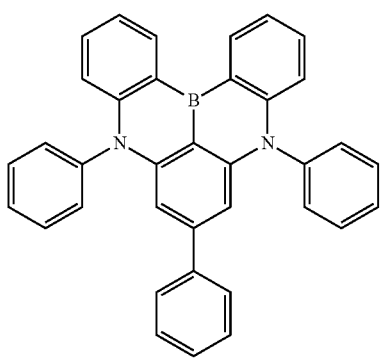
D-07
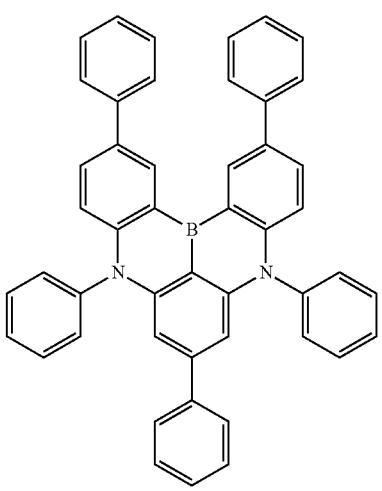
D-06
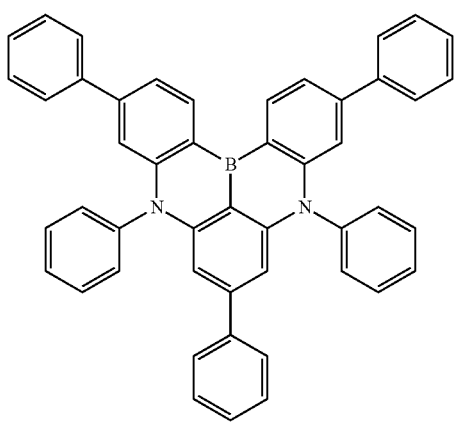
D-08
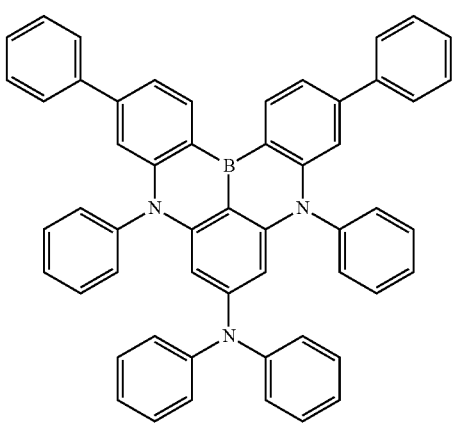
The second host represented by Formula 7 according to an embodiment may be any one selected from among compounds represented by Compound Group 4 below. However, embodiments of the present disclosure are not limited thereto.
D-06
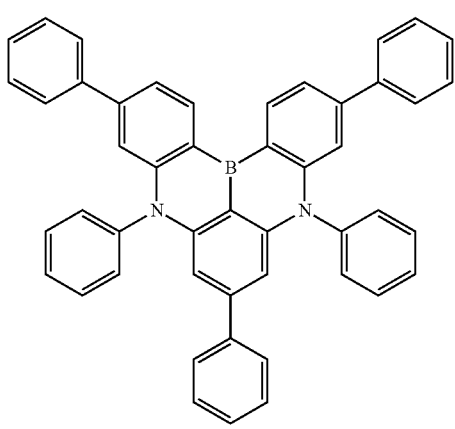
Compound Group 4
ET01
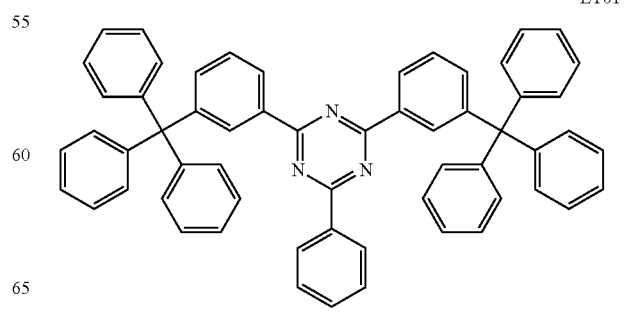

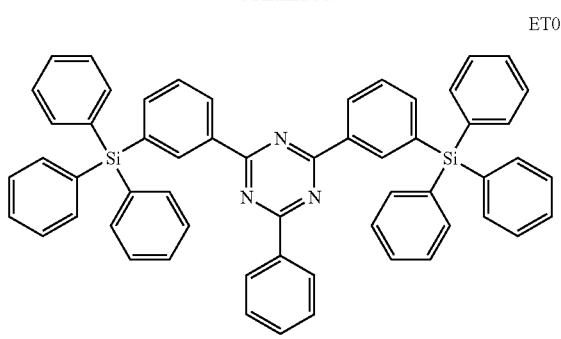

ET02

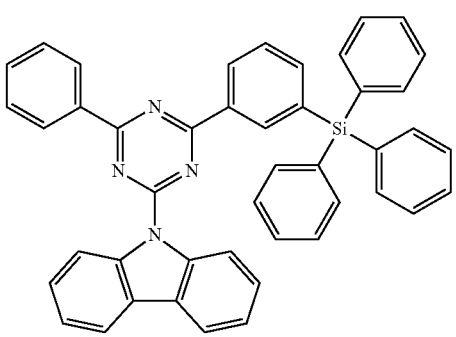

ET06

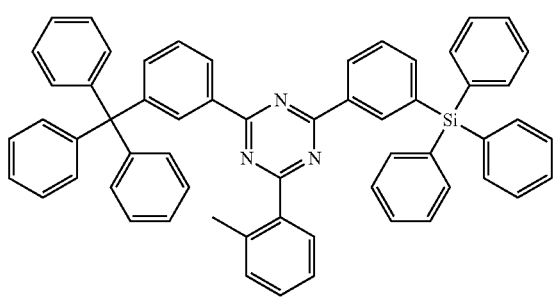

ET03

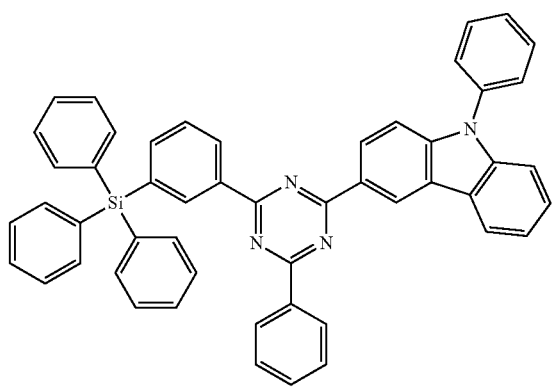

ET04

ET05

Referring back to FIGS. 3 to 6, the organic electroluminescence device ED according to an embodiment of the present disclosure will be described.

As described above, the organic electroluminescence device ED according to an embodiment of the present disclosure includes a first host and a first dopant and a second dopant, which are different thermally activated delayed fluorescence materials, in the emission layer EML.

In one or more embodiments, the organic electroluminescence device ED according to an embodiment may include a plurality of emission layers. The plurality of emission layers may be sequentially stacked and provided, and for example, the organic electroluminescence device ED including the plurality of emission layers may emit white light. The organic electroluminescence device ED including the plurality of emission layers may be an organic electroluminescence device having a tandem structure. When the organic electroluminescence device ED includes the plurality of emission layers, at least one emission layer EML may include all of the first host, the first dopant, and the second dopant as described above.

In the organic electroluminescence device ED of an embodiment, the emission layer EML may further include an anthracene derivative, a pyrene derivative, a fluoranthene derivative, a chrysene derivative, a dihydrobenzanthracene derivative, or a triphenylene derivative. For example, the emission layer EML may further include an anthracene derivative or a pyrene derivative.

In the organic electroluminescence devices ED of the embodiments shown in FIGS. 3 to 6, the emission layer EML may further include a host and a dopant, and the emission layer EML may include a compound represented by Formula E-1 below. The compound represented by Formula E-1 below may be utilized as a fluorescent host material.

Formula E-1

In Formula E-1, $R_{31}$ to $R_{40}$ may be each independently a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring. In one or more embodiments, $R_{31}$ to $R_{40}$ may be bonded to an adjacent group to form a saturated hydrocarbon ring or an unsaturated hydrocarbon ring.

In Formula E-1, c and d may be each independently an integer of 0 to 5.

Formula E-1 may be represented by any one selected from among compounds E1 to E19 below.

E1

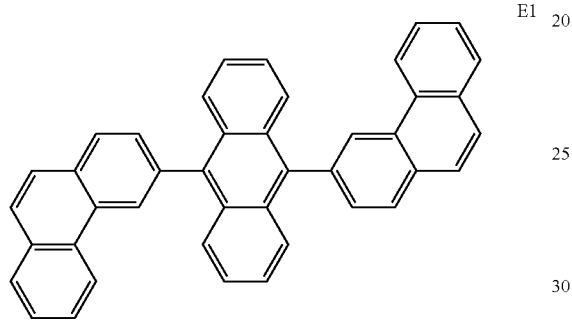

E2

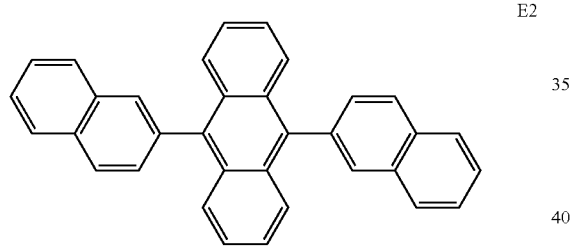

E3

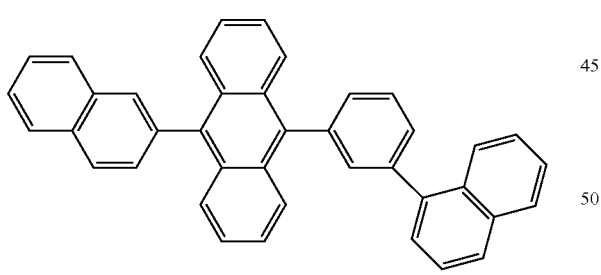

E4

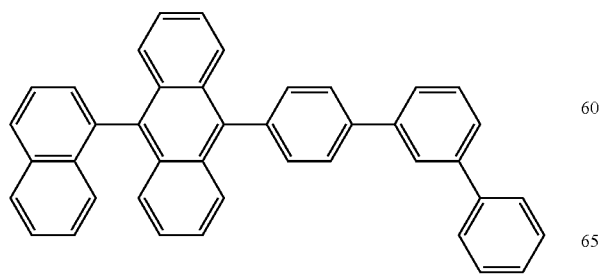

-continued

E5

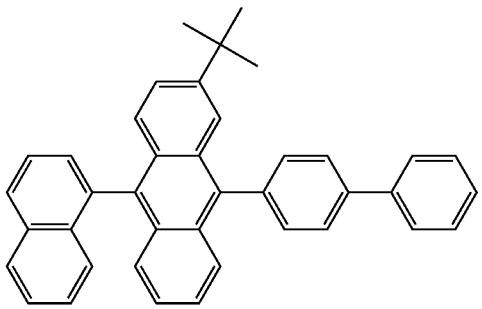

E6

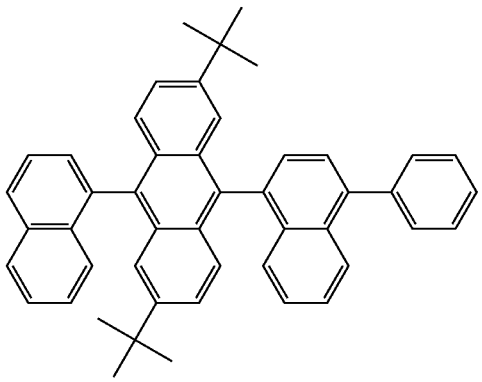

E7

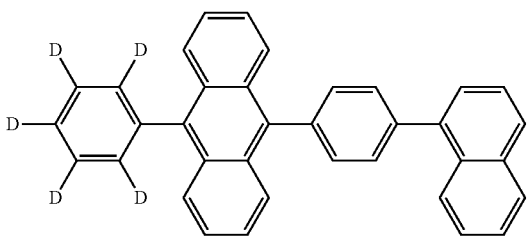

E8

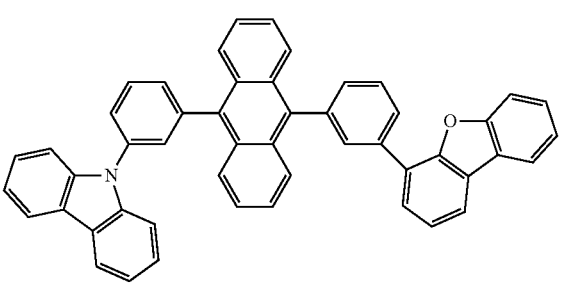

E9

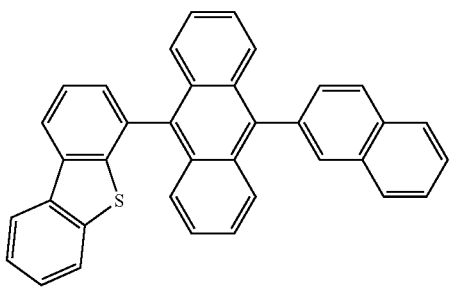

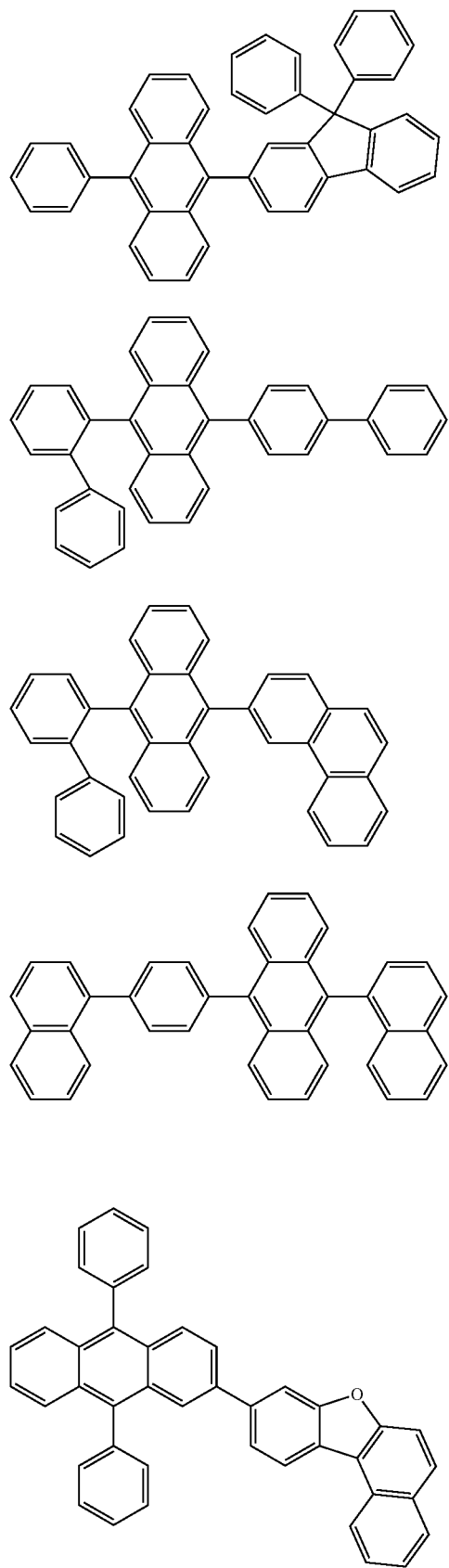
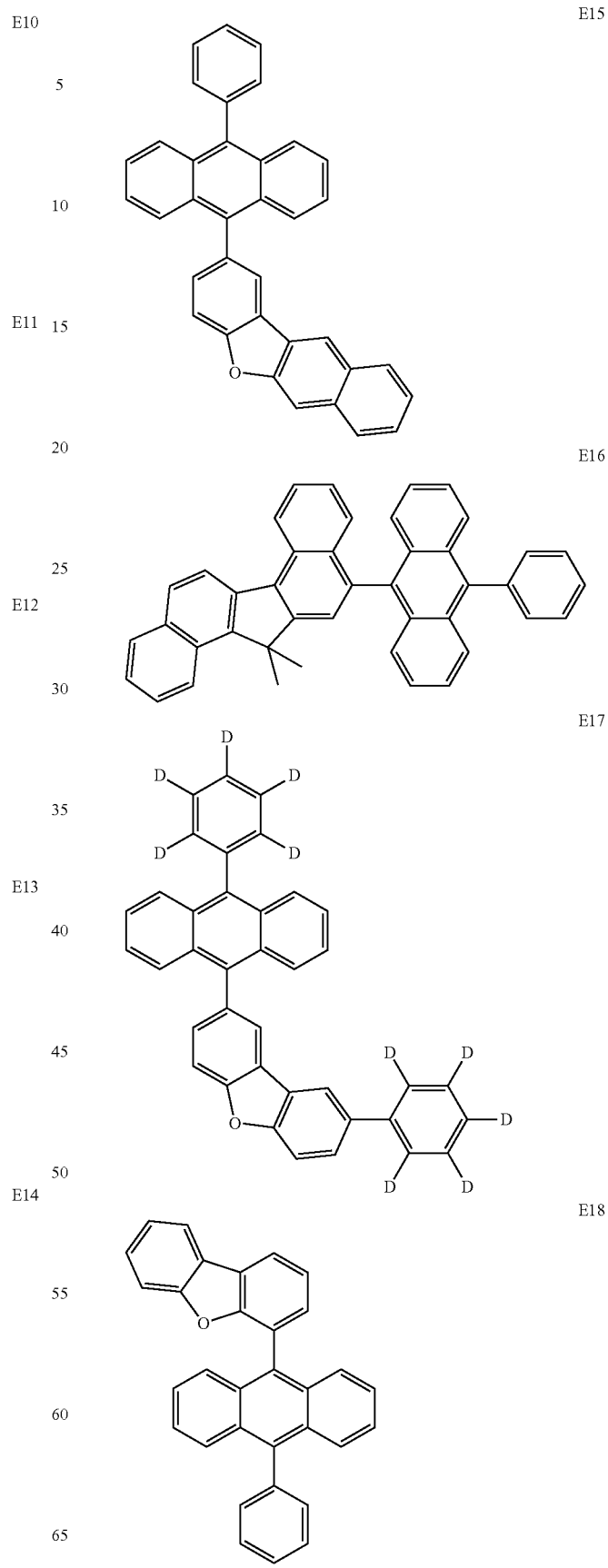

E19

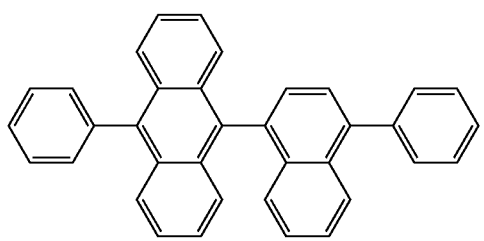

In an embodiment, the emission layer EML may further include a compound represented by Formula E-2a or Formula E-2b. The compound represented by Formula E-2a or Formula E-2b may be utilized as a phosphorescent host material.

Formula E2-a

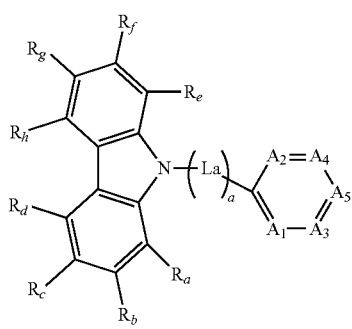

In Formula E-2a, a may be an integer of 0 to 10, and $L_a$ may be a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, when a is an integer of 2 or greater, a plurality of $L_a$'s may be each independently a substituted or unsubstituted arylene group having 6 to 30 ring-forming carbon atoms, or a substituted or unsubstituted heteroarylene group having 2 to 30 ring-forming carbon atoms.

In addition, in Formula E-2a, $A_1$ to $A_5$ may be each independently N or $CR_i$. $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring. $R_a$ to $R_i$ may be bonded to an adjacent group to form a hydrocarbon ring or a heterocycle containing N, O, S, etc., as a ring-forming atom.

In one or more embodiments, in Formula E-2a, two or three selected from $A_1$ to $A_5$ may be N, and the remainder (e.g., the rest) may be $CR_i$.

Formula E-2b

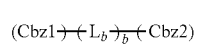

In Formula E-2b, Cbz1 and Cbz2 may be each independently an unsubstituted carbazole group or a carbazole group substituted with an aryl group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. b may be an integer of 0 to 10, and when b is an integer of 2 or greater, a plurality of $L_b$'s may be each independently a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one of the compounds of Compound Group E-2 below. However, the compounds listed in Compound Group E-2 below are presented as examples, and the compound represented by Formula E-2a or Formula E-2b is not limited to the ones listed in Compound Group E-2 below.

Compound Group E-2

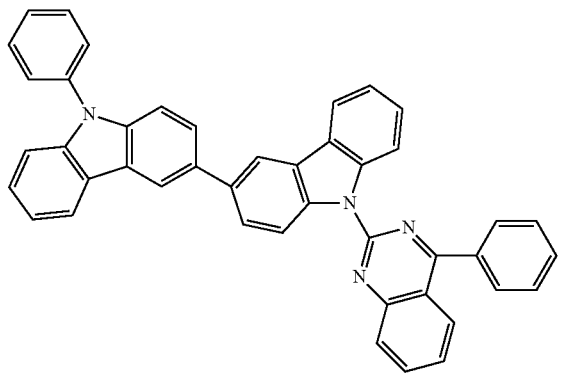

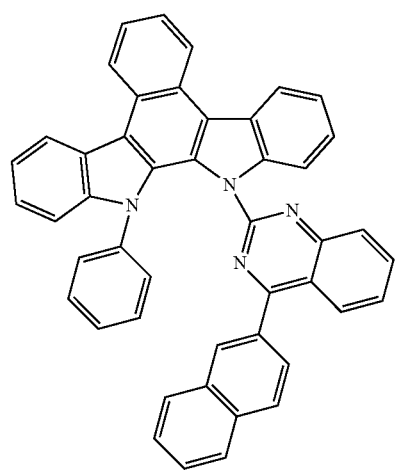

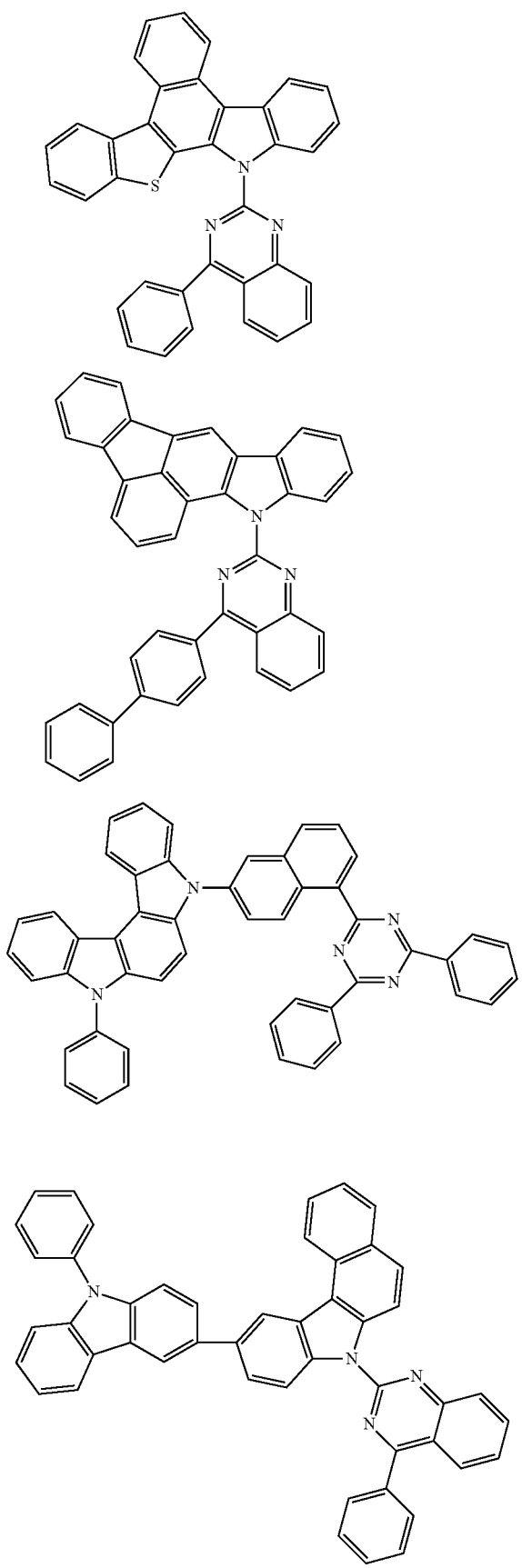
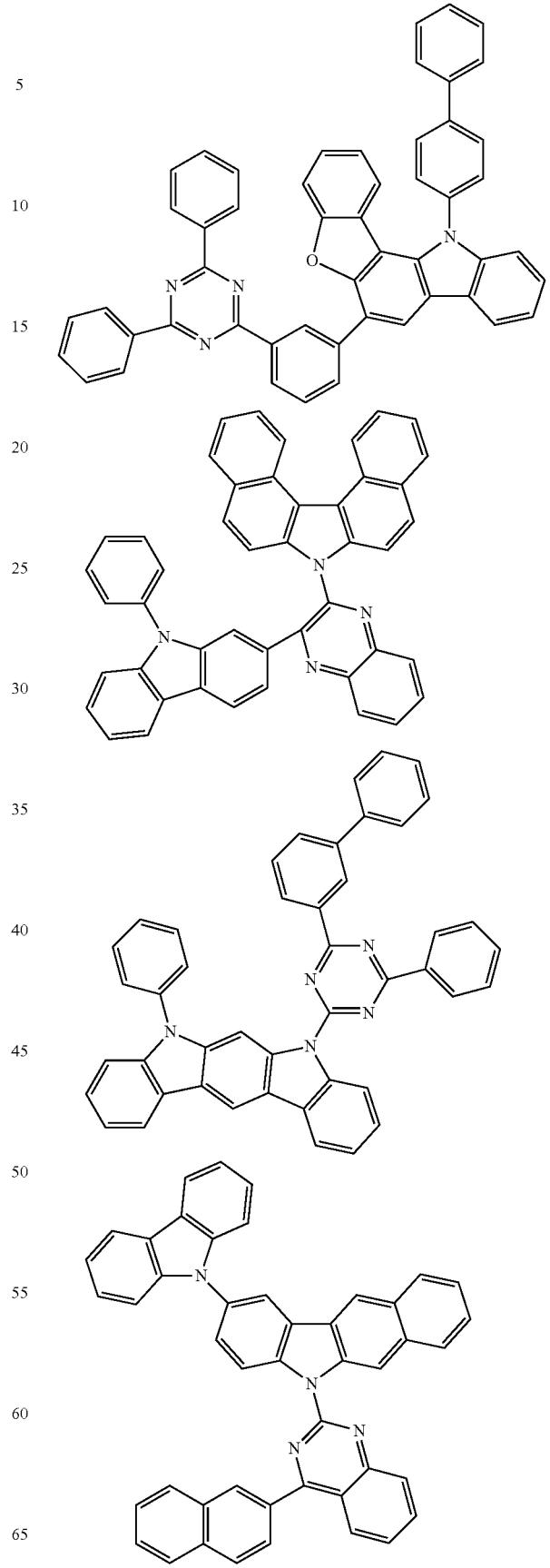

49
-continued
50
-continued
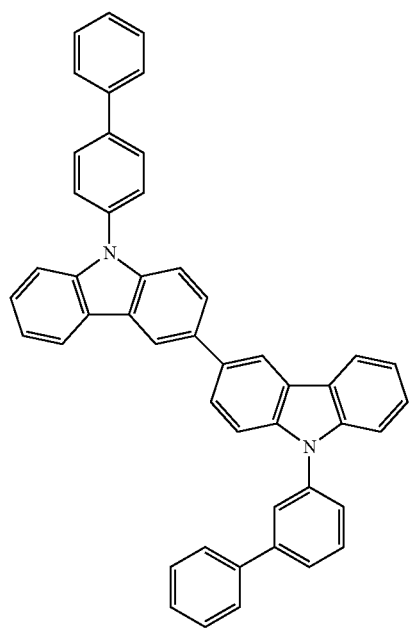
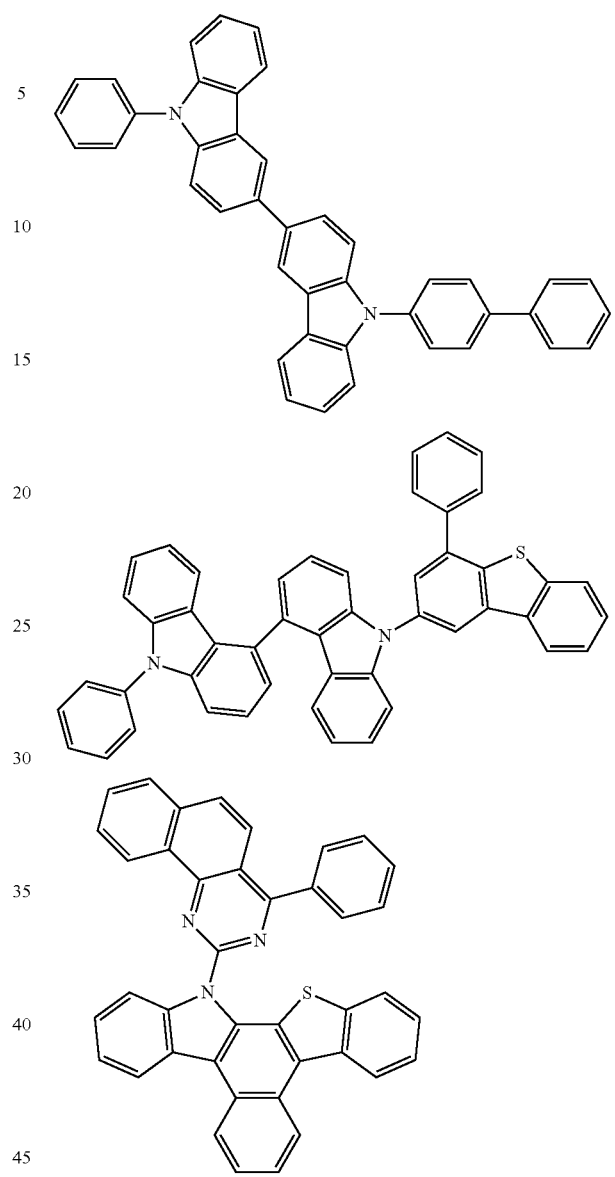
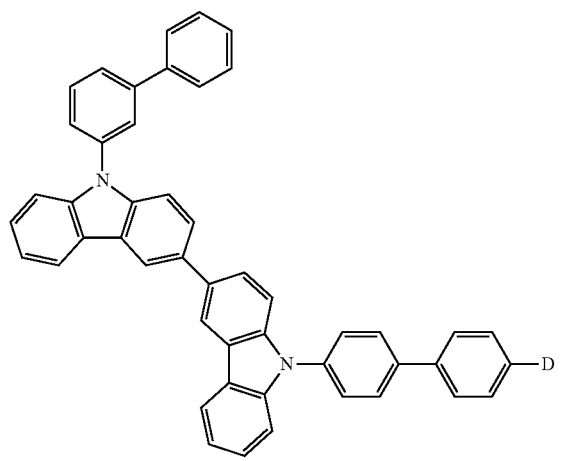
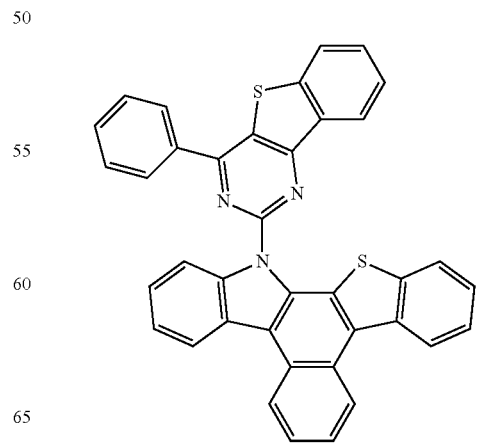

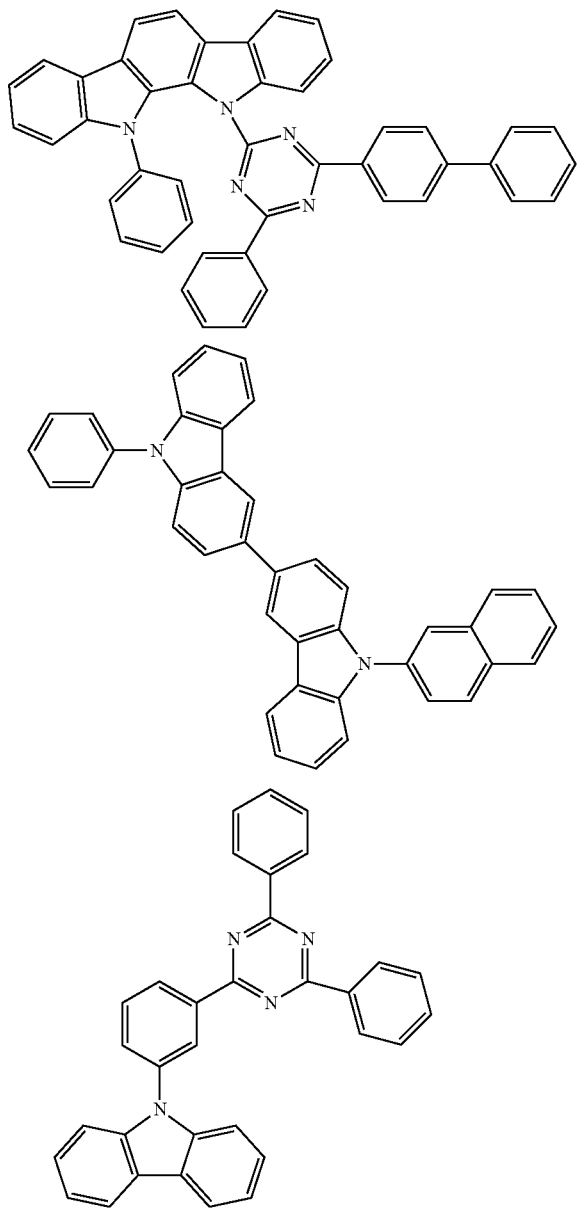

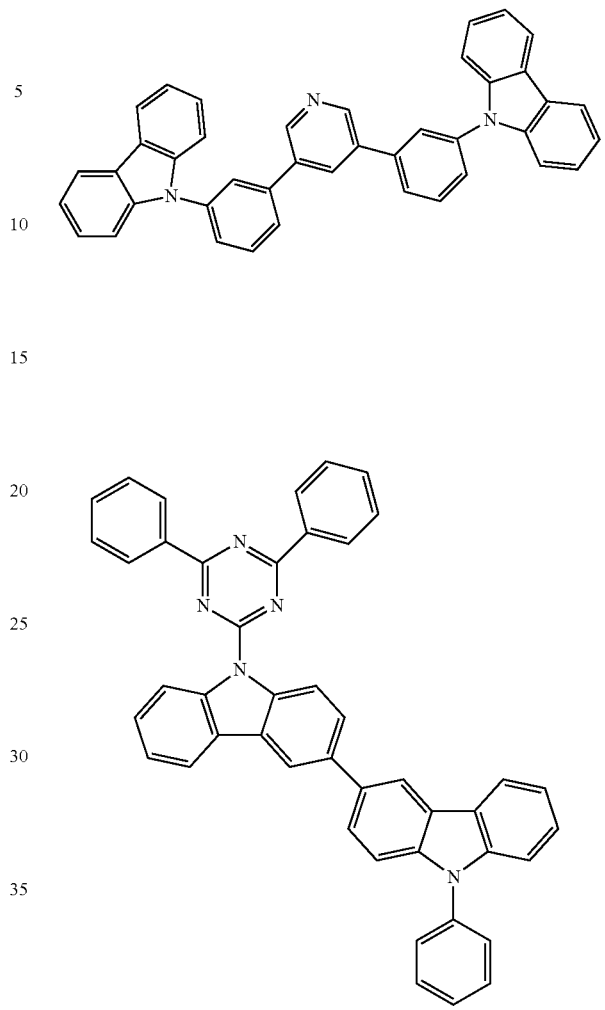

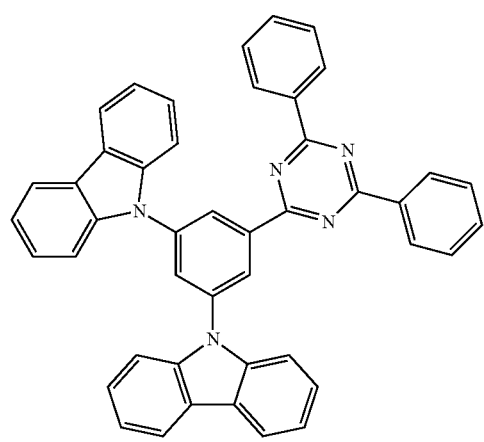

The emission layer EML may further include a material generally utilized in the art as a host material. For example, the emission layer EML may include, as a host material, at least one selected from among bis[2-(diphenylphosphino)phenyl]ether oxide (DPEPO), 4,4'-bis(N-carbazolyl)-1,1'-biphenyl (CBP), 1,3-bis(carbazolyl-9-yl)benzene (mCP), 2,8-bis(diphenylphosphoryl)dibenzofuran (PPF), 4,4',4"-bis(carbazol-9-yl)-triphenylamine (TCTA), and/or 1,3,5-tris(1-phenyl-1H-benzo[d]imidazol-2-yl) benzene (TPBi). However, embodiments of the present disclosure are not limited thereto, and for example, tis(8-hydroxyquinolino)aluminum (Alq$_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tis (carbazol sol-9-yl) triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), etc. may be utilized as a host material.

In an embodiment, the emission layer EML may further include a compound represented by Formula M-a or Formula M-b below. The compound represented by Formula M-a or Formula M-b below may be utilized as a phosphorescent dopant material.

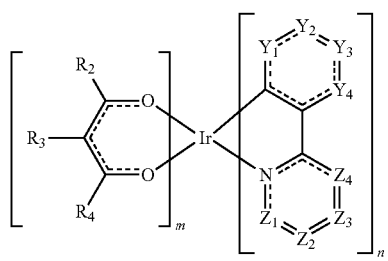

Formula M-a

In Formula M-a above, $Y_1$ to $Y_4$, and $Z_1$ to $Z_4$ may be each independently $CR_1$ or N, and $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring. In Formula M-a, m is 0 or 1, and n is 2 or 3. In Formula M-a, when m is 0, n is 3, and when m is 1, n is 2.

The compound represented by Formula M-a may be utilized as a red phosphorescent dopant or a green phosphorescent dopant.

The compound represented by Formula M-a may be represented by any one of the compounds M-a1 to M-a19 below. However, the compounds M-a1 to M-a19 below are presented as examples, and the compound represented by Formula M-a is not limited to those represented by the compounds M-a1 to M-a19 below.

M-a1

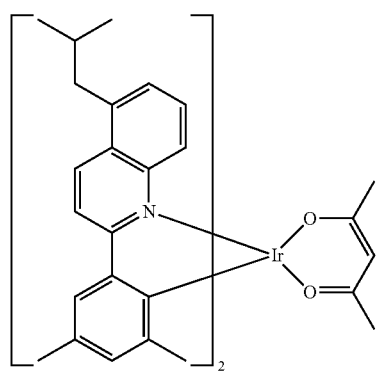

M-a2

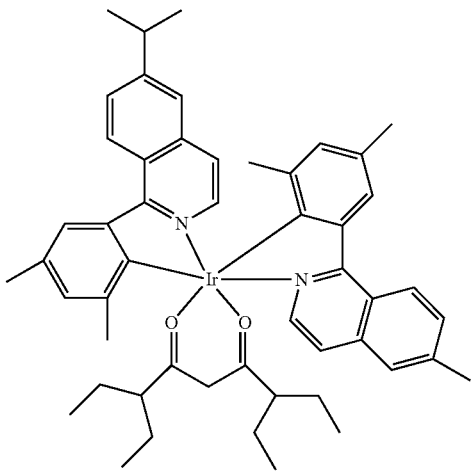

M-a3

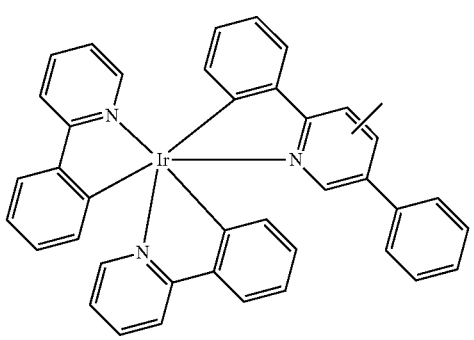

M-a4

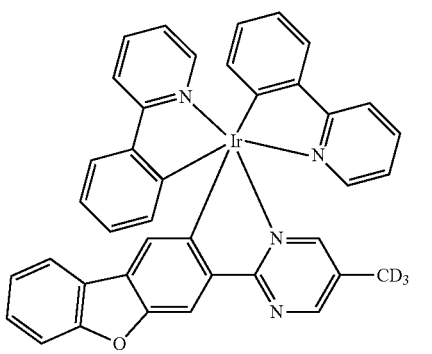

M-a5

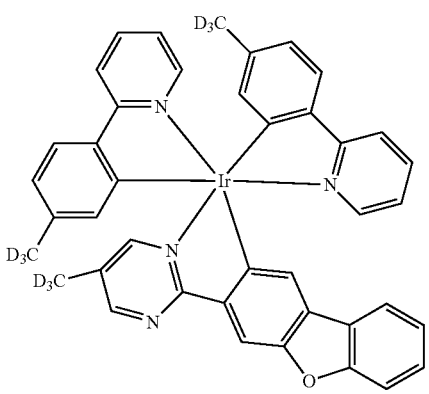

M-a6 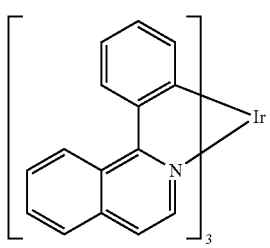
M-a7 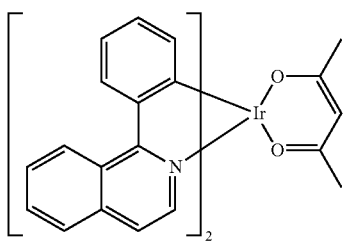
M-a8 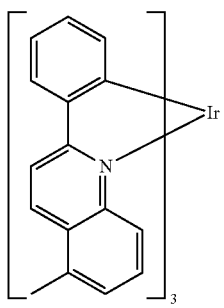
M-a9 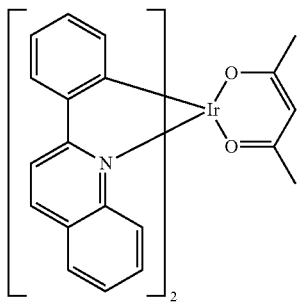
M-a10 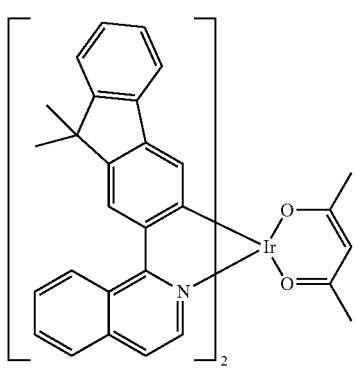
M-a11 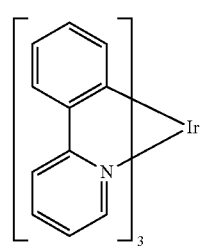
M-a12 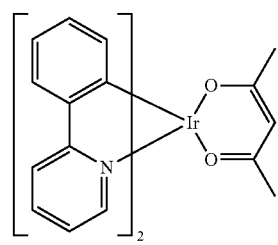
M-a13 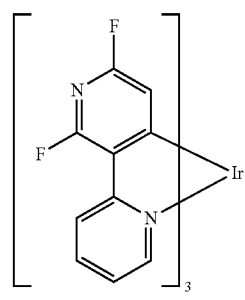
M-a14 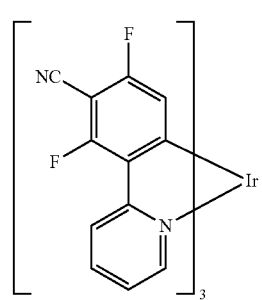
M-a15 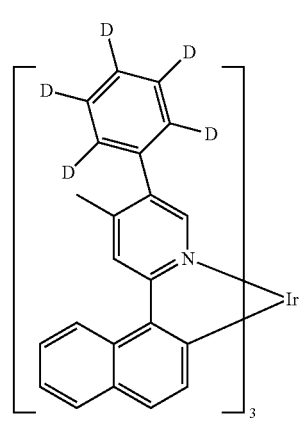

M-a16

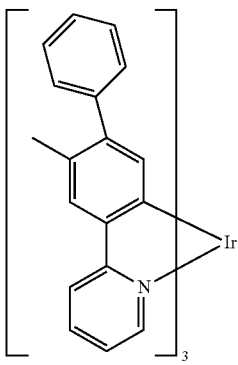

M-a17

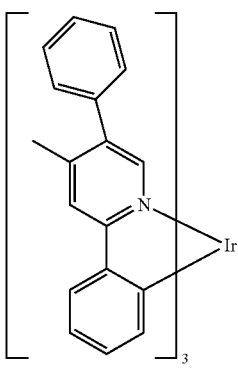

M-a18

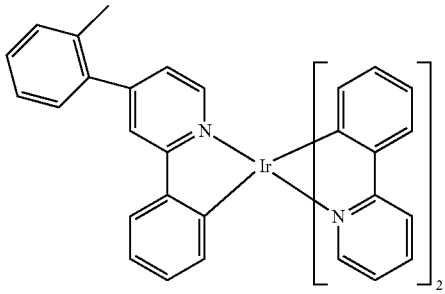

M-a19

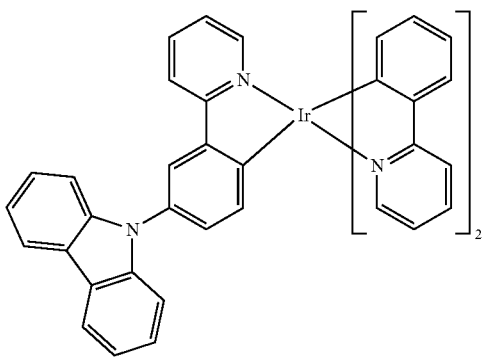

Compound M-a1 and compound M-a2 may be utilized as a red dopant material, and compounds M-a3 to M-a5 may be utilized as a green dopant material.

Formula M-b

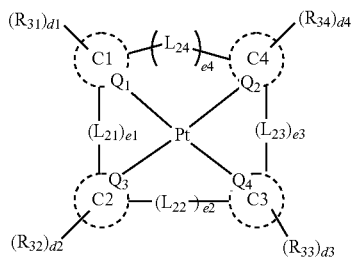

In Formula M-b, $Q_1$ to $Q_4$ are each independently C or N, and C1 to C4 are each independently a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ are each independently a direct linkage,

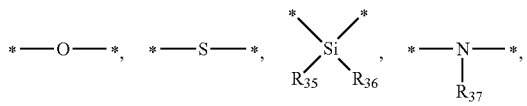

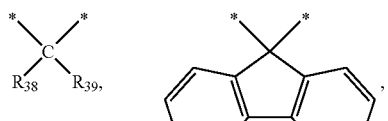

substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 are each independently 0 or 1. $R_{31}$ to $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, and d1 to d4 are each independently an integer of 0 to 4.

The compound represented by Formula M-b may be utilized as a blue phosphorescent dopant or a green phosphorescent dopant.

The compound represented by Formula M-b may be represented by any one of the compounds below. However, the compounds below are presented as examples, and the compound represented by Formula M-b is not limited to those represented by the compounds below.

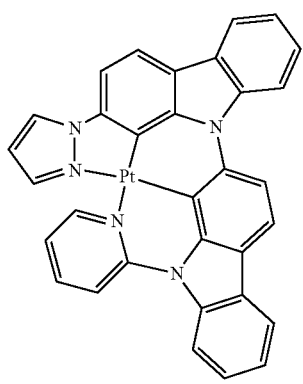
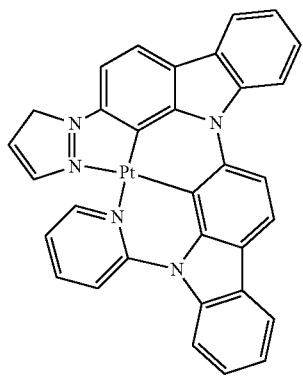
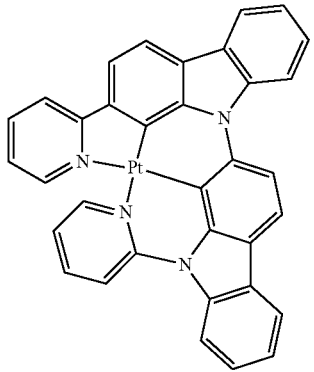
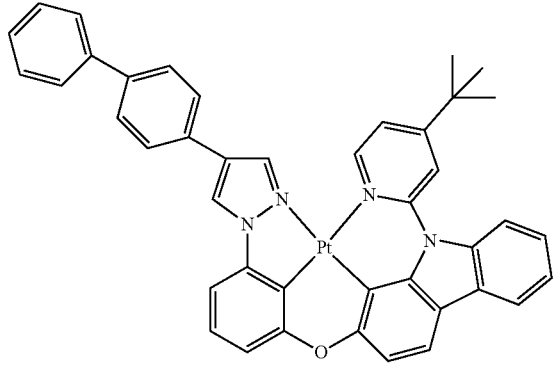
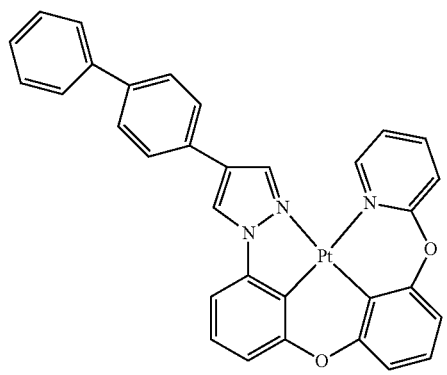
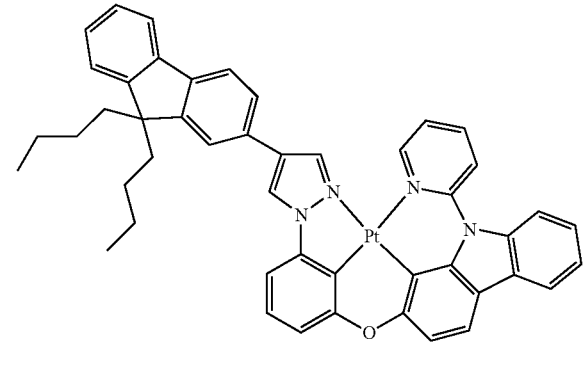
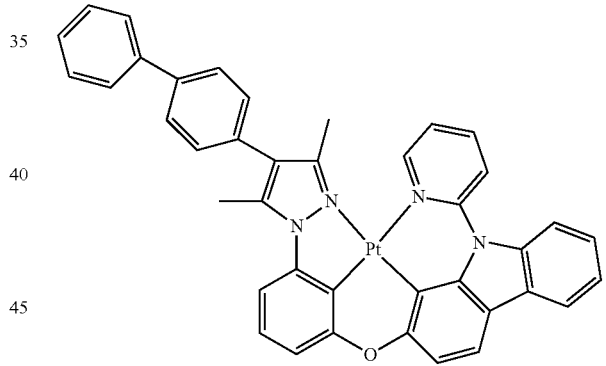
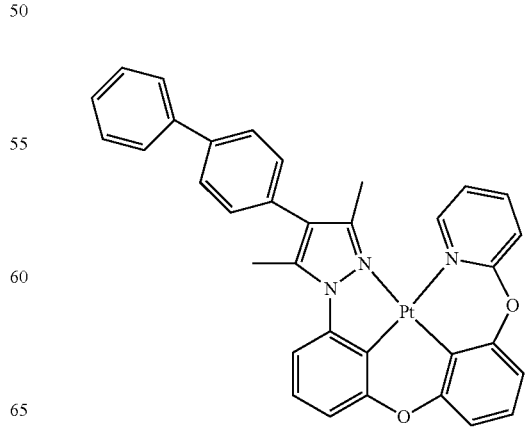

-continued

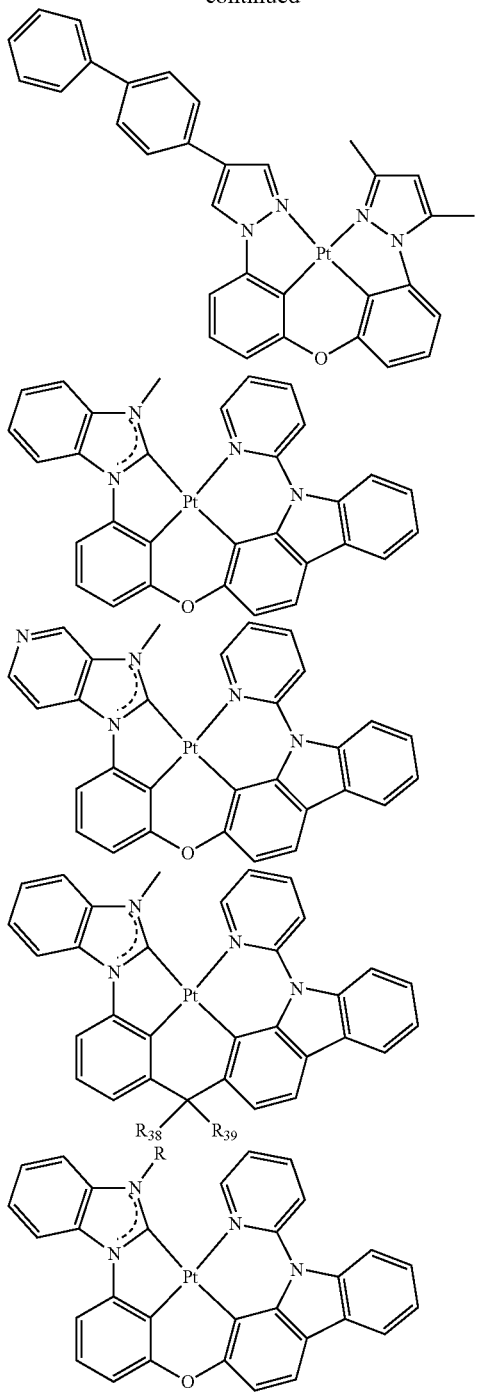

In the compounds above, R, $R_{38}$, and $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may further include a compound represented by any one of Formulas F-a to F-c below. The compound represented by Formulas F-a to F-c may be utilized as a fluorescent dopant material.

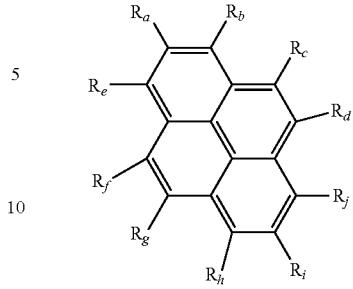

Formula F-a

In Formula F-a above, two selected among $R_a$ to $R_j$ may be each independently substituted with *—$NAr_1Ar_2$. The rest of $R_a$ to $R_j$ which are not substituted with *—$NAr_1Ar_2$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In *—$NAr_1Ar_2$, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

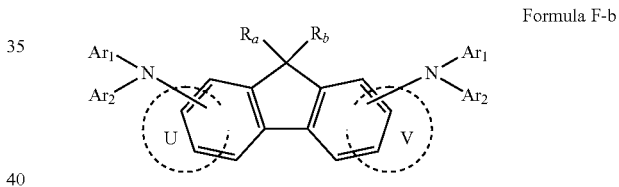

Formula F-b

In Formula F-b above, $R_a$ and $R_b$ may be each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

In Formula F-b, U and V may be each independently a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may be each independently 0 or 1. For example, In Formula F-b, when the number of U or V is 1, one ring indicated by U or V forms a condensed ring at the designated part with the fluorene core, and when the number of U or V is 0, it indicates that no ring indicated by U or V is present. For example, when the number of U is 0 and the number of V is 1, or when the number of U is 1 and the number of V is 0, a condensed ring having a fluorene core of Formula F-b may be a cyclic compound having four rings. In addition, when both the numbers of U and V are 0, the condensed ring of Formula F-b may be a cyclic compound having three rings. In addition, when both the numbers of U and V are 1, the condensed ring having a fluorene core of Formula F-b may be a cyclic compound having five rings.

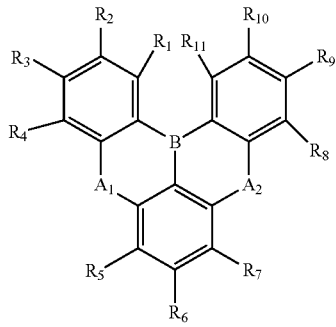

Formula F-c

In Formula F-c, $A_1$ and $A_2$ may be each independently O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ may be each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

In Formula F-c, $A_1$ and $A_2$ may each independently combine with substituents of neighboring rings to form a condensed ring. For example, when $A_1$ and $A_2$ are each independently $NR_m$, $A_1$ may be bonded to $R_4$ or $R_5$ to form a ring. In addition, and $A_2$ may be bonded to $R_7$ or $R_8$ to form a ring.

In an embodiment, the emission layer EML may further include, as a suitable (e.g., known) dopant material, styryl derivatives (e.g., 1,4-bis[2-(3-N-ethylcarbazoryl)vinyl]benzene (BCzVB), 4-(di-p-tolylamino)-4"-[(di-p-tolylamino) styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), perylene and derivatives thereof (e.g., 2,5,8,11-tetra-t-butylperylene (TBP)), pyrene and derivatives thereof (e.g., 1,1-dipyrene, 1,4-dipyrenylbenzene, 1,4-bis(N,N-diphenylamino)pyrene), etc.

The emission layer EML may further include a suitable (e.g., known) phosphorescent dopant material. For example, as a phosphorescent dopant, a metal complex including iridium (Ir), platinum (Pt), osmium (Os), gold (Au), titanium (Ti), zirconium (Zr), hafnium (Hf), europium (Eu), terbium (Tb), or thulium (Tm) may be utilized. For example, iridium (III) bis(4,6-difluorophenylpyridinato-N,C2')picolinate (FIrpic), bis(2,4-difluorophenylpyridinato)-tetrakis(1-pyrazolyl)borate iridium (III) (FIr6), platinum octaethyl porphyrin (PtOEP), etc. may be utilized as a phosphorescent dopant. However, embodiments of the present disclosure are not limited thereto.

In the organic electroluminescence device ED of an embodiment shown in FIGS. 3-6, the electron transport region ETR is provided on the emission layer EML. The electron transport region ETR may include at least one selected from among a hole blocking layer HBL, an electron transport layer ETL, and an electron injection layer EIL, but embodiments of the present disclosure are not limited thereto.

The electron transport region ETR may have a single layer formed of a single material, a single layer formed of a plurality of different materials, or a multilayer structure having a plurality of layers formed of a plurality of different materials.

For example, the electron transport region ETR may have a single layer structure of the electron injection layer EIL or the electron transport layer ETL, and may have a single layer structure formed of an electron injection material and an electron transport material. In addition, the electron transport region ETR may have a single layer structure formed of a plurality of different materials, or may have a structure in which an electron transport layer ETL/electron injection layer EIL, or a hole blocking layer HBL/electron transport layer ETL/electron injection layer EIL are stacked in the stated order from the emission layer EML, but the present disclosure is not limited thereto. The electron transport region ETR may have a thickness of, for example, about 1,000 Å to about 1,500 Å.

The electron transport region ETR may be formed utilizing various suitable methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below.

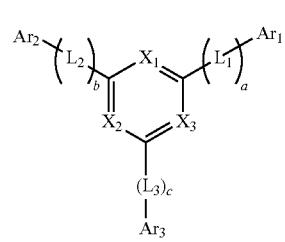

Formula ET-1

In Formula ET-1, at least one of $X_1$ to $X_3$ is N and the remainder (e.g., the rest) are $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may be each independently an integer of 0 to 10. In Formula ET-1, $L_1$ to $L_3$ may be each independently a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, when a to c are each an integer of 2 or greater, $L_1$ to $L_3$ may be each independently a substituted or unsubstituted arylene group having 6 to 30 ring-forming carbon atoms, or a substituted or unsubstituted heteroarylene group having 2 to 30 ring-forming carbon atoms.

The electron transport region ETR may further include an anthracene-based compound. However, embodiments of the present disclosure are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1, 10-phenanthroline (BCP), 4,7-diphenyl-1, 10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,08)-(1,1'-biphenyl-4-olato) aluminum (BAlq), berylliumbis(benzoquinolin-10-olate (Bebq2), 9,10-di(naphthalene-2-yl)anthracene (ADN), 1,3-bis[3,5-di(pyridin-3-yl)phenyl]benzene (BmPyPhB), or a mixture thereof.

In addition, the electron transport region ETR may further include one or more metal halides (e.g., halogenated metals) such as LiF, NaCl, CsF, RbCl, $R_{b1}$, CuI, and/or KI, lanthanide metals such as Yb, and/or one or more co-deposition materials of a metal halide (e.g., halogenated metal) and a lanthanide metal. For example, the electron transport region ETR may include KI:Yb, $R_{b1}$:Yb, etc., as the co-deposition material. In one or more embodiments, for the electron transport region ETR, a metal oxide such as $Li_2O$ and/or BaO, 8-hydroxyl-lithium quinolate (Liq), etc., may be utilized, but embodiments of the present disclosure are limited thereto. The electron transport region ETR may also be formed of a mixture material of an electron transport material and an insulating organo-metal salt. The organo-metal salt may be a material having an energy band gap of about 4 eV or greater. For example, the organo-metal salt may include one or more metal acetates, metal benzoates, metal acetoacetates, metal acetylacetonates, and/or metal stearates.

The electron transport region ETR may include the compounds of the electron transport region described above in at least one selected from among the electron injection layer EIL, the electron transport layer ETL, and the hole blocking layer HBL.

When the electron transport region ETR includes the electron transport layer ETL, the electron transport layer ETL may have a thickness of about 100 Å to about 1,000 Å, for example, about 150 Å to about 500 Å. When the thickness of the electron transport layer ETL satisfies the above-described ranges, satisfactory electron transport properties may be obtained without a substantial increase in driving voltage. When the electron transport region ETR includes the electron injection layer EIL, the electron injection layer EIL may have a thickness of about 1 Å to about 100 Å, or about 3 Å to about 90 Å. When the thickness of the electron injection layer EIL satisfies the above-described ranges, satisfactory electron injection properties may be obtained without a substantial increase in driving voltage.

The second electrode EL2 is provided on the electron transport region ETR. The second electrode EL2 may be a common electrode. The second electrode EL2 may be a cathode or an anode, but embodiments of the present disclosure are not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, and/or MgAg). In an embodiment, the second electrode EL2 may have a multi-layer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL2 may include the above-described metal materials, a combination of two or more metal materials selected from the above-described metal materials, and/or oxides of the above-described metal materials.

In some embodiments, the second electrode EL2 may be connected with an auxiliary electrode. When the second electrode EL2 is connected with the auxiliary electrode, the resistance of the second electrode EL2 may decrease.

In one or more embodiments, a capping layer CPL may be further disposed on the second electrode EL2 of the organic electroluminescence device ED according to an embodiment. The capping layer CPL may include a single layer or a multilayer.

In an embodiment, the capping layer CPL may be an organic layer or an inorganic layer. For example, when the capping layer CPL includes an inorganic material, the inorganic material may include an alkali metal compound such as LiF, an alkaline earth metal compound such as $MgF_2$, SiON, SiNx, SiOy, etc.

For example, when the capping layer CPL includes an organic material, the organic material may include α-NPD, NPB, TPD, m-MTDATA, $Alq_3$, CuPc, N4,N4,N4',N4'-tetra (biphenyl-4-yl) biphenyl-4,4'-diamine (TPD15), 4,4',4"-tris (carbazol sol-9-yl)tiphenylamine (TCTA), etc., or may include epoxy resins or acrylates such as methacrylates. However, embodiments of the present disclosure are not limited thereto, and compounds P1 to P5 below may also be included.

P1

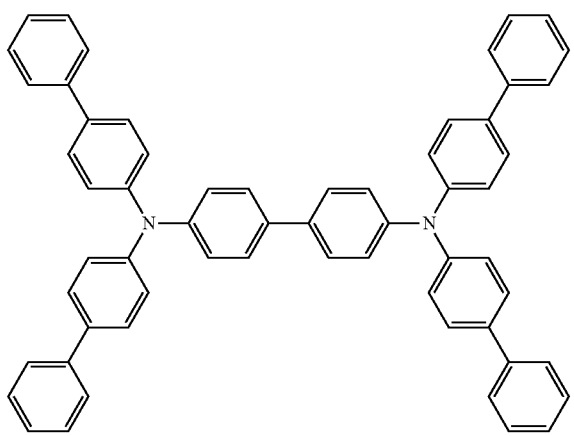

P2

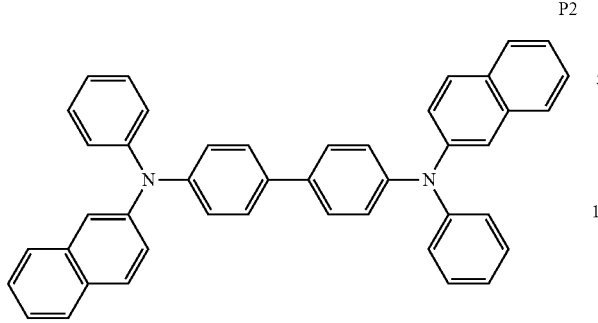

P5

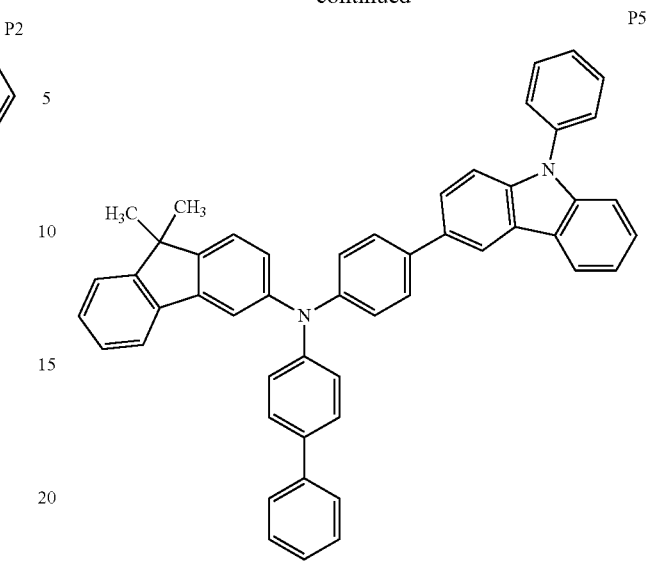

P3

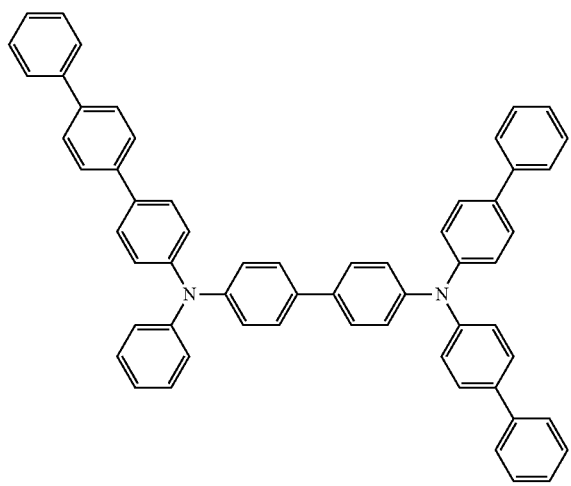

P4

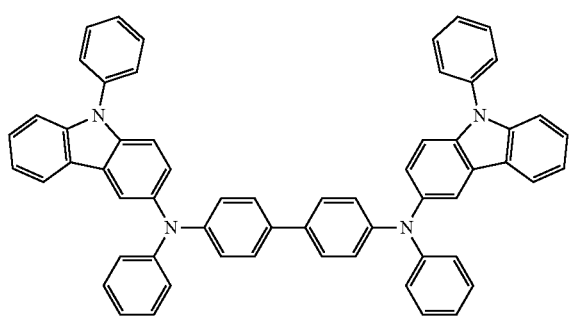

In one or more embodiments, the capping layer CPL may have a refractive index of about 1.6 or greater. For example, the capping layer CPL may have a refractive index of about 1.6 or greater in a wavelength range of about 550 nm to about 660 nm.

Figure 8:
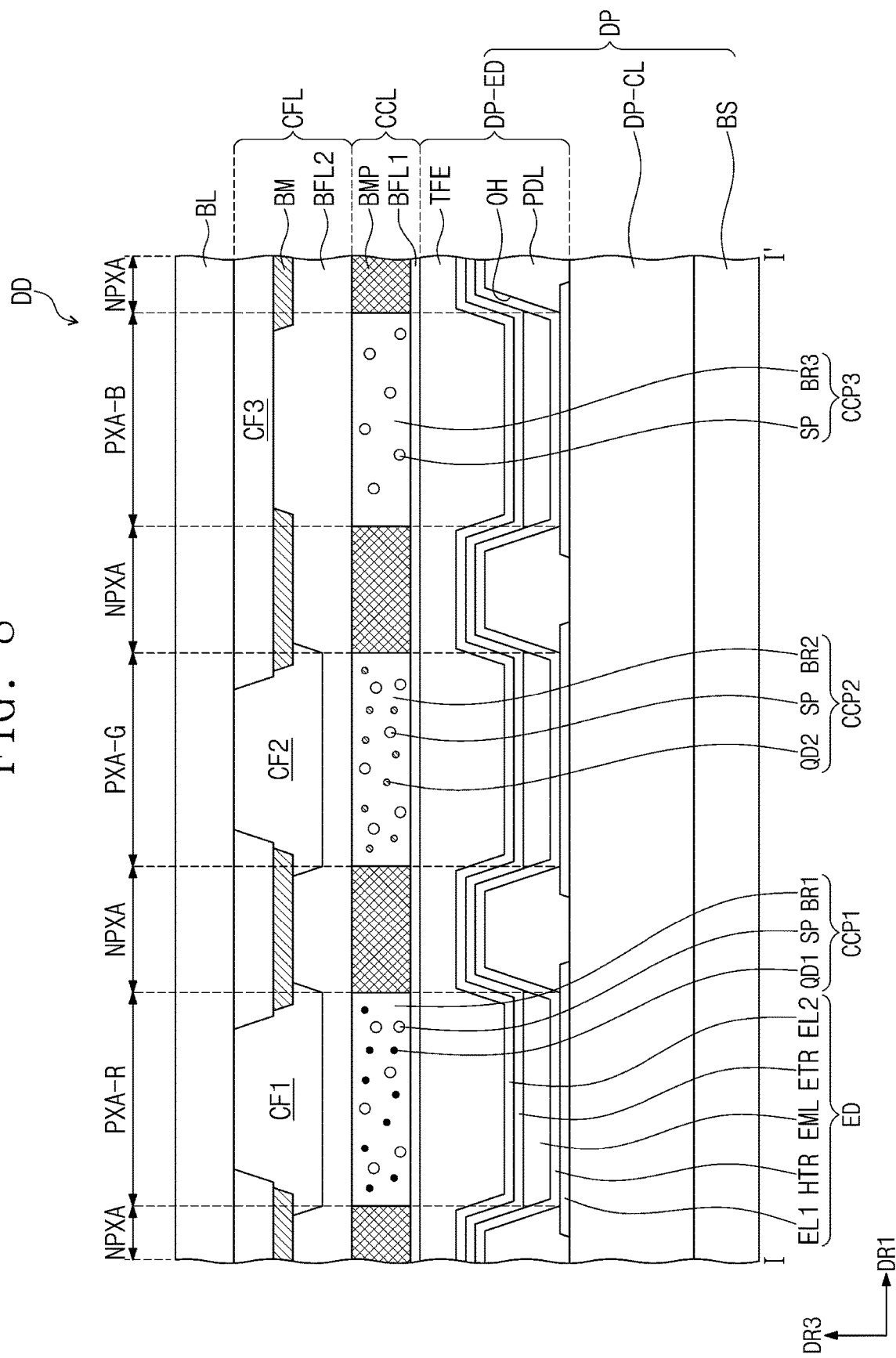
FIG. 8 is a cross-sectional view of a display device according to an embodiment of the present disclosure.
Figure 9:
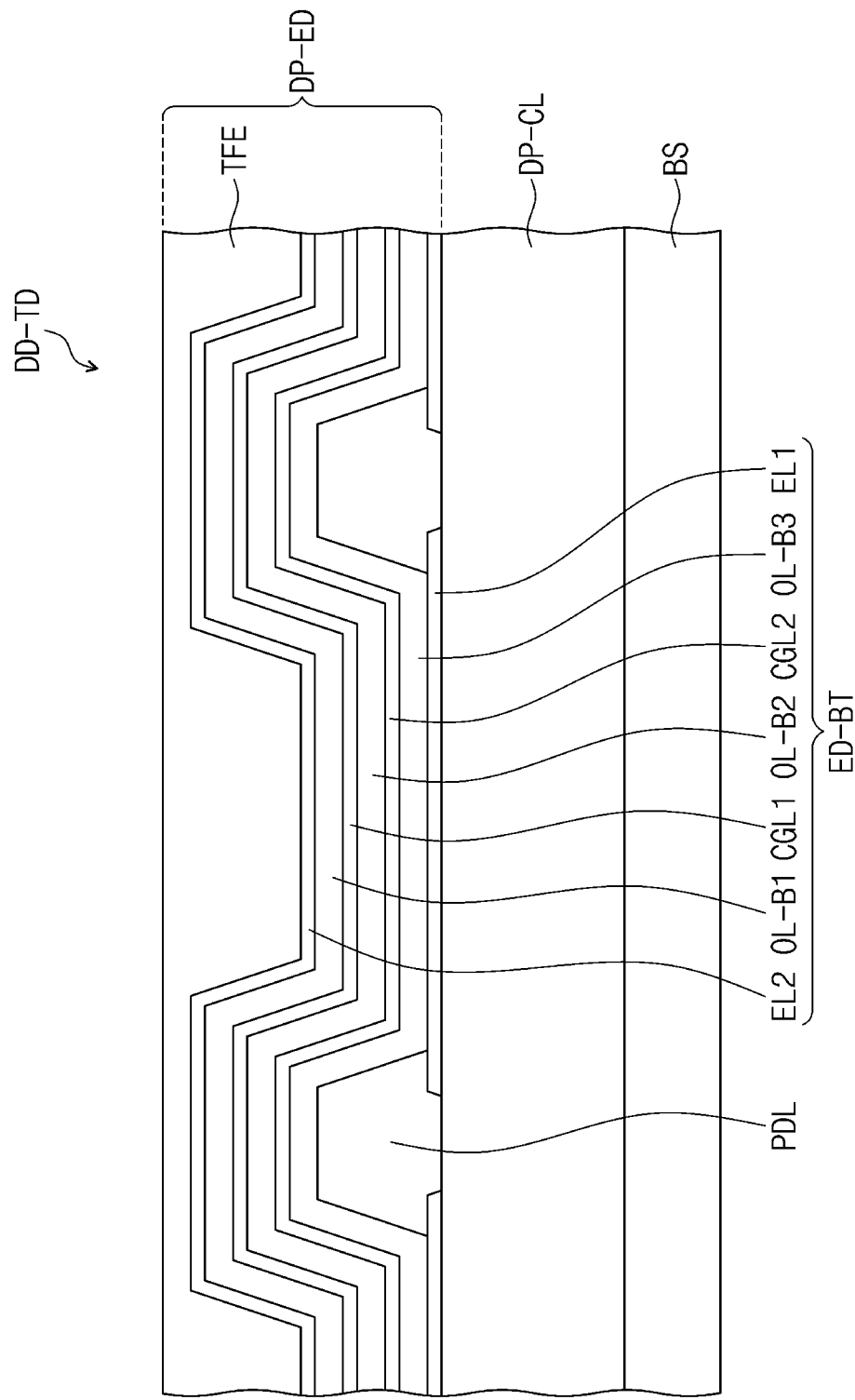
FIG. 9 is a cross-sectional view of a display device according to an embodiment of the present disclosure.

FIGS. 8 and 9 each are cross-sectional views of a display device according to an embodiment. Hereinafter, in the description of a display device according to an embodiment with reference to FIGS. 8 and 9, content overlapping with the one described above with reference to FIGS. 1 to 6 will not be described again, and the differences will be mainly described.

Referring to FIG. 8, the display device DD according to an embodiment may include a display panel DP having a display element layer DP-ED, a light control layer CCL disposed on the display panel DP, and a color filter layer CFL.

In an embodiment illustrated in FIG. 8, the display panel DP may include a base layer BS, a circuit layer DP-CL provided on the base layer BS, and a display element layer DP-ED, and the element layer DP-ED may include an organic electroluminescence device ED.

The organic electroluminescence device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. In one or more embodiments, a structure of the organic electroluminescence device ED shown in FIG. 8 may be the same as the structure of the organic electroluminescence device of FIGS. 4 to 6 described above.

Referring to FIG. 8, the emission layer EML may be disposed in the opening OH defined in the pixel defining film PDL. For example, the emission layer EML divided by the pixel defining film PDL and provided corresponding to each light emitting areas PXA-R, PXA-G, and PXA-B may emit light of the same wavelength range. In the display device DD of an embodiment, the emission layer EML may emit blue light. In one or more embodiments, different from the one illustrated, the emission layer EML may be provided as a common layer throughout the light emitting areas PXA-R, PXA-G, and PXA-B.

The light control layer CCL may be disposed on the display panel DP. The light control layer CCL may include a photoconverter. The photoconverter may be a quantum dot or a fluorescent substance. The photoconverter may convert the wavelength of received light and emit the resulting light. In some embodiments, the light control layer CCL may be a layer containing quantum dots or fluorescent substances.

The light control layer CCL may include a plurality of light control units CCP1, CCP2, and CCP3. The light control units CCP1, CCP2, and CCP3 may be spaced apart from each other.

Referring to FIG. 8, a division pattern BMP may be disposed between the light control units CCP1, CCP2, and CCP3 spaced apart from each other, but embodiments of the present disclosure are not limited thereto. In FIG. 8, the division pattern BMP is shown to non-overlap the light control units CCP1, CCP2, and CCP3, but edges of the light control units CCP1, CCP2, and CCP3 may overlap at least a portion of the division pattern BMP.

The light control layer CCL may include a first light control unit CCP1 including a first quantum dot QD1 for converting a first color light provided from the organic electroluminescence device ED into a second color light, a second light control unit CCP2 including a second quantum dot QD2 for converting the first color light into a third color light, and a third light control unit CCP3 transmitting the first color light.

In an embodiment, the first light control unit CCP1 may provide red light, which is the second color light, and the second light control unit CCP2 may provide green light, which is the third color light. The third light control unit CCP3 may transmit and provide blue light, which is the first color light provided from the organic electroluminescence device ED. For example, the first quantum dot QD1 may be a red quantum dot and the second quantum dot QD2 may be a green quantum dot. The emission layer EML may include a quantum dot material. The core of the quantum may be selected from a Group II-VI compound, a Group III-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and/or $In_2Se_3$, a ternary compound such as $InGaS_3$ and/or $InGaSe_3$, or any combination thereof.

The Group I-III-VI compound may include a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, and any mixture thereof; and/or a quaternary compound such as $AgInGaS_2$ and/or $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. In one or more embodiments, the Group III-V compound may further include a Group II metal. For example, InZnP, etc., may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In this case, the binary compound, the ternary compound, and/or the quaternary compound may be present in a particle in a uniform concentration distribution, or may be present in the same particle in a partially different concentration distribution. In addition, a core/shell structure in which one quantum dot surrounds another quantum dot may be present. An interface between the core and the shell may have a concentration gradient in which the concentration of an element present in the shell becomes lower toward the center of the core.

In some embodiments, the quantum dot may have the core/shell structure including a core including nano-crystals, and a shell surrounding the core, which are described above. The shell of the quantum dot may serve as a protection layer to prevent or substantially prevent the chemical deformation of the core so as to maintain semiconductor properties, and/or as a charging layer to impart electrophoresis properties to the quantum dot. The shell may be a single layer or multiple layers. An interface between the core and the shell may have a concentration gradient in which the concentration of an element present in the shell becomes lower toward the center of the core. Examples of the shell of the quantum dot may be a metal oxide or a non-metal oxide, a semiconductor compound, or a combination thereof.

For example, the metal or non-metal oxide may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and/or $NiO$; and/or a ternary compound such as $MgAl_2O_4$, $CoFe_2O_4$, $NiFe_2O_4$, and/or $CoMn_2O_4$, but embodiments of the present disclosure are not limited thereto.

In addition, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments of the present disclosure are not limited thereto.

The quantum dot may have a full width at half maximum (FWHM) of a light emission wavelength spectrum of about 45 nm or less, for example, about 40 nm or less, or about 30 nm or less, and color purity or color reproducibility may be enhanced in the above ranges. In addition, light emitted through such a quantum dot is emitted in all directions, and thus a wide viewing angle may be obtained (e.g., improved).

In addition, the form of the quantum dot is not particularly limited as long as it is a form commonly utilized in the art, and for example, a quantum dot in the form of spherical, pyramidal, multi-arm, and/or cubic nanoparticles, nanotubes, nanowires, nanofibers, nanoplate particles, etc., may be utilized.

The quantum dot may control colors of emitted light according to the particle size thereof, and thus the quantum dot may have various suitable light emission colors such as blue, red, green, etc.

In addition, the light control layer CCL may further include a scatterer SP (e.g., a light scatterer SP). The first light control unit CCP1 may include the first quantum dot QD1 and the scatterer SP, the second light control unit CCP2 may include the second quantum dot QD2 and the scatterer SP, and the third light control unit CCP3 may not include a quantum dot but may include the scatterer SP.

The scatterer SP may be an inorganic particle. For example, the scatterer SP may include at least one selected from among $TiO_2$, ZnO, $Al_2O_3$, $SiO_2$, and hollow silica. The scatterer SP may include any one selected from among $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The first light control unit CCP1, the second light control unit CCP2, and the third light control unit CCP3 may include base resins $BR_1$, $BR_2$, and $BR_3$ respectively for dispersing the quantum dots QD1 and QD2 and the scatterer SP. In an embodiment, the first light control unit CCP1 may include the first quantum dot QD1 and the scatterer SP dispersed in the first base resin $BR_1$, the second light control unit CCP2 may include the second quantum dot QD2 and the scatterer SP dispersed in the second base resin $BR_2$, and the third light control unit CCP3 may include the scatterer SP dispersed in the third base resin $BR_3$. The base resins $BR_1$, $BR_2$, and $BR_3$ are a medium in which the quantum dots QD1 and QD2 and the scatterer SP are dispersed, and may be formed of various suitable resin compositions, which may be generally referred to as a binder. For example, the base resins $BR_1$, $BR_2$, and $BR_3$ may be an acrylic-based resin, a urethane-based resin, a silicone-based resin, an epoxy-based resin, etc. The base resins $BR_1$, $BR_2$, and $BR_3$ may be a transparent resin. In an embodiment, the first base resin $BR_1$, the second base resin $BR_2$, and the third base resin $BR_3$ may each be the same as or different from each other.

The light control layer CCL may include a barrier layer BFL1. The barrier layer BFL1 may serve to prevent or substantially prevent moisture and/or oxygen (hereinafter referred to as "moisture/oxygen") from being introduced. The barrier layer BFL1 may be disposed on the light control units CCP1, CCP2, and CCP3 to prevent or substantially prevent the light control units CCP1, CCP2, and CCP3 from being exposed to moisture/oxygen. In one or more embodiments, the barrier layer BFL1 may cover the light control units CCP1, CCP2, and CCP3. In addition, a barrier layer BFL2 may be provided between the light control units CCP1, CCP2, and CCP3 and the color filter layer CFL.

The barrier layers BFL1 and BFL2 may include at least one inorganic layer. That is, the barrier layers BFL1 and BFL2 may be formed of an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide and/or silicon oxynitride, a metal thin film in which light transmittance is secured, etc. In some embodiments, the barrier layers BFL1 and BFL2 may further include an organic film. The barrier layers BFL1 and BFL2 may be formed of a single layer or a plurality of layers.

In the display device DD of an embodiment, the color filter layer CFL may be disposed on the light control layer CCL. For example, the color filter layer CFL may be directly disposed on the light control layer CCL. In this case, the barrier layer BFL2 may be omitted.

The color filter layer CFL may include a light blocking unit BM and filters CF-B, CF-G, and CF-R. That is, the color filter layer CFL may include a first filter CF1 configured to transmit the second color light, a second filter CF2 configured to transmit the third color light, and a third filter CF3 configured to transmit the first color light. For example, the first filter CF1 may be a red filter, the second filter CF2 may be a green filter, and the third filter CF3 may be a blue filter. The filters CF1, CF2, and CF3 may include a polymer photosensitive resin, a pigment and/or a dye. The first filter CF1 may include a red pigment and/or a red dye, the second filter CF2 may include a green pigment and/or a green dye, and the third filter CF3 may include a blue pigment and/or a blue dye. Here, the present disclosure is not limited thereto, and the third filter CF3 may not include a pigment or a dye. The third filter CF3 may include a polymer photosensitive resin, but not include a pigment or a dye. The third filter CF3 may be transparent. The third filter CF3 may be formed of a transparent photosensitive resin.

In addition, in an embodiment, the first filter CF1 and the second filter CF2 may be yellow filters. The first filter CF1 and the second filter CF2 may not be separated from each other and may be provided as a single body.

The light blocking unit BM may be a black matrix. The light blocking unit BM may be formed including an organic light blocking material and/or an inorganic light blocking material, both including a black pigment and/or a black dye. The light blocking unit BM may prevent or reduce light leakage, and separate boundaries between the adjacent filters CF1, CF2, and CF3. In addition, in an embodiment, the light blocking unit BM may be formed of a blue filter.

The first to third filters CF1, CF2, and CF3 may each be disposed corresponding to each of the red light emitting area PXA-R, the green light emitting area PXA-G, and the blue light emitting area PXA-B.

The base substrate BL may be disposed on the color filter layer CFL. The base substrate BL may be a member providing a base surface on which the color filter layer CFL and the light control layer CCL are disposed. The base substrate BL may be a glass substrate, a metal substrate, a plastic substrate, etc. However, embodiments of the present disclosure are not limited thereto, and the base substrate BL may be an inorganic layer, an organic layer, or a composite material layer. In addition, different from the one shown, the base substrate BL may be omitted in an embodiment.

FIG. 9 is a cross-sectional view showing a portion of a display device according to an embodiment. FIG. 9 illustrates a cross-sectional view of a portion corresponding to the display panel DP of FIG. 8. In a display device DD-TD of an embodiment, an organic electroluminescence device ED-BT may include a plurality of light emitting structures OL-B1, OL-B2, and OL-B3. The organic electroluminescence device ED-BT may include the first electrode EL1 and the second electrode EL2 facing each other, and the plurality of light emitting structures OL-B1, OL-B2, and OL-B3 sequentially stacked in a thickness direction between the first electrode EL1 and the second electrode EL2. The light emitting structures OL-B1, OL-B2, and OL-B3 may each include the emission layer EML (FIG. 8), and a hole transport region HTR and an electron transport region ETR with the emission layer EML (FIG. 8) disposed (e.g., interposed) therebetween.

That is, the organic electroluminescence device ED-BT included in the display device DD-TD according to an embodiment may be an organic electroluminescence device having a tandem structure including a plurality of emission layers.

In an embodiment illustrated in FIG. 9, light emitted from each of the light emitting structures OL-B1, OL-B2, and OL-B3 may all be blue light. However, embodiments of the present disclosure are not limited thereto, and wavelength ranges of light emitted from each of the light emitting structures OL-B1, OL-B2, and OL-B3 may be different from each other. For example, the organic electroluminescence device ED-BT (including the plurality of light emitting structures OL-B1, OL-B2, and OL-B3 emitting light of different wavelength ranges) may emit white light.

A charge generation layer CGL1 and CGL2 may be disposed between neighboring light emitting structures OL-B1, OL-B2, and OL-B3. The charge generation layer CGL1 and CGL2 may include a p-type charge generation layer and/or an n-type charge generation layer.

Hereinafter, embodiments of the present disclosure will be described in more detail through specific Examples and Comparative Examples. Examples shown below are illustrated only for the understanding of the present disclosure, and the scope of the present disclosure is not limited thereto.

SYNTHESIS EXAMPLES

Polycyclic compounds according to an embodiment of the present disclosure may be synthesized, for example, as follows. However, a process of the synthesizing of polycyclic compounds according to an embodiment of the present disclosure is not limited to thereto.

1. Synthesis of Compound HT-08

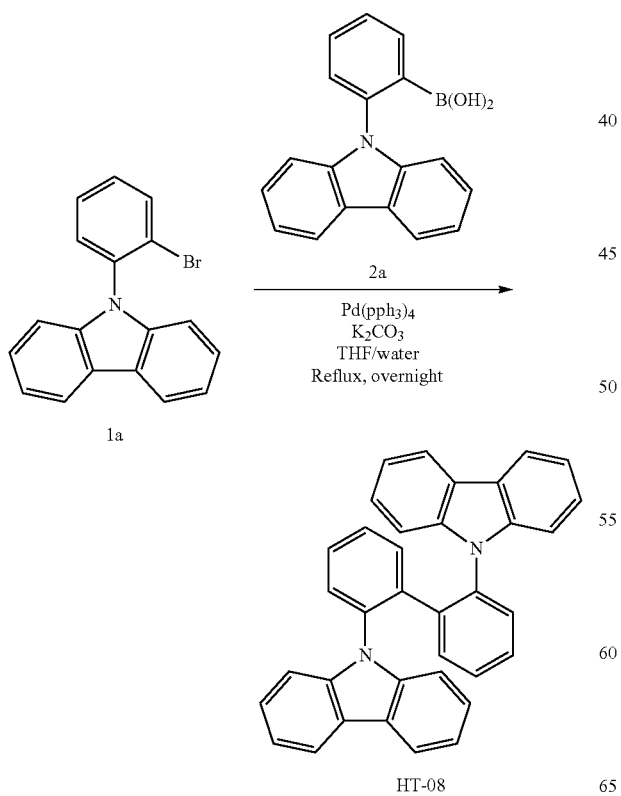

Compounds 1a (15.5 mmol, 5.00 g) and 2a (15.5 mmol, 4.45 g) were added to a flask, and THF was added thereto. A $K_2CO_3$ aqueous solution (0.3 M) and $Pd(PPh_3)_4$ subjected to nitrogen bubbling for 10 minutes or more were added thereto, and the mixture was stirred at 80° C. for 20 hours. The obtained residue was purified utilizing silica gel chromatography and recrystallized with a mixed solvent of chloroform and hexane to obtain Compound HT-08 (6.38 g, 85%).

2. Synthesis of Compound ET-04

Synthesis of Intermediate 5b

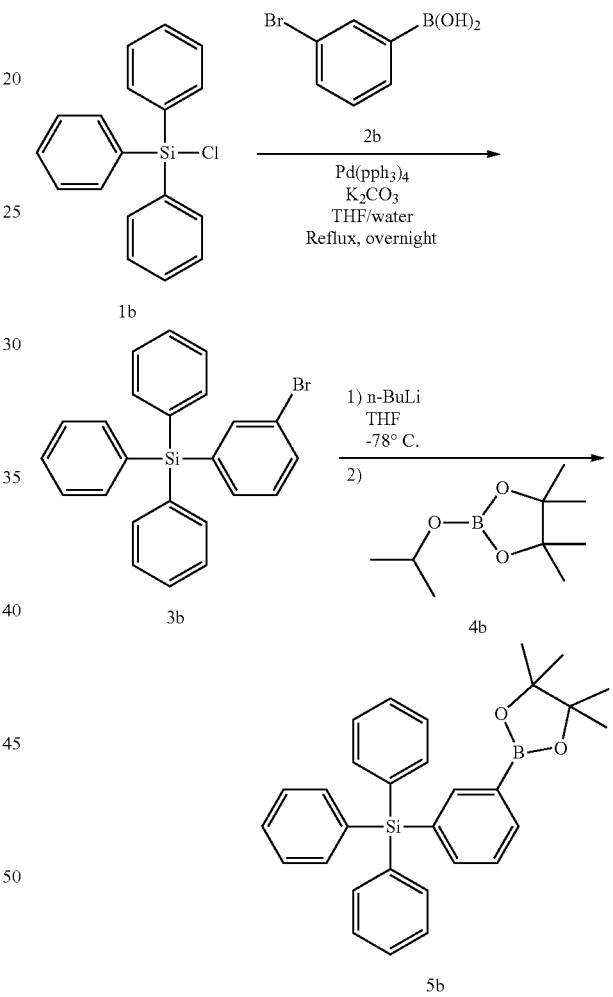

Compounds 1b (17.0 mmol, 5.00 g) and 2a (17.0 mmol, 3.41 g) were added to a flask, and THF was added thereto. A $K_2CO_3$ aqueous solution (0.3 M) and $Pd(PPh_3)_4$ subjected to nitrogen bubbling for 10 minutes or more were added thereto, and the mixture was stirred at 80° C. for 20 hours. The obtained residue was purified utilizing silica gel chromatography and recrystallized with a mixed solvent of chloroform and hexane to obtain Compound 3b (5.08 g, 72%). n-BuLi was slowly added thereto at −78° C., and then Compound 4b (2.27 g, 12.2 mmol) was added thereto and stirred sufficiently to obtain Intermediate 5b (3.94 g, 71%).

Synthesis of Compound ET-04

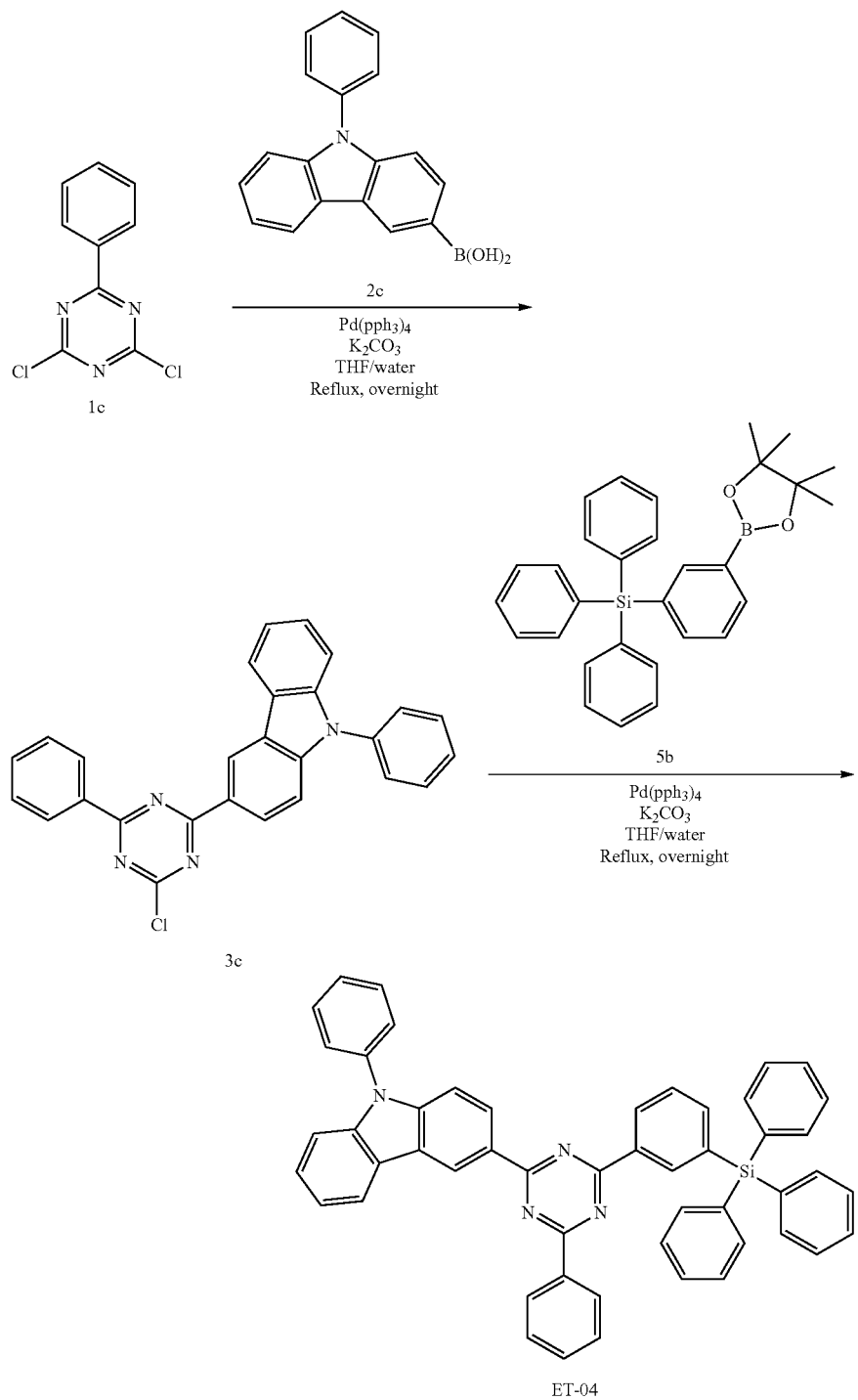

Compounds 1c (5.00 g, 22.1 mmol) and 2c (7.61 g, 26.5 mmol) were added to a flask, and THF was added thereto. A K₂CO₃ aqueous solution (0.3 M) and Pd(PPh₃)₄ subjected to nitrogen bubbling for 10 minutes or more were added thereto, and the mixture was stirred at 80° C. for 20 hours. The obtained residue was purified utilizing silica gel chromatography and recrystallized with a mixed solvent of chloroform and hexane to obtain a solid Compound 3c (7.27 g, 76%). The obtained Intermediate 5b (7.27 g, 16.8 mmol) and Compound 3c (8.97 g, 19.4 mmol) were added to a flask, and THF was added thereto. A K₂CO₃ aqueous solution (0.3 M) and Pd(PPh₃)₄ subjected to nitrogen bubbling for 10 minutes or more were added thereto, and the mixture was stirred at 80° C. for 20 hours. The obtained residue was purified utilizing silica gel chromatography and recrystallized with a mixed solvent of chloroform and hexane to obtain Compound ET-04 (11.8 g, 83%).

3. Synthesis of Compound DA-09

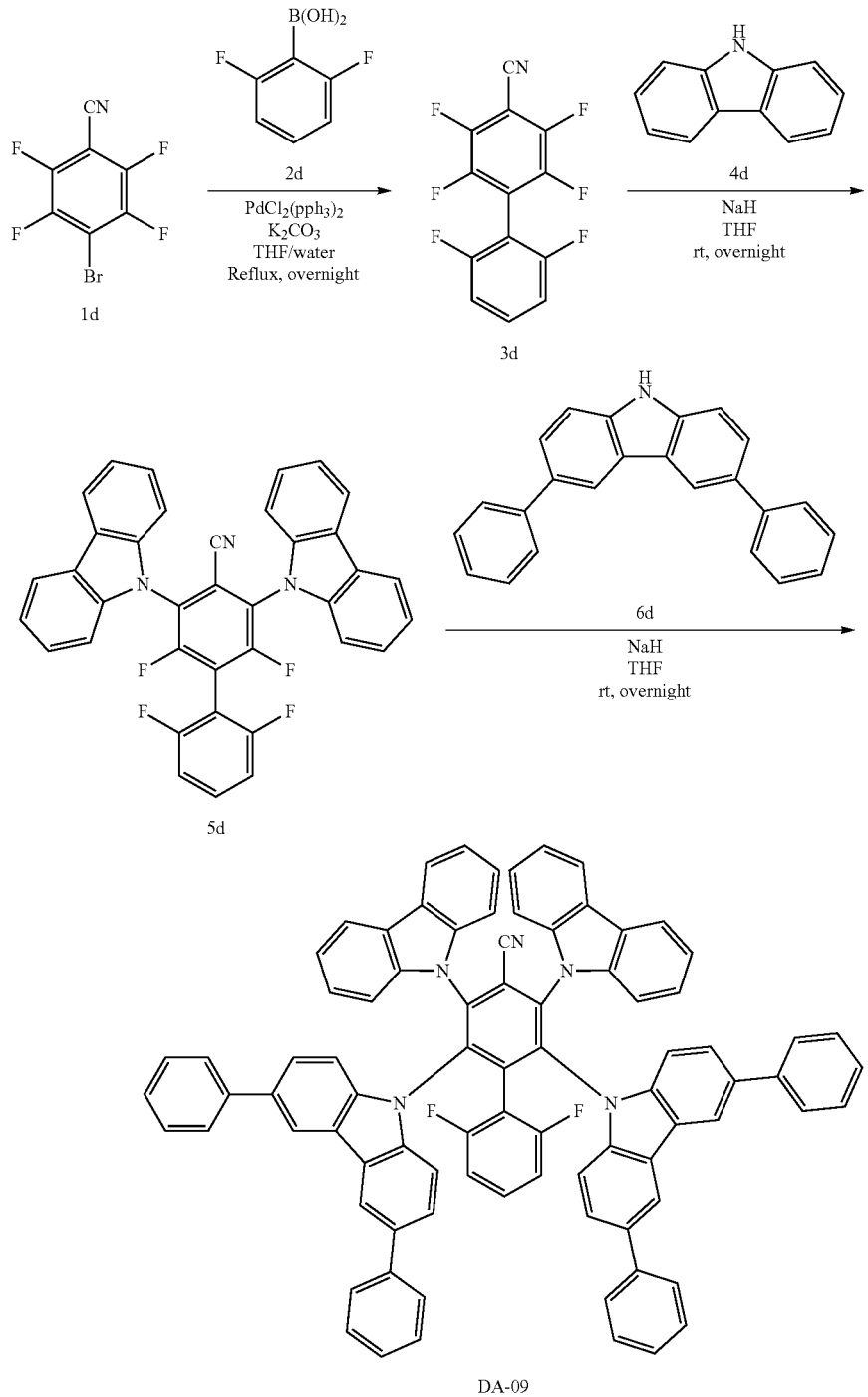

DA-09 hours. The obtained residue was purified utilizing silica gel chromatography and recrystallized with a mixed solvent of chloroform and hexane to obtain Compound 3d (8.02 g, 71%). NaH was added to the THF solution, and the mixture was stirred at room temperature for 5 minutes, and then Compound 4d (11.2 g, 67.0 mmol) was added thereto and stirred for one hour. Thereafter, Compound 3d (8.02 g, 27.9 mmol) was added thereto and stirred at room temperature for 18 hours. The obtained residue was purified utilizing silica gel chromatography and recrystallized with a mixed solvent Compounds 1d (10 g, 39.4 mmol) and 2d (7.47 g, 47.3 mmol) were added to a flask, and THF was added thereto. A $K_2CO_3$ aqueous solution (0.3 M) and $PdCl_2(PPh_3)_2$ subjected to nitrogen bubbling for 10 minutes or more were added thereto, and the mixture was stirred at 80° C. for 22 of chloroform and hexane to obtain Compound 5d (7.94 g, 49%). NaH was added to a THF solution, and the mixture was stirred at room temperature for 5 minutes, and then Compound 6d (10.5 g, 32.9 mmol) was added thereto and stirred for one hour. Thereafter, Compound 5d (7.94 g, 13.7 mmol) was added thereto and stirred at room temperature for 20 hours. The obtained residue was purified utilizing silica gel chromatography and recrystallized with a mixed solvent of chloroform and hexane to obtain Compound DA-09 (6.64 g, 41%).

4. Synthesis of Compound DA-03

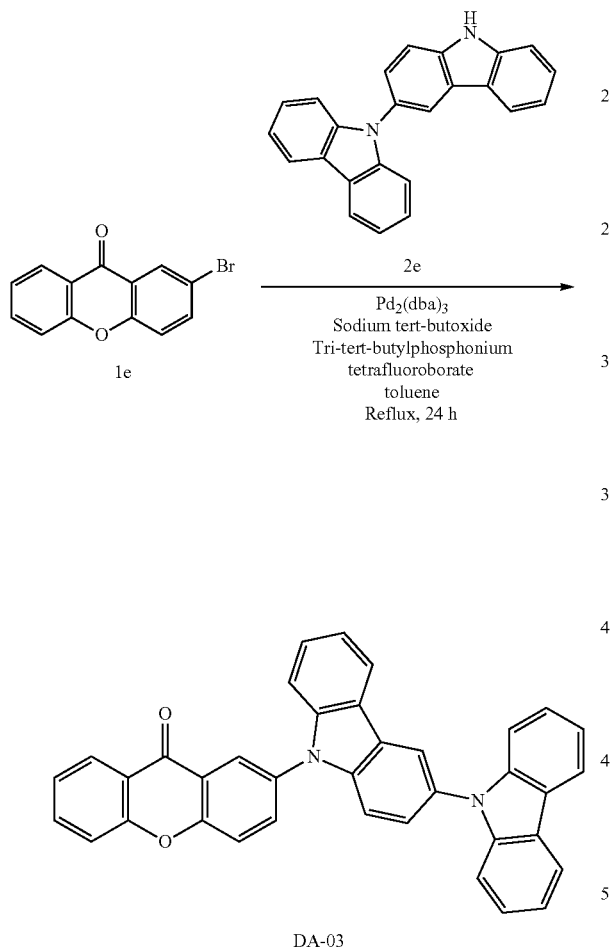

DA-03

Compounds 1e (5.00 g, 18.2 mmol) and 2e (7.25 g, 21.0 mmol) were added to a flask, and toluene was added thereto. Sodium tert-butoxide, Pd₂(dba)₃, and tri-tert-butylphosphonium tetrafluoroborate were added thereto and the mixture was stirred at 110° C. for 24 hours. The obtained residue was purified utilizing silica gel chromatography and recrystallized with a mixed solvent of chloroform and hexane to obtain Compound DA-03 (8.14 g, 85%).

5. Synthesis of Compound D-05

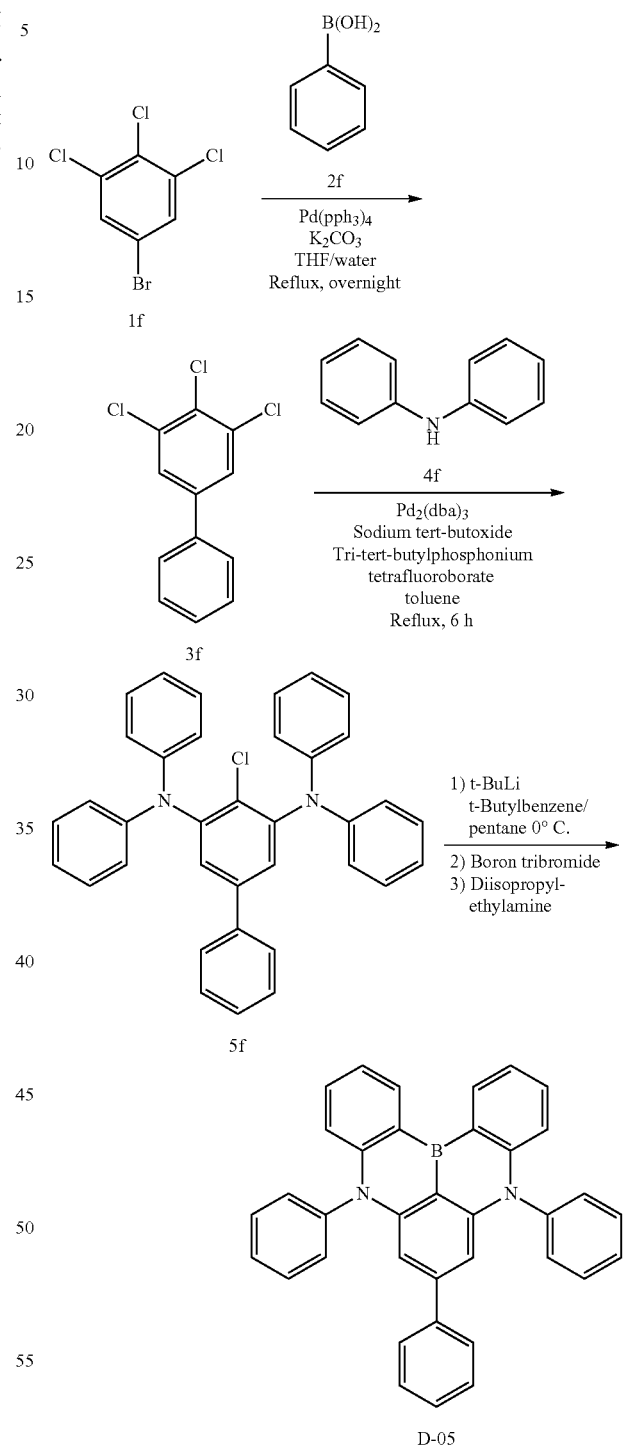

D-05

Compounds 1f (10.0 g, 38.4 mmol) and 2f (5.62 g, 46.1 mmol) were added to a flask, and THF was added thereto. A K₂CO₃ aqueous solution (0.3 M) and Pd(PPh₃)₄ s subjected to nitrogen bubbling for 10 minutes or more were added thereto, and the mixture was stirred at 80° C. for 20 hours. The obtained residue was purified utilizing silica gel chromatography and recrystallized with a mixed solvent of chloroform and hexane to obtain Compound 3f (7.22 g, 73%). Compounds 3f (7.22 g, 28.0 mmol) and 4f (11.4 g, 67.2 mmol) were added to a flask, and toluene was added thereto. Sodium tert-butoxide, Pd$_2$(dba)$_3$, and tri-tert-butylphosphonium tetrafluoroborate were added thereto and the mixture was stirred at 110° C. for 24 hours. The obtained residue was purified utilizing silica gel chromatography and recrystallized with a mixed solvent of chloroform and hexane to obtain Compound 5f (11.8 g, 81%). n-BuLi was slowly added to a t-butylbenzene/pentane solvent and Compound 5f at 0° C., and baron tribromide and diisopropylethylamine were added thereto and the mixture was stirred sufficiently. The obtained compound was purified utilizing silica gel chromatography with a mixed solvent of toluene and hexane to obtain Compound D-05 (4.70 g, 42%).

6. Synthesis of Compound D-06

Synthesis of Intermediate 4g

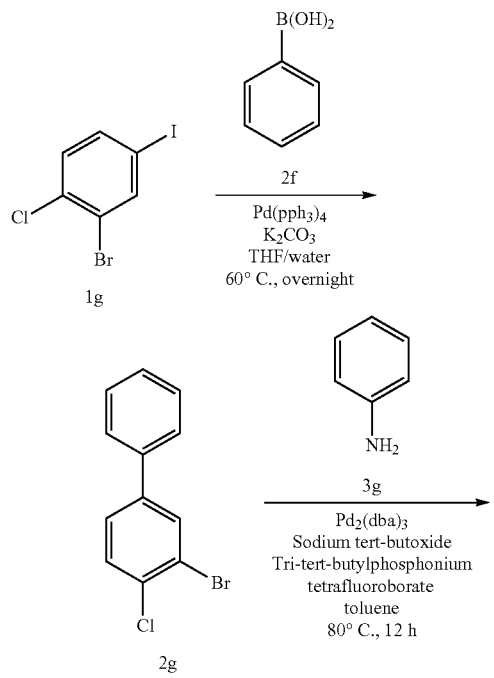

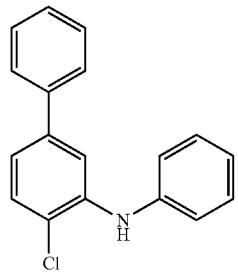

Compounds 1g (10.0 g, 31.5 mmol) and 2f (4.61 g, 37.8 mmol) were added to a flask, and THF was added thereto. A K$_2$CO$_3$ aqueous solution (0.3 M) and Pd(PPh$_3$)$_4$ subjected to nitrogen bubbling for 10 minutes or more were added thereto, and the mixture was stirred at 60° C. for 20 hours. The obtained residue was purified utilizing silica gel chromatography and recrystallized with a mixed solvent of dichloromethane and hexane to obtain Compound 2g (6.24 g, 74%). Compounds 2g (6.24 g, 23.3 mmol) and 3g (2.61 g, 28.0 mmol) were added to a flask, and toluene was added thereto. Sodium tert-butoxide, Pd$_2$(dba)$_3$, and tri-tert-butylphosphonium tetrafluoroborate were added thereto and the mixture was stirred at 80° C. for 12 hours. The obtained residue was purified utilizing silica gel chromatography and recrystallized with a mixed solvent of chloroform and hexane to obtain Compound 4g (5.93 g, 91%).

Synthesis of Compound D-06

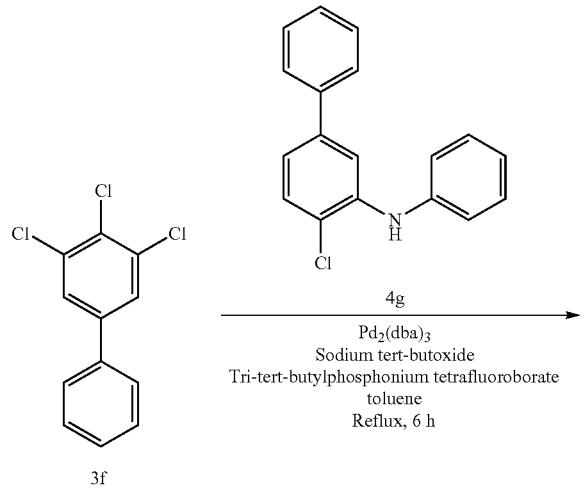

-continued

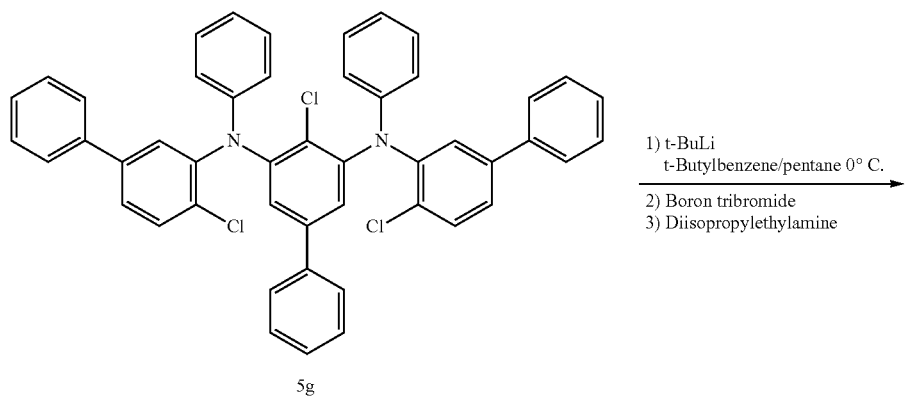

1) t-BuLi
   t-Butylbenzene/pentane 0° C.
2) Boron tribromide
3) Diisopropylethylamine

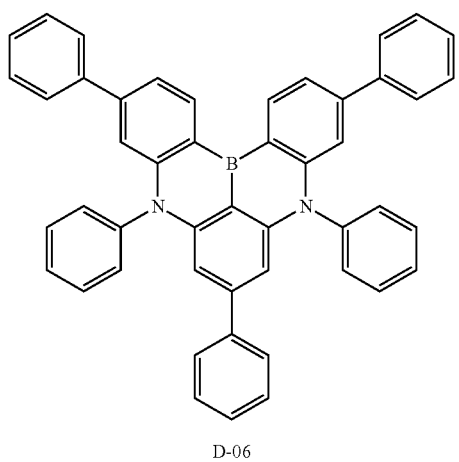

D-06

Compounds 3f (4.00 g, 15.5 mmol) and 4g (10.4 g, 37.2 mmol) were added to a flask, and toluene was added thereto. Sodium tert-butoxide, $Pd_2(dba)_3$, and tri-tert-butylphosphonium tetrafluoroborate were added thereto and the mixture was stirred at 110° C. for 6 hours. The obtained residue was purified utilizing silica gel chromatography and recrystallized with a mixed solvent of chloroform and hexane to obtain Compound 5g (9.78 g, 85%). n-BuLi was slowly added to a t-butylbenzene/pentane solvent and Compound 5g at 0° C., and boron tribromide and diisopropylethylamine were added thereto, and the mixture was stirred sufficiently to obtain a compound. The obtained compound was purified utilizing silica gel chromatography with a mixed solvent of dichloromethane and hexane to obtain Compound D-06 (3.91 g, 46%).

7. Synthesis of Compound D-07

Synthesis of Intermediate 3h

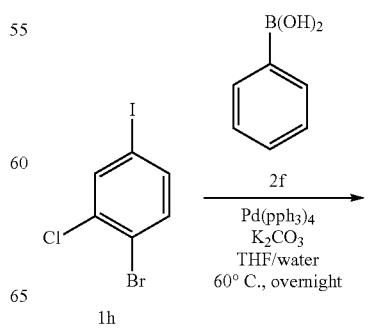

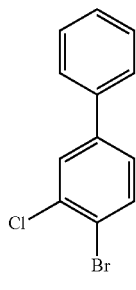
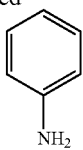
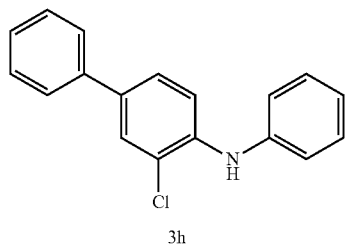

Compounds 1h (10.0 g, 31.5 mmol) and 2f (4.61 g, 37.8 mmol) were added to a flask, and THF was added thereto. A $K_2CO_3$ aqueous solution (0.3 M) and $Pd(PPh_3)_4$ subjected to nitrogen bubbling for 10 minutes or more were added thereto, and the mixture was stirred at 60° C. for 24 hours. The obtained residue was purified utilizing silica gel chromatography and recrystallized with a mixed solvent of chloroform and hexane to obtain Compound 2h (6.74 g, 80%). Compounds 2h (6.74 g, 25.2 mmol) and 3g (2.81 g, 30.2 mmol) were added to a flask, and toluene was added thereto. Sodium tert-butoxide, $Pd_2(dba)_3$, and tri-tert-butylphosphonium tetrafluoroborate were added thereto and the mixture was stirred at 80° C. for 12 hours. The obtained residue was purified utilizing silica gel chromatography and recrystallized with a mixed solvent of chloroform and hexane to obtain Compound 3h (6.49 g, 92%).

Synthesis of Compound D-07

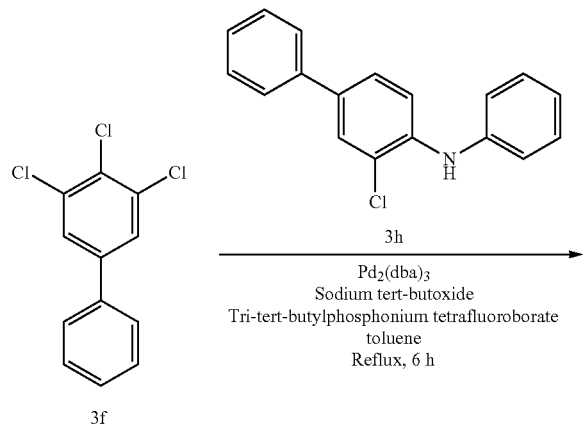

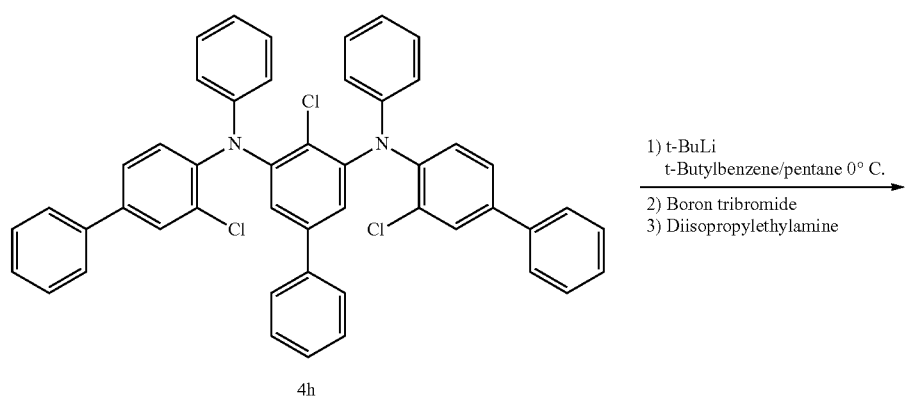

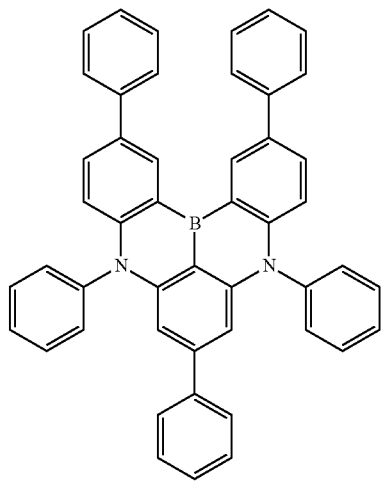

D-07

Compounds 3h (3.91 g, 14 mmol) and 3f (1.5 g, 5.82 mmol) were added to a flask, and toluene was added thereto. Sodium tert-butoxide, Pd$_2$(dba)$_3$, and tri-tert-butylphosphonium tetrafluoroborate were added thereto and the mixture was stirred at 110° C. for 6 hours. The obtained residue was purified utilizing silica gel chromatography and recrystallized with a mixed solvent of chloroform and hexane to obtain Compound 4h (3.72 g, 86%). n-BuLi was slowly added to a t-butylbenzene/pentane solvent and Compound 4h (2.0 g) at 0° C., and boron tribromide and diisopropylethylamine were added thereto, and the mixture was stirred sufficiently to obtain a compound. The obtained compound was purified utilizing silica gel chromatography with a mixed solvent of dichloromethane and hexane to obtain Compound DA-07 (0.66 g, 38%).

8. Synthesis of Compound D-08

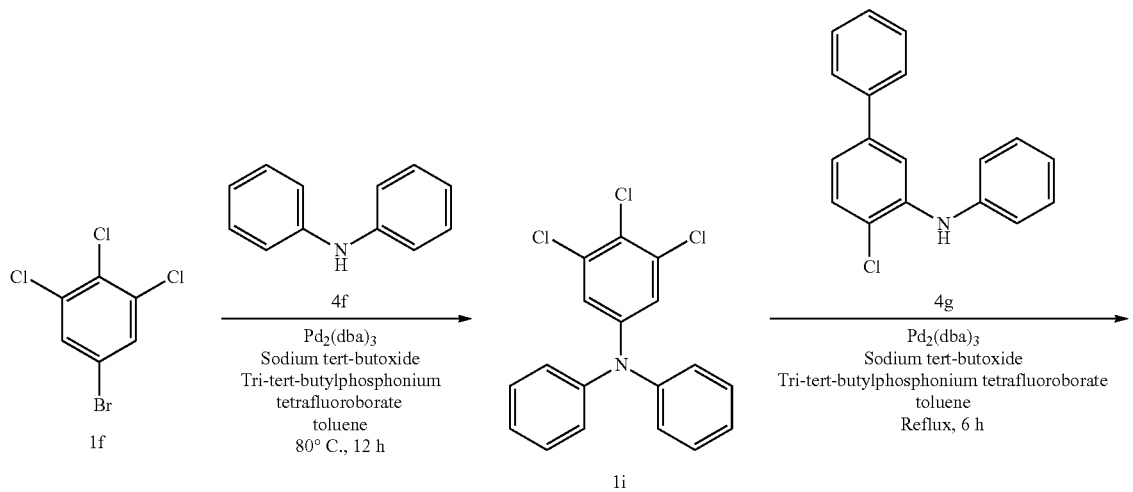

-continued

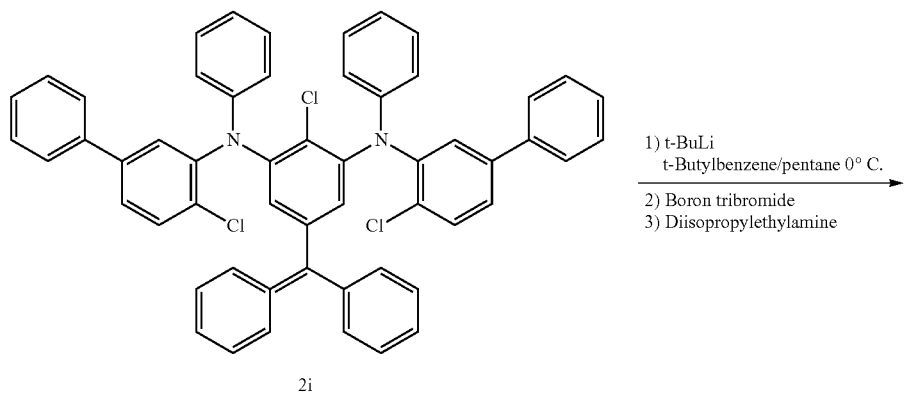

2i 1) t-BuLi
   t-Butylbenzene/pentane 0° C.
2) Boron tribromide
3) Diisopropylethylamine

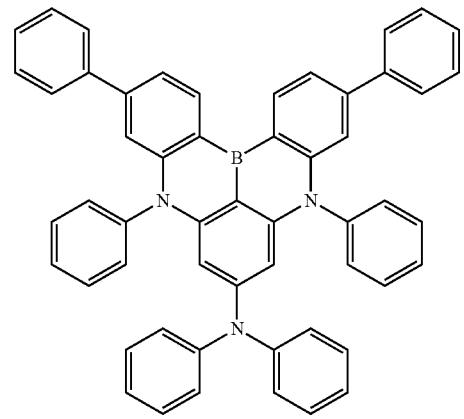

D-08

Compounds 1f (6.00 g, 23.0 mmol) and 4f (4.67 g, 27.6 mmol) were added to a flask, and toluene was added thereto. Sodium tert-butoxide, Pd$_2$(dba)$_3$, and tri-tert-butylphosphonium tetrafluoroborate were added thereto and the mixture was stirred at 80° C. for 12 hours. The obtained residue was purified utilizing silica gel chromatography and recrystallized with a mixed solvent of chloroform and hexane to obtain Compound 1i (6.66 g, 83%). Compounds 1i (6.66 g, 19.1 mmol) and 4g (12.8 g, 45.8 mmol) were added to a flask, and toluene was added thereto. Sodium tert-butoxide, Pd$_2$(dba)$_3$, and tri-tert-butylphosphonium tetrafluoroborate were added thereto and the mixture was stirred at 110° C. for 6 hours. The obtained residue was purified utilizing silica gel chromatography and recrystallized with a mixed solvent of dichloromethane and hexane to obtain Compound 2i (12.5 g, 88%). n-BuLi was slowly added to a t-butylbenzene/pentane solvent and Compound 2i (5.0 g) at 0° C., and boron tribromide and diisopropylethylamine were added thereto and the mixture was stirred sufficiently to obtain a compound. The obtained compound was purified utilizing silica gel chromatography with a mixed solvent of toluene and hexane to obtain Compound D-08 (1.39 g, 32%).

Example of Manufacturing Devices

In order to evaluate the characteristics of organic electroluminescence devices according to Examples and Comparative Examples, organic electroluminescence devices were manufactured utilizing the first host, the first dopant, and the second dopant shown below as an emission layer material.

First host

HT-08

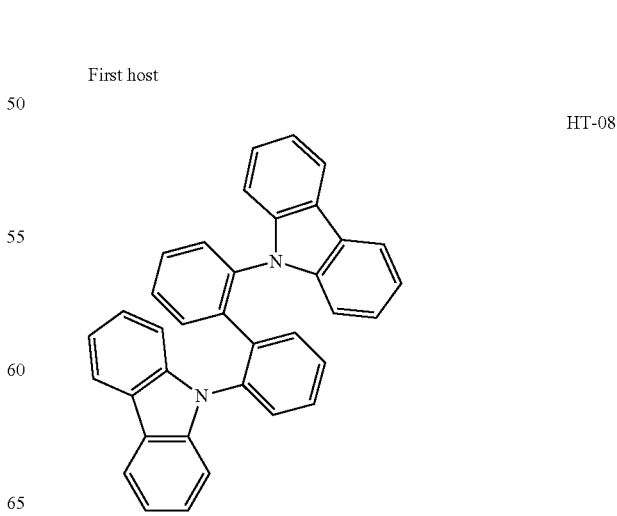

Second host

ET04
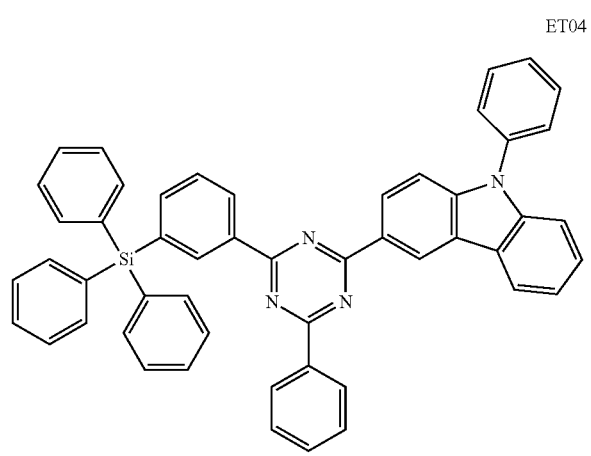

First dopant

DA-09
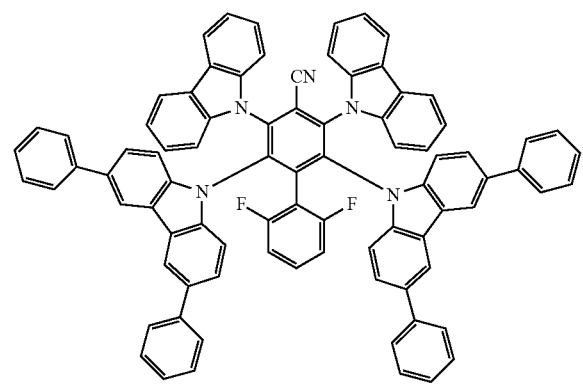

DA-03
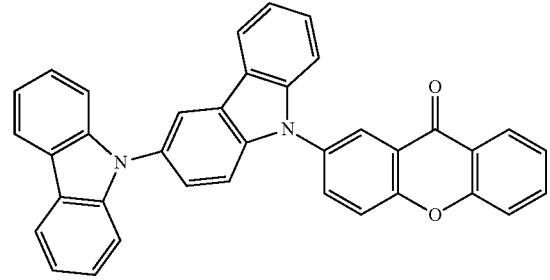

Second dopant

D-05
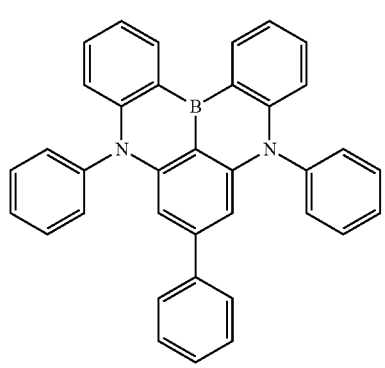

D-06
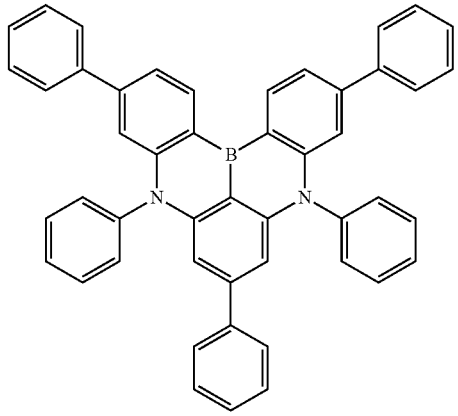

D-07
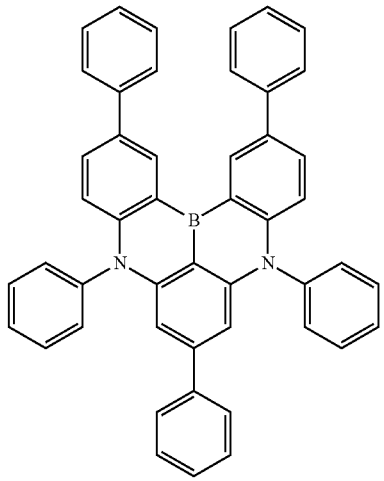

D-08
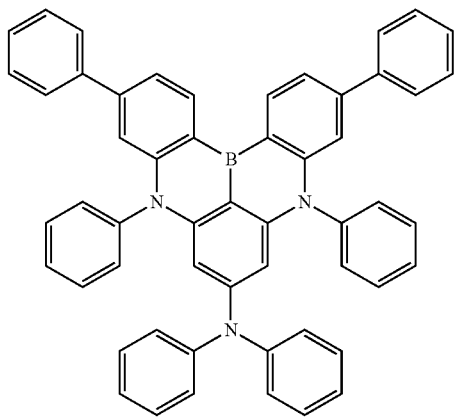

Organic electroluminescence devices of Examples and Comparative Examples were manufactured through the following method. An ITO glass substrate was cut to a size of about 50 mm×50 mm×0.5 mm, subjected to ultrasonic cleaning utilizing isopropyl alcohol and distilled water for 10 minutes respectively and ultraviolet irradiation for about 10 minutes, and then exposed to ozone for cleaning to form the glass substrate in a vacuum deposition apparatus. Thereafter, a hole injection layer HIL was formed to have a thickness of about 40 Å utilizing m-MTDATA, and a hole transport layer HTL was formed to have a thickness of about 1000 Å utilizing NPB. Subsequently, a first host, a second host, a first dopant, and a second dopant compound according to an embodiment were co-deposited to form an emission layer EML having a thickness of 400 Å, and an electron transport layer ETL was formed to have a thickness of 300 Å utilizing compound ZADN. Thereafter, a second electrode EL2 was formed to have a thickness of 1,200 Å utilizing Al. Each layer was formed through vacuum evaporation.

In order to evaluate the characteristics of the organic electroluminescence devices according to each of the Examples and Comparative Examples, external quantum efficiency and lifetime were measured. Table 1 shows the quantum efficiency (%) and lifetime (hr) at a luminance of 1000 cd/m² for the manufactured organic electroluminescence devices. Table 1 below also shows the delayed fluorescence lifetime values of the first dopant, the prompt fluorescence rate constant and the intersystem crossing rate constant of the second dopant.

A transient PL decay experiment was performed to measure the delayed fluorescence lifetime values of Example Compound DA-09 and Comparative Example Compound DA-03 utilizing HAMAMATSU's STREAK CAMERA, and a 355 nm pulsed LED as a light source.

A prompt fluorescence rate constant $k_{PF}$ and an intersystem crossing rate constant $k_{ISC}$ of the second dopant were each calculated utilizing a respective equation below. In the following equation, $\phi_{PF}$, and $\tau_{PF}$ represent quantum yields and lifetime values of prompt fluorescence, respectively, $k_r$ represents a fluorescence rate constant, OP represents a phosphorescence quantum yield, and $k_{IC}$ represents an internal conversion rate constant.

$$k_{PF} = \phi_{PF}/\tau_{PF}$$

$$k_{ISC} = k_r/(\phi_P - k_r - k_{IC})$$  Equation

In each of Comparative Examples 2 to 4, the external quantum efficiency and lifetime decreased compared to each of Examples 1-4. It was found that the first dopant of each of Comparative Examples 2 to 4 exhibited a longer delayed fluorescence lifetime ($\tau$) than the first dopant of each of Examples 1-4 as well as the prompt fluorescence rate constant $k_{PF}^{D2}$ of the second dopant was less than the intersystem crossing rate constant $k_{ISC}^{D2}$. Accordingly, it is derived that the excitons stayed longer at the triplet state to increase the Dexter energy transfer from $T_1^{D1}$ to $T_1^{D2}$, and thus, even with the forster energy transfer from $S_1^{D1}$ to $S_1^{D2}$, the intersystem crossing rate was faster than the prompt fluorescence rate to repeat the process of intersystem crossing and reverse intersystem crossing, thereby decreasing external quantum efficiency and lifetime.

The organic electroluminescence device according to an embodiment includes a first host, a second host, and a first dopant and a second dopant, which are different kinds of thermally activated delayed fluorescence materials, and accordingly, high luminous efficiency and increased lifetime may be achieved.

The first host, the second host, the first dopant, and the second dopant according to an embodiment of the present disclosure are utilized for an emission layer material to contribute to increased efficiency and lifetime characteristics of the organic electroluminescence device.

An organic electroluminescence device of an embodiment may exhibit improved device characteristics having high efficiency and long service life.

An organic electroluminescence device of an embodiment may include both a host material and two different dopant materials to exhibit high efficiency and long service life characteristics.

TABLE 1

| | First host | Second host | First dopant | Second dopant | $\tau(\mu s)$ | $K_{PF}^{D2}(s^{-1})$ | $k_{ISC}^{D2}$ $(s^{-1})$ | EQE (%) | Life-time (hr) |
|---|---|---|---|---|---|---|---|---|---|
| Example 1 | HT-08 | ET-04 | DA-09 | D-05 | 2.6 | $6.15 \times 10^7$ | $3.70 \times 10^7$ | 18 | 65 |
| Example 2 | HT-08 | ET-04 | DA-09 | D-08 | 2.6 | $6.79 \times 10^7$ | $1.79 \times 10^8$ | 15 | 20 |
| Example 3 | HT-08 | ET-04 | DA-09 | D-07 | 2.6 | $6.20 \times 10^7$ | $2.20 \times 10^8$ | 15 | 22 |
| Example 4 | HT-08 | ET-04 | DA-09 | D-06 | 2.6 | $5.20 \times 10^7$ | $2.80 \times 10^8$ | 16 | 17 |
| Comparative Example 1 | HT-08 | ET-04 | DA-03 | D-05 | 122 | $6.15 \times 10^7$ | $3.70 \times 10^7$ | 10 | 2 |
| Comparative Example 2 | HT-08 | ET-04 | DA-03 | D-08 | 122 | $6.79 \times 10^7$ | $1.79 \times 10^8$ | 7 | 1.3 |
| Comparative Example 3 | HT-08 | ET-04 | DA-03 | D-07 | 122 | $6.20 \times 10^7$ | $2.20 \times 10^8$ | 10 | 1.8 |
| Comparative Example 4 | HT-08 | ET-04 | DA-03 | D-06 | 122 | $5.20 \times 10^7$ | $2.80 \times 10^8$ | 9 | 1.7 |

Referring to Table 1 above, it is seen that Examples 1 to 4 each exhibit relatively higher external quantum efficiency and improved lifespan characteristics compared to each of Comparative Examples 1 to 4. In each of Examples 1 to 4 according to the present disclosure, it is seen that the delayed fluorescence lifetime ($\tau$) of the first dopant is shorter, the Förster energy transfer from $S_1^{D1}$ to $S_1^{D2}$ thus increased, thereby increasing external quantum efficiency and lifetime.

In Comparative Example 1, both the external quantum efficiency and the lifetime decreased compared to each of Examples 1-4. This indicates that despite the fact that the prompt fluorescence rate constant $k_{PF}^{D2}$ of the second dopant was greater than the intersystem crossing rate constant $k_{ISC}^{D2}$ of the second dopant, the delayed fluorescence lifetime ($\tau$) of the first dopant was long, and thus excitons stayed longer at the triplet state to decrease the Förster energy transfer from $S_1^{D1}$ to $S_1^{D2}$ and to increase the Dexter energy transfer from $T_1^{D1}$ to $T_1^{D2}$, thereby causing triplet quenching.

Although the embodiments of the present disclosure have been described above with reference to the accompanying drawings, those skilled in the art to which the present disclosure pertains may implement the present disclosure in other specific forms without changing the technical idea or essential features thereof. Therefore, it should be understood that the embodiments described above are illustrative in all respects and not restrictive.

What is claimed is:

1. An organic electroluminescence device comprising:
    a first electrode;
    a second electrode facing the first electrode; and
    an emission layer between the first electrode and the second electrode,
    wherein the emission layer comprises:
    a first host;
    a first dopant; and
    a second dopant different from the first dopant, the first dopant and the second dopant are each independently a compound exhibiting thermally activated delayed fluorescence, the first dopant has a delayed fluorescence lifetime (τ) value of about 2.6 μs to about 5.0 μs, and the first host, the first dopant, and the second dopant satisfy Equation 1 below:

$$T_1^{H1} > T_1^{D1} > T_1^{D2}, \quad \text{Equation 1}$$

wherein in Equation 1, $T_1^{H1}$ is a lowest triplet excitation energy level of the first host, $T_1^{D1}$ is a lowest triplet excitation energy level of the first dopant, and $T_1^{D2}$ is a lowest triplet excitation energy level of the second dopant.

2. The organic electroluminescence device of claim 1, wherein a difference between a lowest singlet excitation energy level and the lowest triplet excitation energy level in each of the first dopant and the second dopant is about 0.2 eV or less.

3. The organic electroluminescence device of claim 1, wherein the second dopant satisfies Equation 2 below:

$$k_{PF}^{D2} > k_{ISC}^{D2}, \text{ and} \quad \text{Equation 2}$$

wherein in Equation 2, $k_{PF}^{D2}$ is a prompt fluorescence rate constant of the second dopant, and $k_{ISC}^{D2}$ is an intersystem crossing rate constant of the second dopant.

4. The organic electroluminescence device of claim 1, wherein the first dopant is represented by Formula 1 below:

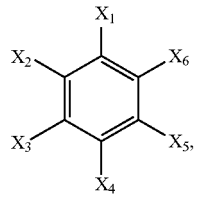

Formula 1 and wherein in Formula 1, $X_1$ to $X_6$ are each independently a hydrogen atom, a deuterium atom, an electron withdrawing group, or an electron donating group, at least one of $X_1$ to $X_6$ is an electron withdrawing group, and at least one of remaining $X_1$ to $X_6$ is an electron donating group, the electron withdrawing group is a substituted or unsubstituted fluoro group, a fluoro-substituted alkyl group having 1 to 20 carbon atoms, a fluoro-substituted aryl group having 6 to 30 ring-forming carbon atoms, a cyano group, a cyano-substituted aryl group having 6 to 30 ring-forming carbon atoms, a substituted or unsubstituted carbonyl group, or a substituted or unsubstituted triazine group, and the electron donating group is a substituted or unsubstituted amine group, a substituted or unsubstituted nitrogen atom-containing heteroaryl group having 2 to 30 ring-forming carbon atoms, or a substituted or unsubstituted carbazole group.

5. The organic electroluminescence device of claim 1, wherein at least one of $X_1$ to $X_6$ in Formula 1 is represented by Formula 2 below:

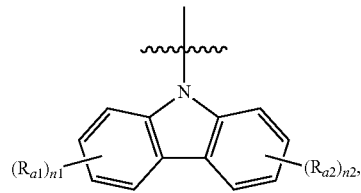

Formula 2 and wherein in Formula 2, $R_{a1}$ and $R_{a2}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, and n1 and n2 are each independently an integer of 0 to 4.

6. The organic electroluminescence device of claim 1, wherein the second dopant is represented by Formula 3 below:

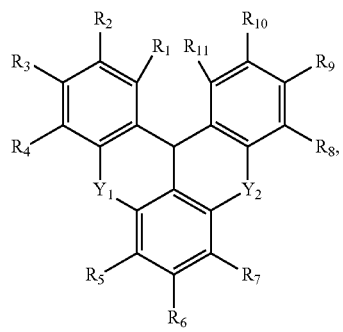

Formula 3 and wherein in Formula 3,

M is B or N, $Y_1$ and $Y_2$ are each independently O, S, $NR_{12}$, $CR_{13}R_{14}$, $BR_{15}$, or $SiR_{16}R_{17}$, $R_1$ to $R_{11}$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, and $R_{12}$ to $R_{17}$ are each independently a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

7. The organic electroluminescence device of claim 6, wherein the second dopant represented by Formula 3 is represented by any one of Formulas 4-1 to 4-3 below:

Formula 4-1

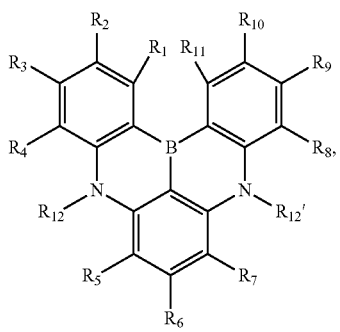

Formula 4-2

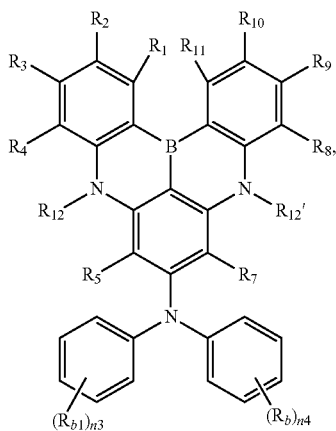

Formula 4-3

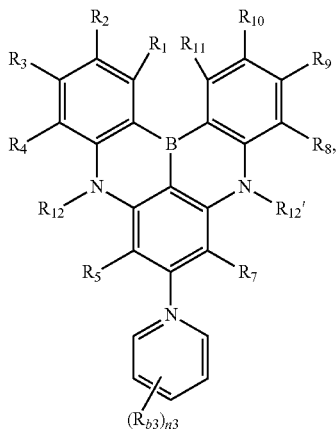

and
wherein in Formulas 4-1 to 4-3,
$R_{12'}$ is a substituted or unsubstituted aryl group having 6 to 30 ring-forming carbon atoms, a substituted or unsubstituted heteroaryl group having 2 to 30 ring-forming carbon atoms, or bonded to an adjacent group to form a ring,
$R_{b1}$ to $R_{b3}$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, n3 and n5 are each independently an integer of 0 to 5, and
$R_1$ to $R_{12}$ are each independently the same as defined in connection with Formula 3.

8. The organic electroluminescence device of claim 1, wherein the first host is represented by Formula 5 below:

Formula 5

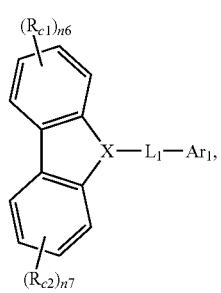

and
wherein in Formula 5,
X is N or $CR_{18}$,
$R_{c1}$, $R_{c2}$, and $R_{18}$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms,
$L_1$ is a substituted or unsubstituted arylene group having 6 to 30 ring-forming carbon atoms, or a substituted or unsubstituted heteroarylene group having 2 to 30 ring-forming carbon atoms,
$Ar_1$ is a substituted or unsubstituted aryl group having 6 to 30 ring-forming carbon atoms, or a substituted or unsubstituted heteroaryl group having 2 to 30 ring-forming carbon atoms,
m is 1 or 2, and
n6 and n7 are each independently an integer of 0 to 4.

9. The organic electroluminescence device of claim 8, wherein the first host represented by Formula 5 is represented by Formula 6 below:

Formula 6

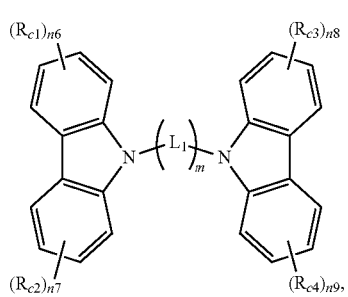

and
wherein in Formula 6,
$R_{c3}$ and $R_{c4}$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, n8 and n9 are each independently an integer of 0 to 4, and $R_{c1}$, $R_{c2}$, $L_1$, m, n6, and n7 are each independently the same as respectively defined in connection with Formula 5.

10. The organic electroluminescence device of claim 1, wherein the emission layer further comprises a second host different from the first host, and the second host is represented by Formula 7 below:

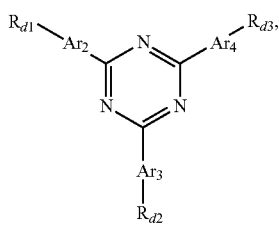

Formula 7 and wherein in Formula 7, $Ar_2$ to $Ar_4$ are each independently a direct linkage, a substituted or unsubstituted arylene group having 6 to 30 ring-forming carbon atoms, or a substituted or unsubstituted heteroarylene group having 2 to 30 ring-forming carbon atoms, and $R_{d1}$ to $R_{d3}$ are each independently a hydrogen atom, a deuterium atom, a halogen atom, a substituted or unsubstituted silyl group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

11. The organic electroluminescence device of claim 10, wherein the second host represented by Formula 7 is represented by any one of Formulas 8-1 to 8-3 below:

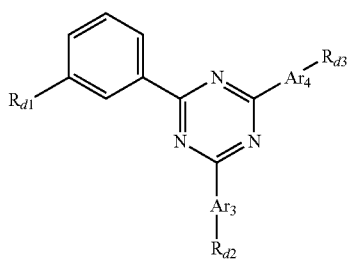

Formula 8-1

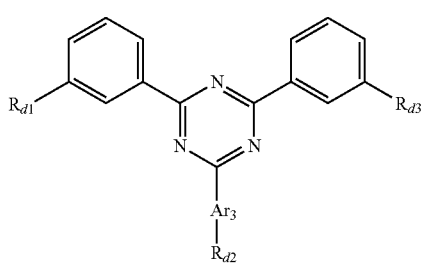

Formula 8-2

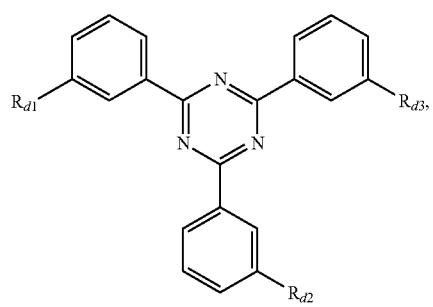

Formula 8-3 and wherein in Formulas 8-1 to 8-3, $R_{d1}$ to $R_{d3}$, $Ar_3$, and $Ar_4$ are each independently the same as respectively defined in connection with Formula 7.

12. An organic electroluminescence device comprising:

a first electrode;

a second electrode facing the first electrode; and an emission layer between the first electrode and the second electrode, wherein the emission layer comprises:

a first host;

a first dopant represented by Formula 1 below; and a second dopant represented by Formula 3 below, the first dopant has a delayed fluorescence lifetime (τ) value of about 2.6 μs to about 5.0 μs, and a difference between a lowest singlet excitation energy level and a lowest triplet excitation energy level in each of the first dopant and the second dopant is about 0.2 eV or less,

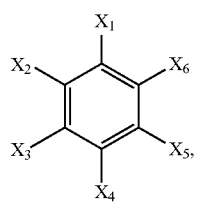

Formula 1 wherein in Formula 1, $X_1$ to $X_6$ are each independently a hydrogen atom, a deuterium atom, an electron withdrawing group, or an electron donating group, where at least one of $X_1$ to $X_6$ is an electron withdrawing group, and at least one of remaining $X_1$ to $X_6$ is an electron donating group, the electron withdrawing group is a substituted or unsubstituted fluoro group, a fluoro-substituted alkyl group having 1 to 20 carbon atoms, a fluoro-substituted aryl group having 6 to 30 ring-forming carbon atoms, a cyano group, a cyano-substituted aryl group having 6 to 30 ring-forming carbon atoms, a substituted or unsubstituted carbonyl group, or a substituted or unsubstituted triazine group, and the electron donating group is a substituted or unsubstituted amine group, a substituted or unsubstituted nitrogen atom-containing heteroaryl group having 2 to 30 ring-forming carbon atoms, or a substituted or unsubstituted carbazole group,

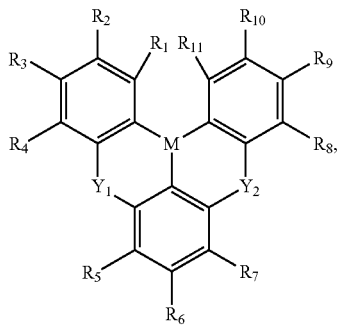

Formula 3 and
wherein in Formula 3,
M is B or N,
$Y_1$ and $Y_2$ are each independently O, S, $NR_{12}$, $CR_{13}R_{14}$, $BR_{15}$, or $SiR_{16}R_{17}$,
$R_1$ to $R_{11}$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or bonded to an adjacent group to form a ring, and
$R_{12}$ to $R_{17}$ are each independently a substituted or unsubstituted aryl group having 6 to 30 ring-forming carbon atoms, a substituted or unsubstituted heteroaryl group having 2 to 30 ring-forming carbon atoms, or bonded to an adjacent group to form a ring.

13. The organic electroluminescence device of claim 12, wherein the first host, the first dopant, and the second dopant satisfy Equation 1 below:

$$T_1^{H1} > T_1^{D1} > T_1^{D2}, \text{ and} \qquad \text{Formula 1}$$

wherein in Equation 1,
$T_1^{H1}$ is a lowest triplet excitation energy level of the first host,
$T_1^{D1}$ is a lowest triplet excitation energy level of the first dopant, and
$T_1^{D2}$ is a lowest triplet excitation energy level of the second dopant.

14. The organic electroluminescence device of claim 12, wherein the second dopant satisfies Equation 2 below:

$$k_{PF}^{D2} > k_{ISC}^{D2}, \text{ and} \qquad \text{Formula 2}$$

wherein in Equation 2,
$k_{PF}^{D2}$ is a prompt fluorescence rate constant of the second dopant, and
$k_{ISC}^{D2}$ is an intersystem crossing rate constant of the second dopant.

15. The organic electroluminescence device of claim 12, wherein the first host is represented by Formula 5 below:

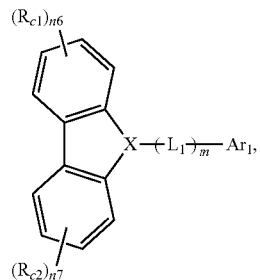

Formula 5 and
wherein in Formula 5,
X is N or $CR_{18}$,
$R_{c1}$, $R_{c2}$, and $R_{18}$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms,
$L_1$ is a substituted or unsubstituted arylene group having 6 to 30 ring-forming carbon atoms, or a substituted or unsubstituted heteroarylene group having 2 to 30 ring-forming carbon atoms,
$Ar_1$ is a substituted or unsubstituted aryl group having 6 to 30 ring-forming carbon atoms, or a substituted or unsubstituted heteroaryl group having 2 to 30 ring-forming carbon atoms,
m is 1 or 2, and
n6 and n7 are each independently an integer of 0 to 4.

16. The organic electroluminescence device of claim 12, wherein the emission layer further comprises a second host different from the first host, and
the second host is represented by Formula 7 below:

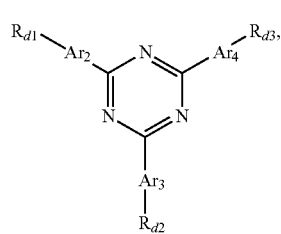

Formula 7 and
wherein in Formula 7,
$Ar_2$ to $Ar_4$ are each independently a direct linkage, a substituted or unsubstituted arylene group having 6 to 30 ring-forming carbon atoms, or a substituted or unsubstituted heteroarylene group having 2 to 30 ring-forming carbon atoms, and
$R_{d1}$ to $R_{d3}$ are each independently a hydrogen atom, a deuterium atom, a halogen atom, a substituted or unsubstituted silyl group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

17. The organic electroluminescence device of claim 12, wherein the first host is any one of compounds represented by Compound Group 1 below:
Compound Group 1
HT-01
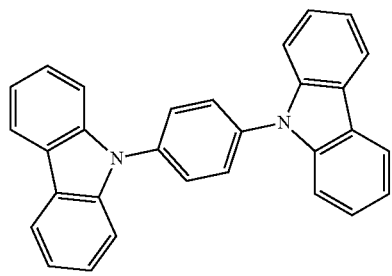
HT-02
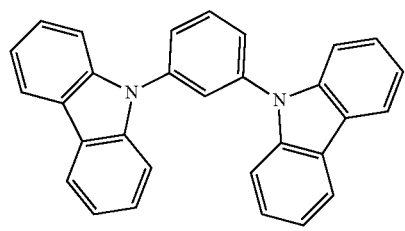
HT-03
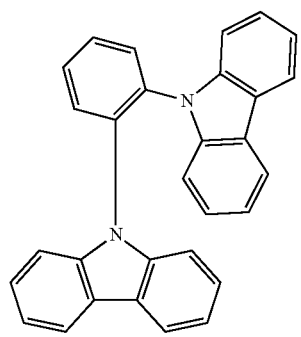
HT-04
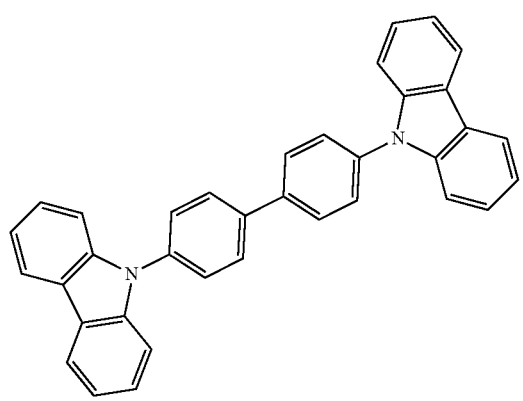
-continued
HT-05
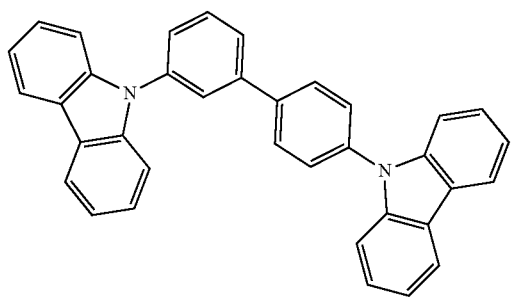
HT-06
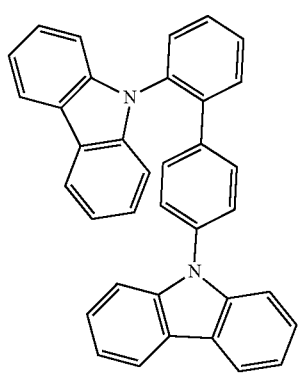
HT-07
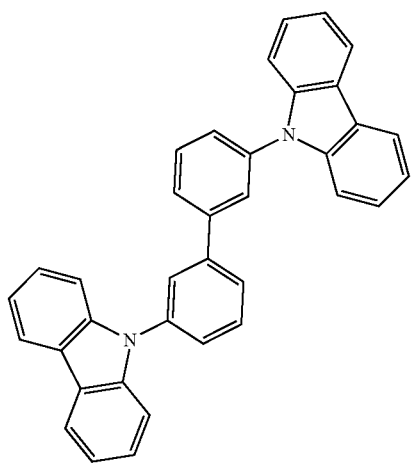
HT-08
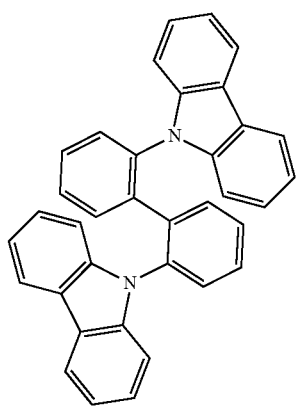

HT-09
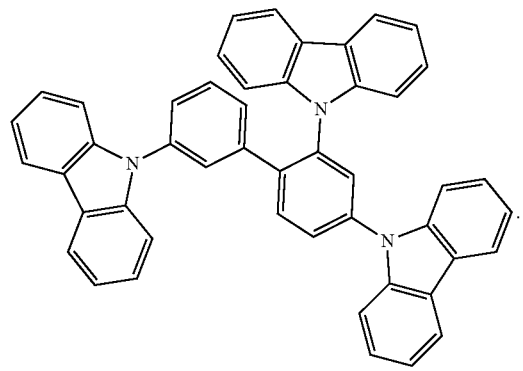
18. The organic electroluminescence device of claim 12, wherein the first dopant is any one of compounds represented by Compound Group 2 below:
Compound Group 2
DA-01
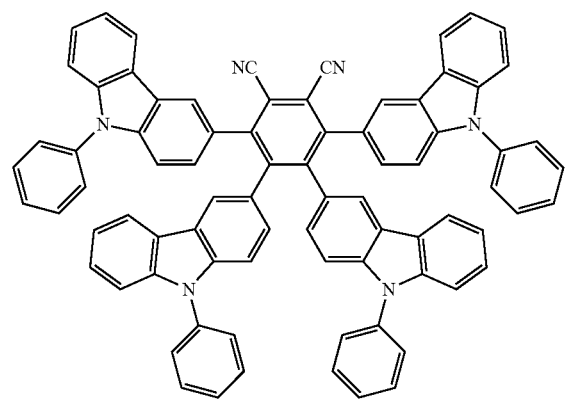
DA-02
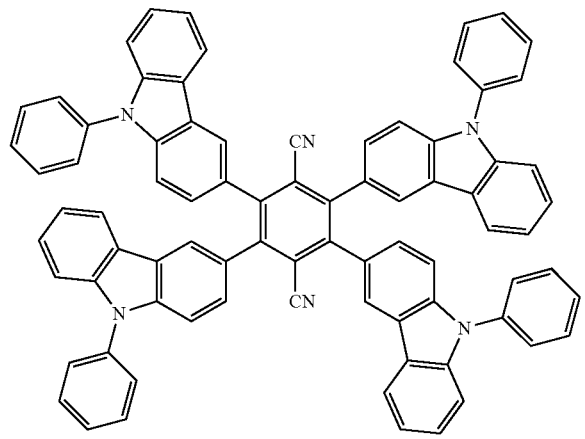
DA-03
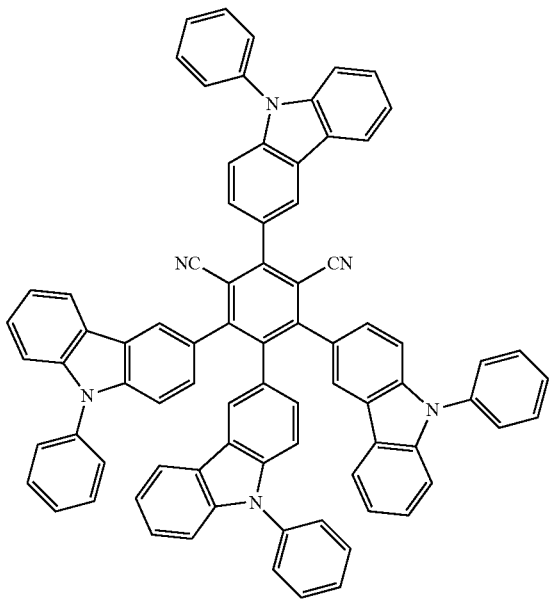
DA-04
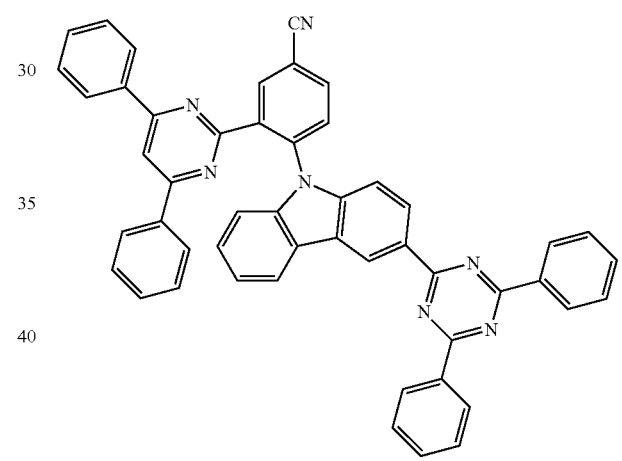
DA-05
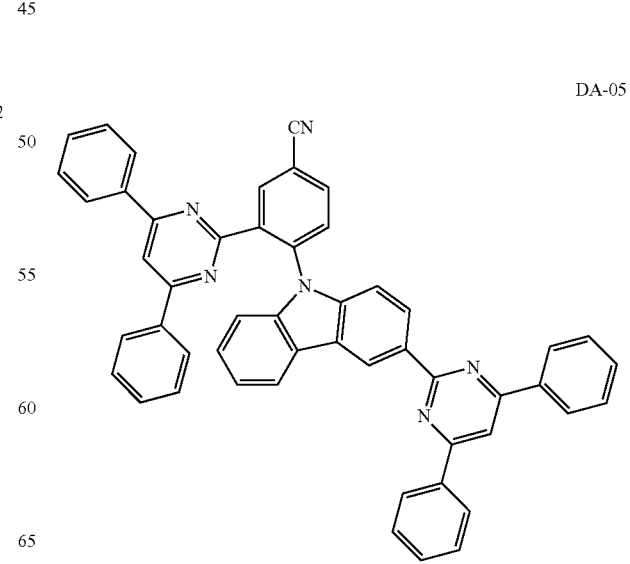

DA-06
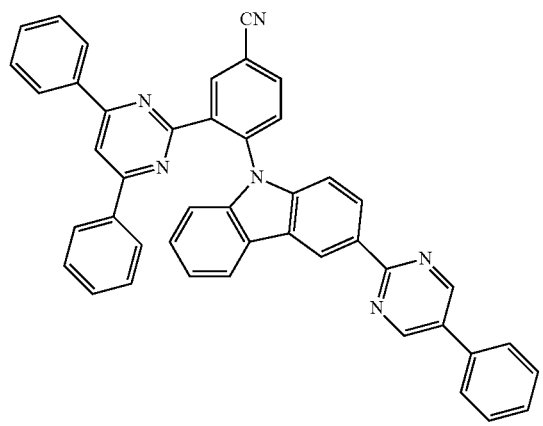
DA-09
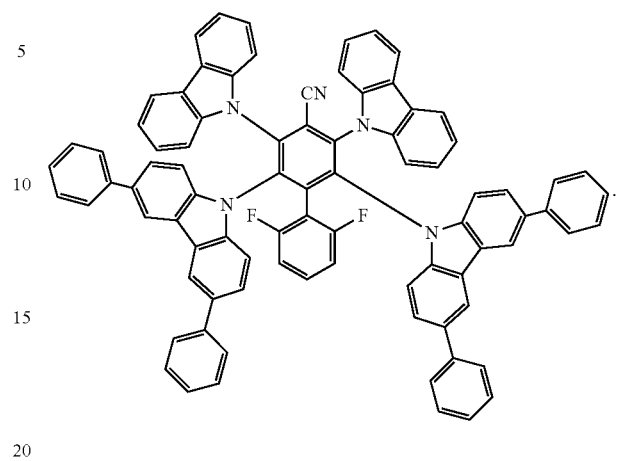
19. The organic electroluminescence device of claim 12, wherein the second dopant is any one of compounds represented by Compound Group 3 below:
Compound Group 3
D-01
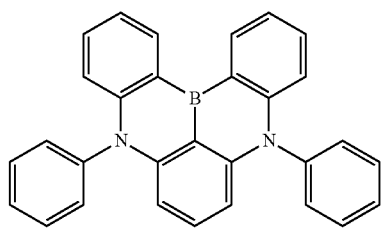
DA-07
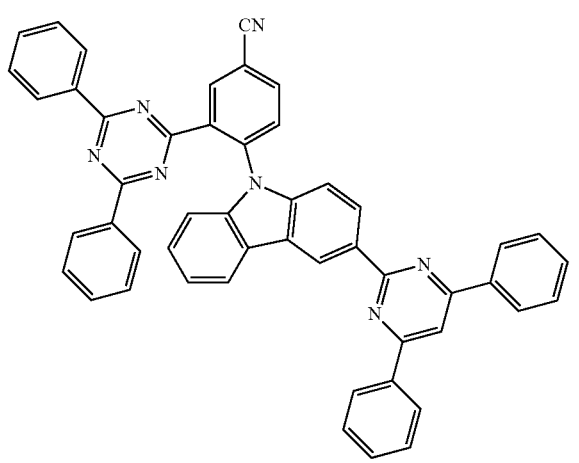
D-02
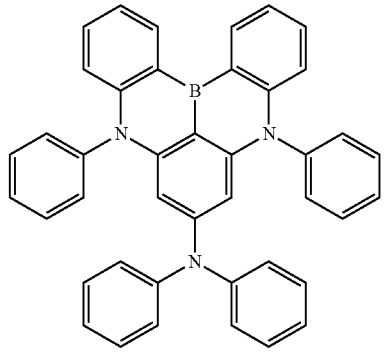
DA-08
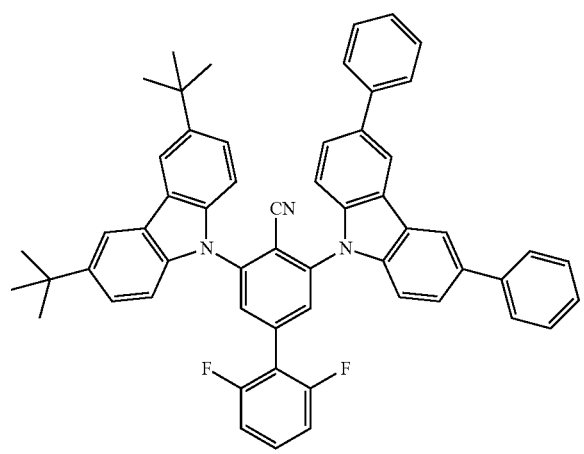
D-03
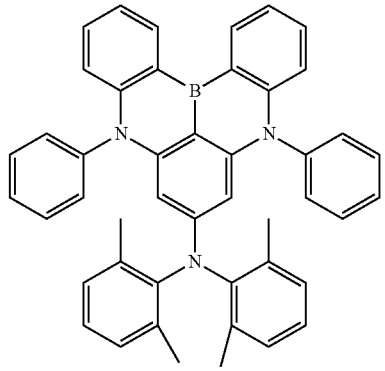

-continued
D-04
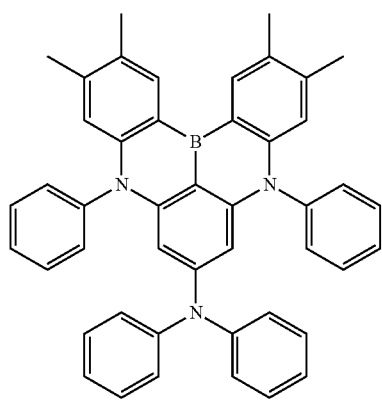
D-05
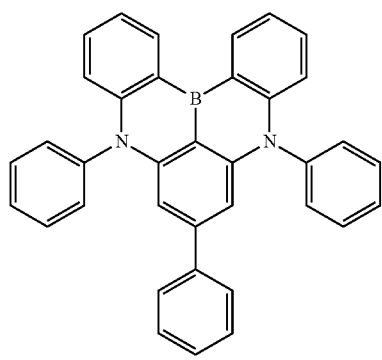
D-06
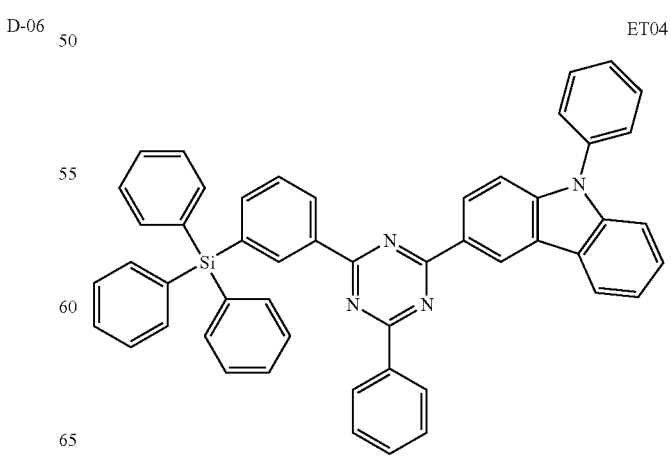
20. The organic electroluminescence device of claim 16, wherein the second host is any one of compounds represented by Compound Group 4 below:
Compound Group 4
ET01
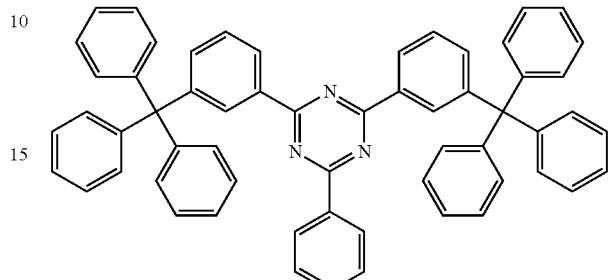
ET02
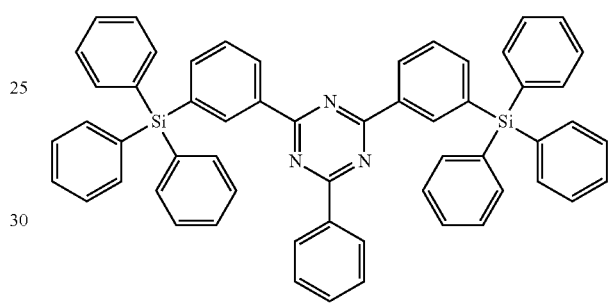
ET03
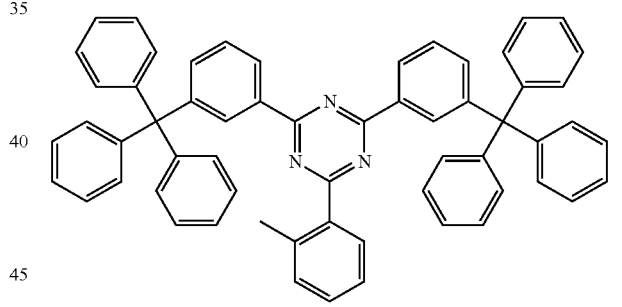
ET04

-continued
ET05
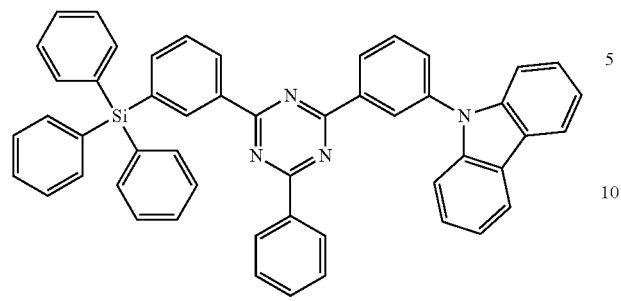
ET06
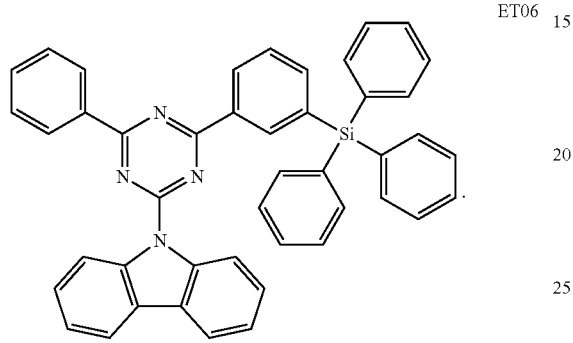
* * * * *

UNITED STATES PATENT AND TRADEMARK OFFICE
CERTIFICATE OF CORRECTION

PATENT NO.       : 12,144,252 B2
APPLICATION NO.  : 17/365763
DATED            : November 12, 2024
INVENTOR(S)      : Jiyoung Lee et al.

Page 1 of 6

It is certified that error appears in the above-identified patent and that said Letters Patent is hereby corrected as shown below:

In the Claims

In Column 96, Lines 33-45, in Claim 6, in Formula 3, delete " 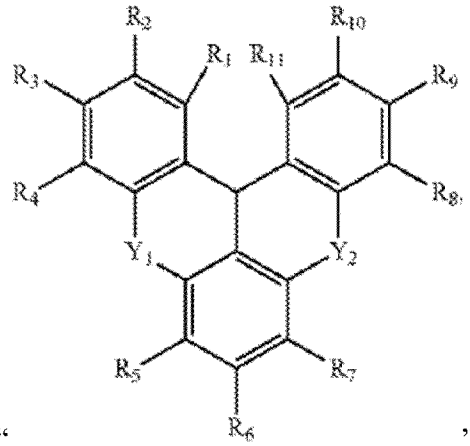 "

and insert -- 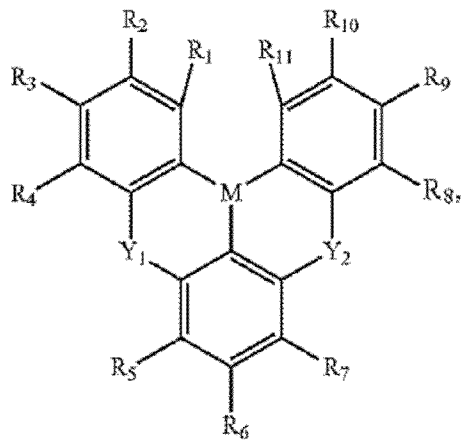 --.

Signed and Sealed this
Eighteenth Day of March, 2025

Coke Morgan Stewart
*Acting Director of the United States Patent and Trademark Office*

CERTIFICATE OF CORRECTION (continued)
U.S. Pat. No. 12,144,252 B2

In Column 97, Lines 6-18, in Claim 7, in Formula 4-1, delete " 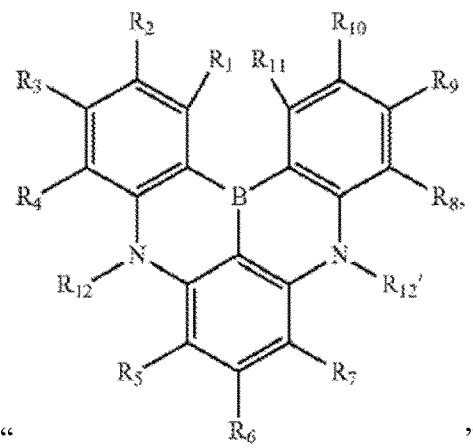 "

and insert -- 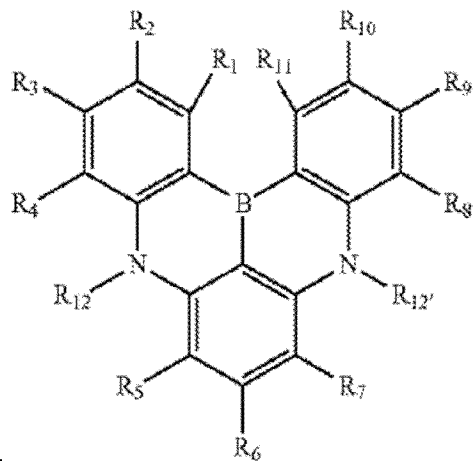 --.

In Column 97, Lines 20-35, in Claim 7, in Formula 4-2, delete

" 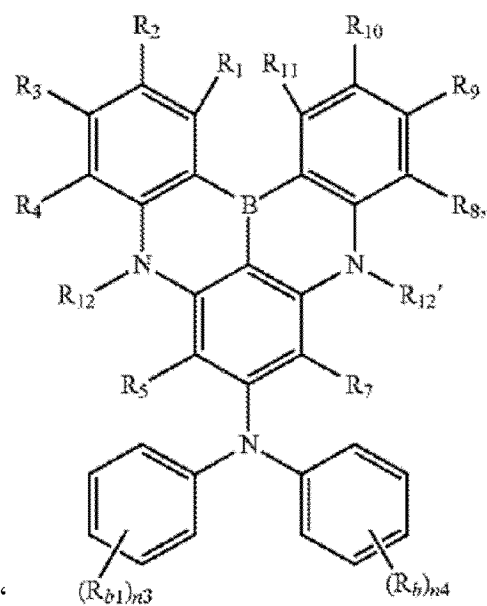 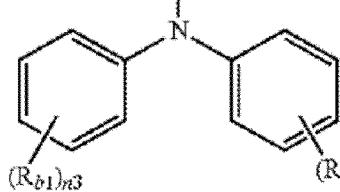 " and insert -- 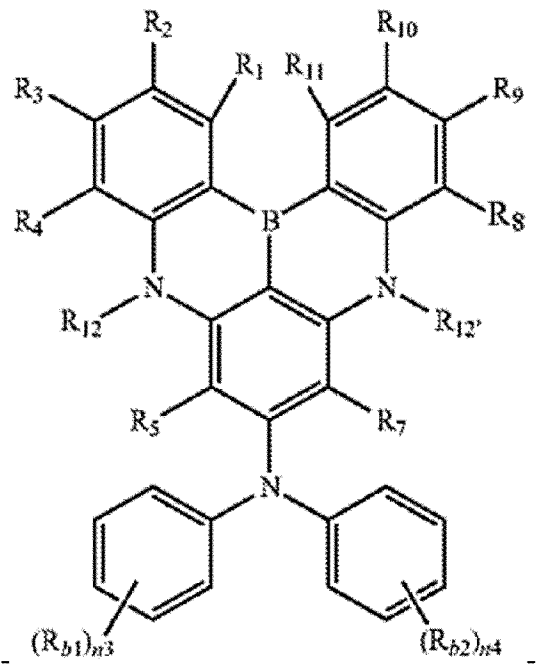  --.

CERTIFICATE OF CORRECTION (continued)
U.S. Pat. No. 12,144,252 B2

Page 3 of 6

In Column 97, Lines 36-52, in Claim 7, in Formula 4-3, delete

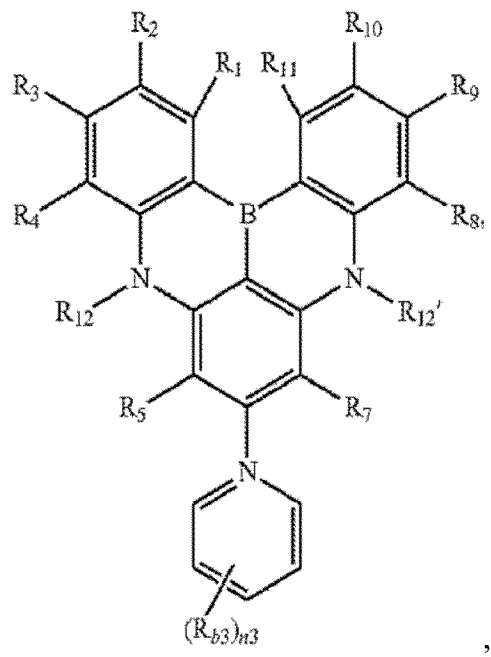 " and insert -- 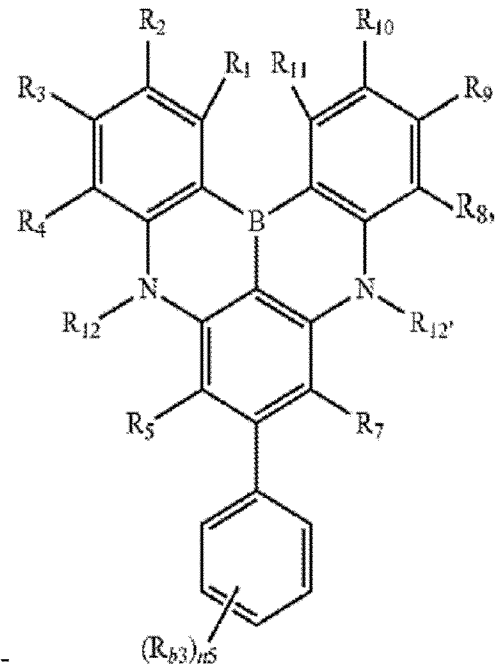 --.

In Column 98, Lines 9-19, in Claim 8, in Formula 5, delete " 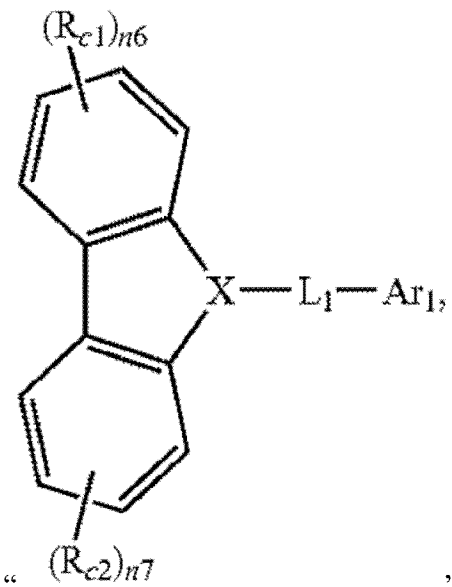 "

and insert -- 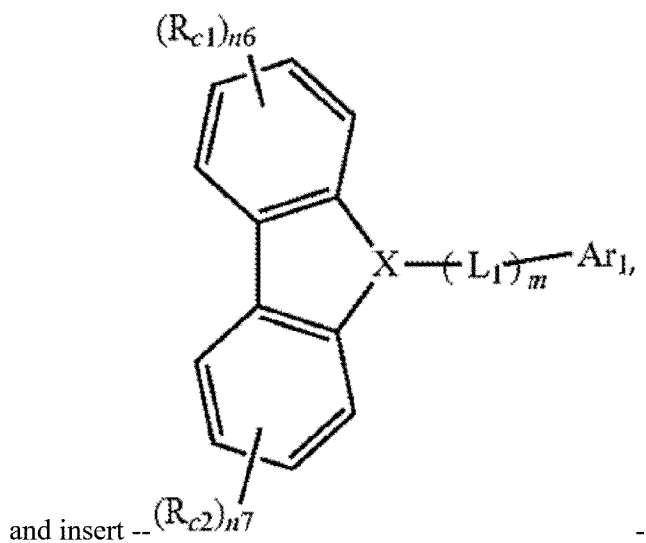 --.
In Column 100, Lines 44-50, in Claim 12, in Formula 1, delete " 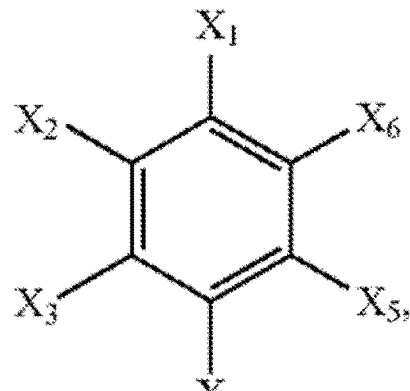 "
and insert -- 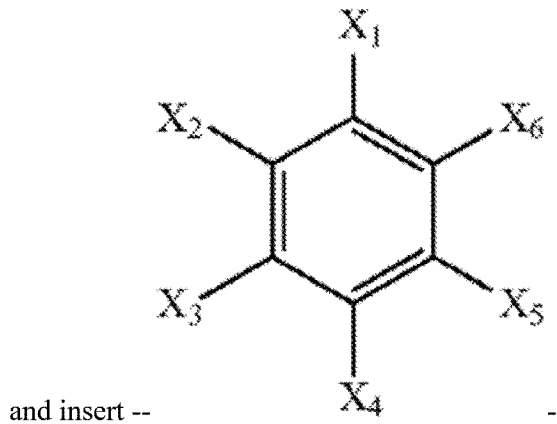 --.
In Column 101, Line 48, in Claim 13, delete "Formula 1" and insert -- Equation 1 --.
In Column 101, Line 61, in Claim 14, delete "Formula 2" and insert -- Equation 2 --.

CERTIFICATE OF CORRECTION (continued)

In Column 107, Lines 4-19, in Claim 18, in Compound DA-06, delete "

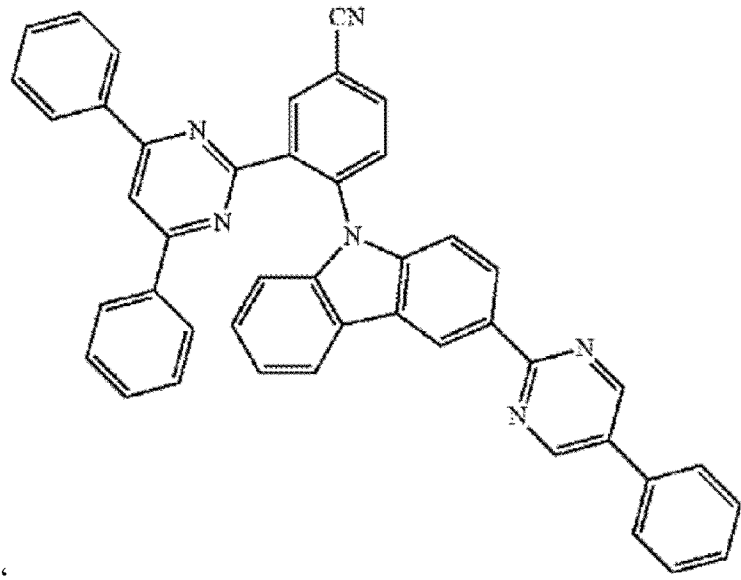

" and insert

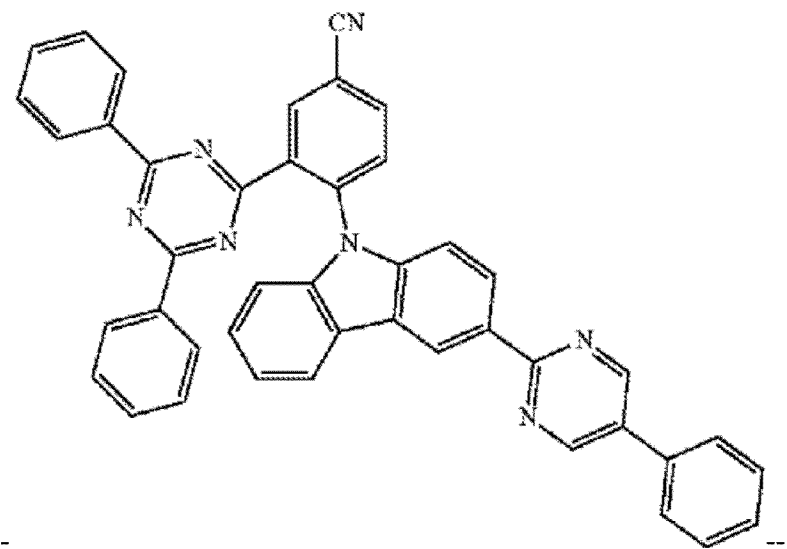

--.

CERTIFICATE OF CORRECTION (continued)
U.S. Pat. No. 12,144,252 B2

In Column 110, Lines 35-46, in Claim 20, in Compound ET03, delete

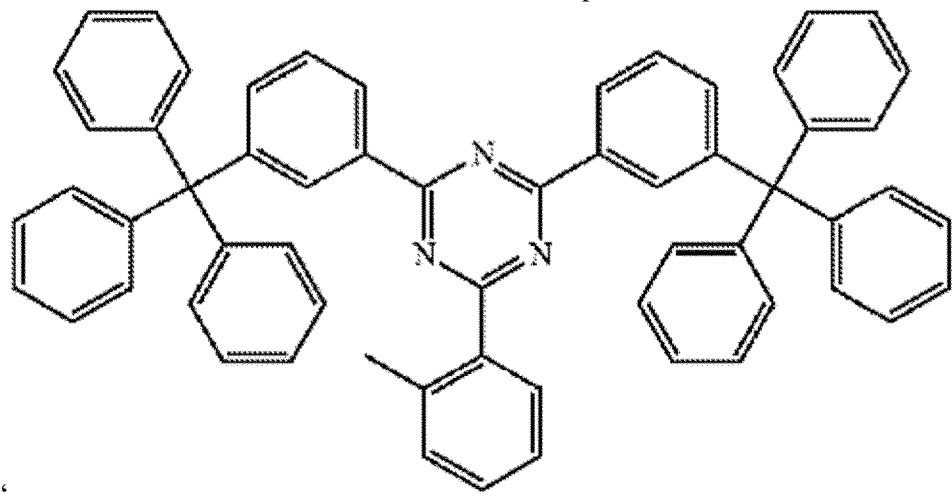

" and insert

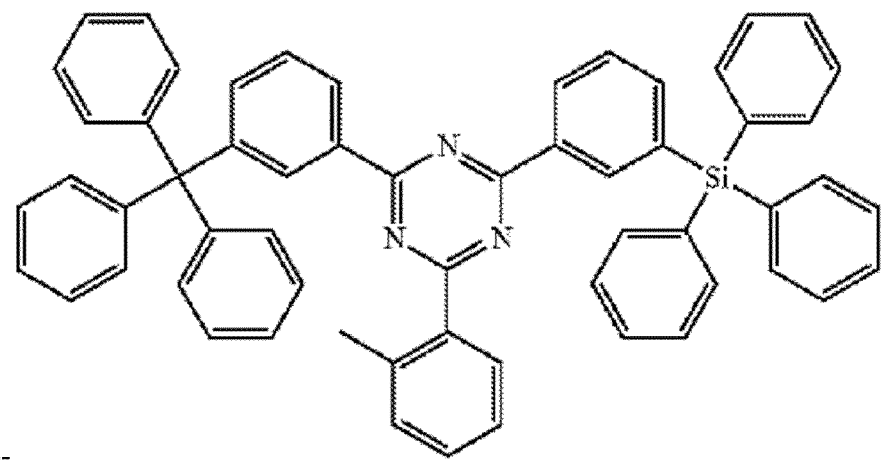

--.